US008074010B2

(12) United States Patent
Hutson

(10) Patent No.: US 8,074,010 B2
(45) Date of Patent: Dec. 6, 2011

(54) INTELLIGENT MEMORY BANKS FOR STORING VECTORS

(75) Inventor: Maurice L. Hutson, Byron, MN (US)

(73) Assignee: Efficient Memory Technology, Rochester, MN (US)

( * ) Notice: Subject to any disclaimer, the term of this patent is extended or adjusted under 35 U.S.C. 154(b) by 0 days.

(21) Appl. No.: 12/831,400

(22) Filed: Jul. 7, 2010

(65) Prior Publication Data

US 2010/0312945 A1 Dec. 9, 2010

Related U.S. Application Data

(62) Division of application No. 11/719,926, filed as application No. PCT/US2005/042107 on Nov. 21, 2005, now Pat. No. 7,779,198.

(60) Provisional application No. 60/630,551, filed on Nov. 23, 2004.

(51) Int. Cl.
*G06F 12/00* (2006.01)

(52) U.S. Cl. .............................. 711/5; 711/217; 711/127

(58) Field of Classification Search ........................ None
See application file for complete search history.

(56) References Cited

U.S. PATENT DOCUMENTS

| 5,293,607 | A | 3/1994 | Brockmann et al. ............... 711/5 |
| 5,379,393 | A * | 1/1995 | Yang ................... 711/3 |
| 5,452,470 | A | 9/1995 | Kantner, Jr. et al. ..... 395/200.08 |
| 5,596,686 | A | 1/1997 | Duluk ........................... 395/122 |
| 5,634,034 | A | 5/1997 | Foster .......................... 395/474 |
| 5,790,110 | A | 8/1998 | Baker et al. .................... 345/202 |
| 5,995,438 | A | 11/1999 | Jeng ......................... 365/230.03 |
| 6,131,146 | A | 10/2000 | Aono ........................... 711/157 |
| 6,252,611 | B1 | 6/2001 | Kondo ......................... 345/516 |
| 6,292,194 | B1 | 9/2001 | Powell, III .................... 345/430 |
| 6,381,668 | B1 * | 4/2002 | Lunteren .......................... 711/5 |
| 6,430,672 | B1 | 8/2002 | Dhong et al. ................. 711/220 |
| 6,480,943 | B1 | 11/2002 | Douglas et al. ............... 711/157 |
| 6,665,768 | B1 | 12/2003 | Redford ........................... 711/5 |
| 6,732,253 | B1 | 5/2004 | Redford ......................... 712/22 |
| 6,807,602 | B1 | 10/2004 | Hornung et al. .................. 711/5 |
| 6,807,603 | B2 | 10/2004 | Gupta et al. ...................... 711/5 |
| 6,874,070 | B2 | 3/2005 | Gupta et al. .................. 711/157 |
| 6,895,488 | B2 | 5/2005 | Feung et al. .................. 711/202 |
| 6,925,589 | B1 | 8/2005 | Ben-Ezri ....................... 714/724 |
| 6,931,518 | B1 | 8/2005 | Redford ........................ 712/237 |
| 7,266,132 | B1 | 9/2007 | Liu et al. ....................... 370/538 |
| 7,266,651 | B1 | 9/2007 | Cypher ......................... 711/157 |
| 7,318,114 | B1 | 1/2008 | Cypher ............................ 711/3 |
| 7,337,275 | B2 | 2/2008 | Wolrich et al. ............... 711/132 |

(Continued)

OTHER PUBLICATIONS

B.R. Rau, "Pseudo-Randomly Interleaved Memory" *Proceedings of the Association for Computing Machinery*, pp. 74-83, Sep. 1991.

(Continued)

*Primary Examiner* — Than Nguyen
(74) *Attorney, Agent, or Firm* — Westman, Champlin & Kelly, P.A.

(57) ABSTRACT

An intelligent memory bank for use with interleaved memories storing plural vectors comprises setup apparatus (96) receives an initial address ($B+C+V+N_{MSK}$) and spacing data (D) for each vector. Addressing logic (90) associates a memory cell select (C) to each initial and subsequent address of each of the plurality of vectors. Cell select apparatus (98) accesses a memory cell (in 92) using a memory cell select (C) associated to a respective one of the initial and successive addresses of each vector.

21 Claims, 15 Drawing Sheets

U.S. PATENT DOCUMENTS

| | | | |
|---|---|---|---|
| 7,418,571 B2 | 8/2008 | Wolrich et al. | 711/202 |
| 7,471,589 B2 | 12/2008 | Kim et al. | 365/230.06 |
| 7,487,505 B2 | 2/2009 | Rosenbluth et al. | 718/104 |
| 7,515,453 B2 | 4/2009 | Rajan | 365/63 |
| 7,515,588 B2 | 4/2009 | Naik et al. | 370/392 |
| 7,610,451 B2 | 10/2009 | Wolrich et al. | 711/150 |
| 7,610,457 B2 | 10/2009 | Lee | 711/157 |
| 7,634,621 B1 | 12/2009 | Coon et al. | 711/149 |
| 7,647,470 B2 | 1/2010 | Sasaki et al. | 711/203 |
| 2004/0019756 A1 | 1/2004 | Perego et al. | 711/170 |
| 2004/0093457 A1 | 5/2004 | Heap | 711/5 |
| 2005/0185437 A1* | 8/2005 | Wolrich et al. | 365/49 |
| 2009/0043943 A1 | 2/2009 | Hutson | |
| 2010/0312945 A1 | 12/2010 | Hutson | |

OTHER PUBLICATIONS

Ranade Interleave, date unknown.

Song Chen et al, "Synthesis of Custom Interleaved Memory Systems" *IEEE Transactions on Very Large Scale Integrated (VLSI) Systems*, pp. 74-83, vol. 8, No. 1, Feb. 2000.

"Dynamic Random Access Memory" *Wikipedia, the free encyclopedia*, Fast Page Mode DRAM and Extended Data Out DRAM sections, http://en.wikipedia.org/wiki/Page_mode_memory#Extended_Data_Out_. 28EDO.29_DRAM, Oct. 3, 2009.

Z. Zhang et al, "Breaking Address Mapping Symmetry at Multi-levels of Memory Hierarchy to Reduce DRAM Row-buffer Conflicts" *Journal of Instruction-level Parallelism*, vol. 3, pp. 1-34, 2002.

* cited by examiner

FIG. 5

Input (lowest A address bits) and Output (relative bank select*) Values of ROM 40
* Some J-bit value where ceil($\log_2(Q-1)$) <= J <= B $2^A$ input values and two possible sets of Q output values for two complimentary parts of abbreviated interleaves:

| | | | Q output values for input values < F: | | | |
|---|---|---|---|---|---|---|
| | | | mod(K+($2^B$-S)+1,$2^B$) | ... | mod(K+($2^B$-S)+(Q-2),$2^B$) | mod(K+($2^B$-S)+(Q-1),$2^B$) |
| | mod(K+($2^B$-S),$2^B$) | | Q output values for input values >= F: | | | |
| | K | mod(K+1,$2^B$) | mod(K+(Q-2),$2^B$) | | mod(K+(Q-1),$2^B$) | |
| | | | Q position-numbers within loops: | | | |
| | | 1st | 2nd | ... | (Q-1)th | Qth |
| Loop-Num: | | F | mod(F+1,$2^A$) | ... | mod(F+(Q-2),$2^A$) | mod(F+(Q-1),$2^A$) |
| 1 | | mod(F+Q,$2^A$) | mod(F+Q+1,$2^A$) | ... | mod(F+Q+(Q-2),$2^A$) | mod(F+Q+(Q-1),$2^A$) |
| 2 | | ... | ... | ... | ... | ... |
| ... | | mod(F+(L-1)Q,$2^A$) | mod(F+(L-1)Q+1,$2^A$) | | mod(F+(L-1)Q+(Q-2),$2^A$) | mod(F+(L-1)Q+(Q-1),$2^A$) |
| L | | mod(F+L·Q,$2^A$) | if(R<2,,mod(F+L·Q+1,$2^A$)) | | if(R<(Q-1),,mod(F+L·Q+(Q-2),$2^A$)) | |
| L+1 | | | | | | |

FIG. 8

INTELLIGENT MEMORY BANKS FOR STORING VECTORS

CROSS-REFERENCE TO RELATED APPLICATION

This Application is a Division of application Ser. No. 11/719,920 filed May 22, 2007, now U.S. Pat. No. 7,779,198 granted Aug. 17 2010, which is a Section 371 National Stage Application of International Application No. PCT/US/2005/042107 filed Nov. 21, 2005 and published in English as WO/2006/057949 on Jan. 6, 2006, which in turn is based on and claims benefit of U.S. Provisional Application No. 60/630,551 filed Nov. 23, 2004, the content of each of which is hereby incorporated by reference.

FIELD OF THE INVENTION

This invention relates to addressing memories, and particularly to parallel access to interleaved data in banked paged and bit-addressed memories, to intelligent memory banks and to interleaves for memories.

BACKGROUND OF THE INVENTION

Memories interleaved for parallel access are arranged in independently accessible banks. Address distribution techniques for parallel access to data at some number of addresses require that the number of banks in a paged memory be equal to some multiple, M, of H to some power, $M \cdot H^B$ where $M > 0$, $B > 1$ and H is the number of logic states (H=2 in binary). For each of M wings, the number of banks commonly interleaved for some number of pages, and thus equally used by each page, is equal to $2^B$. Typically, an interleaved memory contains enough banks for one or more complete interleaves.

If each memory bank contains $2^C$ data cells, as is required for physical memory to be of contiguous data addresses, each interleave contains $2^{B+C}$ data cells, where C>>B. Therefore, the number of data addresses to address each data cell within each wing is $2^{B+C}$.

Each data address contains different bit ranges of select values according to different types and/or uses of memory parts selected. Each wing is selected using a wing select value from the series $0, 1, \ldots, M-1$. Each bank of a selected wing is selected using a bank select value from the series $0, 1, \ldots, 2^B-1$. Each cell of a selected bank is selected using a cell select value from the series $0, 1, \ldots, 2^C-1$.

A classic interleave scheme, such as presently used in most interleaved memory systems, distributes all $2^{B+C}$ addresses among $2^B$ banks at the rate of one address per bank, repeating a simple pattern for $2^C$ repeats. Thus, the classic interleave scheme employs a power-of-two number of data banks for each interleave repeat. However, if all non-unitary prime factors of the number of repeated data banks is 2, as in the case of a classic interleave scheme employing $2^B$ banks for each wing, the efficiency of the interleave scheme is significantly less than a scheme interleaving a plurality of data banks where the repeated number of banks has a non-unitary odd prime factor (i.e., an odd number of repeated data banks greater than 2).

One interleave scheme employing an odd number of data banks greater than 2 is the Ranade interleave, which distributes every set of $2^B-1$ addresses of $(2^B-1)2^C$ total addresses among $2^B-1$ banks at the rate of one address per bank for each of $2^C$ repeats of the pattern. The Ranade scheme employs an odd number of data banks ($2^B-1$) for each interleave repeat. A Ranade interleave scheme employing seven repeated data banks has a efficiency of 87.8%, meaning that 87.8% of the banks, on the average, hold the data of a large range of fixed stride values. By comparison, a classic interleave scheme employing eight repeated data banks has an efficiency of 67.2%.

One problem with the Ranade scheme is that it can only be applied to unpaged memories having either a single interleave for a single wing of banks or a discontinuous physical address space. Thus, one complete Ranade interleave of a contiguous range of data addresses requires use of all the banks of an entire memory. Moreover, the Ranade scheme is limited to memories having $2^B-1$ banks and cannot be used in memories having $2^B$ banks per wing, as in paged and bit-addressed memories.

Other attempts have been made to increase the efficiency of data distribution while preserving paging. One such approach is a pseudo-random interleave scheme proposed by B. R. Rau in "Pseudo-Randomly Interleaved Memory," Proceedings of the Association for Computer Machinery, September 1991. The Rau interleave employs a tree composed of Exclusive-OR gates (XORs) to distribute addresses in a pseudo-random fashion. Yet Rau's use of XORs introduces latency due to the serial computation of bank selects and virtual-to-physical address association. Pseudo-random interleaves, such as Rau's, has an efficiency of about 66% for distributing data of a fixed stride value among eight banks.

Rau also describes a "prime-degree" interleave scheme that is used with an other than power of two number of memory banks (specifically a non-unitary odd prime number of banks). But the use of an odd number of memory banks in the prime-degree interleave scheme described by Rau is unsuitable for paged memories because paged and bit-addressed memories require a power-of-two number of memory banks per wing.

When dealing with parallel high-rate-streaming of multiple vectors of memory data, prior memory schemes using a single serial (e.g. one address of one vector at a time) data-address stream required that all elemental data of each vector be of consecutive memory addresses and all streams of all vectors (e.g. one stream per vector) flow in the same direction (e.g. addressing smaller then larger addresses of data of each vector) and at the same basic data rate (e.g. number of data bits per unit of time). For a single such address stream to service multiple such data streams for such streaming of their data uninterrupted, a single address value of a single data stream addressed a single block of data with enough consecutive elemental data to satisfy its streaming at the full rate for a number of consecutive address cycles not needed by it. Like sized data blocks (e.g. total bits of data per block) for other vectors were addressed serially using only the one address stream. Thus, for all the data of each data block of each stream and thus each vector was necessarily consecutive.

Where the memory was banked and interleaved, each bank (or each so dedicated set of banks) was capable of accessing a streaming sized block of data when accessed by a single address value of all serial from the address stream. Also, a single bank was not capable of being accessed more often than the time to serially address a number of other such banks. Finally, there were enough banks interleaved to allow each bank to be sequentially addressed for accessing data of each flowing stream. Thus and as for each bank, every stream accesses once before the same stream accesses again, all accessing in an order determined per case but uniquely maintained for at least most of the duration of each case. Thus and finally, the one dominate order per case being necessarily maintained did not allow two directions of addressing for the same case.

To allow the time separation between each stream's accessing of the same bank for the worst case, large data buffers were required by each data stream because as measured in time, one data stream must be allowed to stream ahead of all others and all the variously leading read data streams and trailing write data streams must be buffered until the last data stream began streaming data to memory. Buffers are costly both in computer resources and delay respective of size. Also, it was necessary that all data streams' addressing of memory be in the same direction and at the same full data rate so those streaming at full rate would not experience continual bank usage conflicts resulting in interruptions of data flow. There is a need, therefore, for a vector streaming technique wherein vector data are pre-read and post-written from and to the memory so that vector data sees minimal delay using minimal buffers while moving the data at the rates, directions and fixed spacings of demand of the processor unit.

SUMMARY OF THE INVENTION

A first embodiment of the present invention is directed to a technique for addressing a plurality of interleaved memory banks using a complex (as opposed to simple) interleaving in the form of abbreviated interleaves. In one form of this embodiment, address apparatus addresses a plurality of abbreviated interleaves each addresses a different set of more than one and less than all of the memory banks. The interleaves are so disposed and arranged as to collectively address all of the memory banks.

In one form of the address apparatus, each interleave addresses a different set of Q memory banks, where Q is a number greater than one and smaller than the number of memory banks.

In another form of the address apparatus, the abbreviated interleaves are offset from each other so that they collectively use all of the plurality of memory banks equally.

The principles of the invention can be applied to address logic having H number of states, where in binary H=2. In some forms of the apparatus, Q has no non-unitary factor in common with H. In some forms of the apparatus Q is a prime number greater than H. In some preferred forms of the apparatus, a bank select device is responsive to an input to interleave a sequence of bank selects. In some forms the bank select device defines a table of rows and columns for each interleave, the table comprising L aligned rows containing Q addressable locations, where L>1. A memory bank select in each column is accessed upon addressing a location in one of the rows of the column. In some forms, a remainder row contains R addressable locations, where 0<R<Q. The remainder row is aligned with the L rows so that a first location of the remainder row is in the same column with a first location in the L rows.

In some forms of the apparatus, each successive abbreviated interleave is offset from the prior interleave such that the first location of rows of the successive interleave is offset by S, where either S=R or S=R−Q.

In some forms, the memory contains M wings, each containing $H^B$ or $2^B$ memory banks, and a wing select device is responsive to the address for selecting a wing of the memory. Optionally, a mask masks a portion of the address to the wing select device to select a single multiple-wing data element from a plurality of wings.

A second embodiment of the invention is a data structure for addressing a plurality of memory banks. The data structure is used in addressing apparatus, such as according to the first embodiment, to address a plurality of interleaved memory banks to form abbreviated interleaves in an offset relation so that the interleaves collectively use all of the plurality of memory banks.

A third embodiment of the invention is a process for selectively addressing a plurality of interleaved memory banks using a plurality of offset abbreviated interleaves addressing all of the plurality of memory banks.

A fourth embodiment of the invention is directed to an intelligent memory bank for use with interleaved vectors. The intelligent memory bank is useful with the novel interleave technique of the first, second and third embodiments, or independently of the novel interleave technique, such as with a classic interleave. In this fourth embodiment setup apparatus receives the initial address and spacing data for each of a plurality of vectors. Cell select apparatus associates a memory cell select to each initial and subsequent address of each of the vectors. Addressing logic responsive to the setup apparatus and cell select apparatus accesses a memory cell using a memory cell select from the cell select apparatus associated to a respective one of the initial and successive addresses of each vector.

In one form of the intelligent memory bank, the addressing logic comprises a latch for storing a cell select associated to the initial address. A calculator calculates a next valid cell select for a respective successive address of the respective vector based on the cell select in the first latch and the spacing. The cell select apparatus comprises a latch for storing a valid cell select for each vector; the cell select being operable to transmit the stored valid cell select to the address logic and to invalidate its currently stored cell select. An enable is responsive to the memory bank's position in the interleave patter and the presence of a next valid cell select in the cell select's latch addressing logic to enable the cell select's latch to transmit it's currently-stored cell select to the addressing logic.

In another form of the intelligent memory bank, port setup apparatus receives the initial address and spacing data for each of a plurality of vectors, processing logic associates a bank select to each initial and subsequent address of each of the plurality of vectors, and interface apparatus accesses a memory bank using a bank select associated to a respective one of the initial and successive addresses of each vector.

BRIEF DESCRIPTION OF THE DRAWINGS

FIG. 5 is a diagram useful for explaining a more general operation of the apparatus shown in FIGS. 1 and 2.

FIG. 8 is a diagram useful for explaining the operation of the apparatus shown in FIG. 7.

DETAILED DESCRIPTION OF THE PREFERRED EMBODIMENTS

As will be more fully understood herein, the invention is applicable to memories operating with logic in any number of states H, where H≧2. H=2 in binary, H=3 in ternary, etc. As used herein, "digit-order" refers to H to a power (e.g., $H^B$) and "bit-order" is digit-order where H=2 (binary), e.g., $2^B$. Also as used herein, an "abbreviated interleave" is an interleave, that according to a single predetermined alignment to addressed banks, addresses data of more than one and less than all of a plurality of memory banks. A "rotation" of abbreviated interleaves is a single cycle of a predetermined pattern of a plurality of abbreviated interleaves. A "pagelet" either is a bit-aligned rotation of bit-aligned abbreviated interleaves or is a bit-aligned rotation of complimentary parts of two consecutive misaligned abbreviated interleaves, all according to the predetermined pattern. A "complete interleave" is one or more pagelets with enough disposed to address all data within the plurality of memory banks in a desired pattern.

Figure 1:
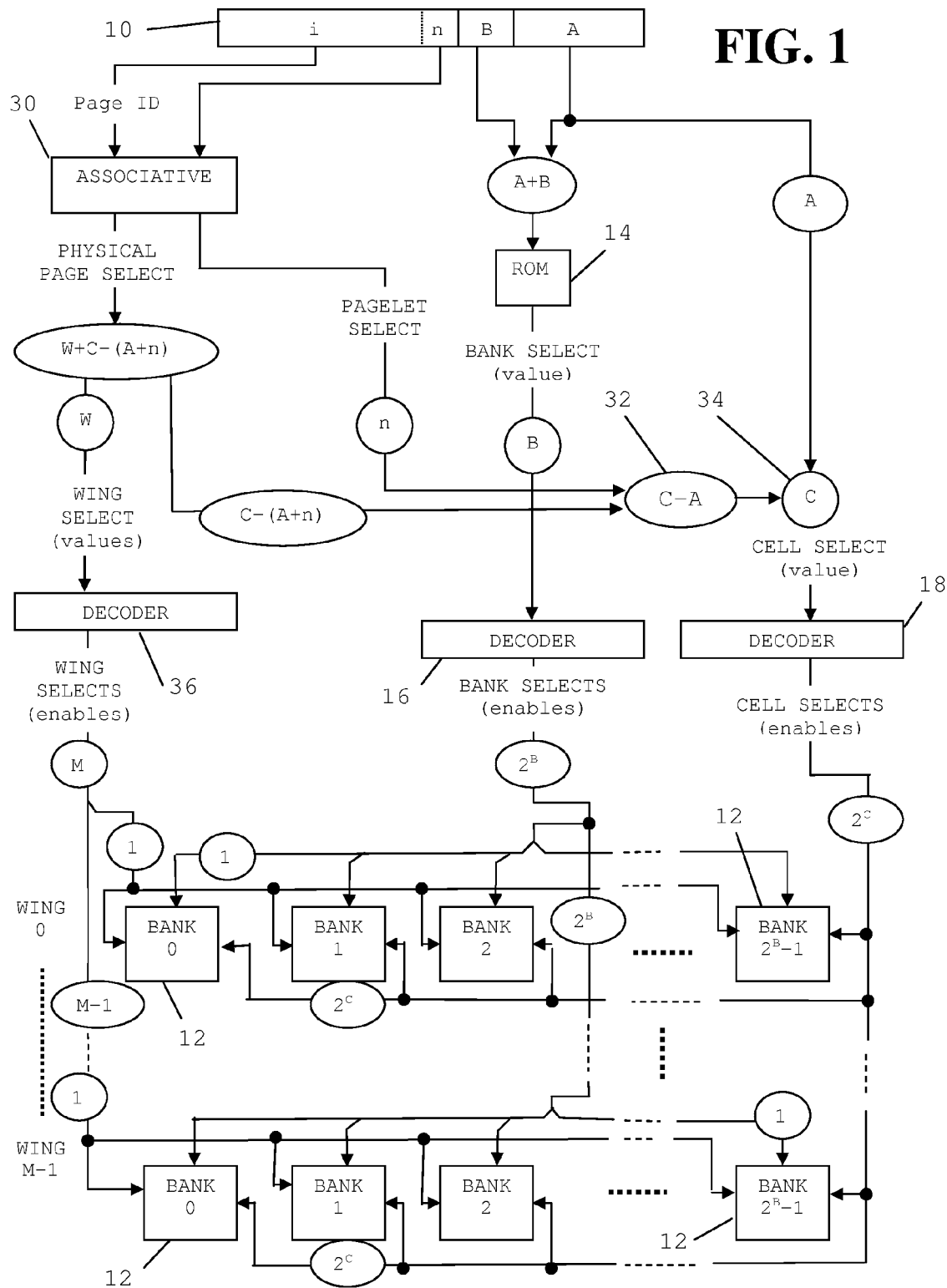
FIG. 1 is a block functional diagram illustrating apparatus for addressing a paged memory according to a first embodiment of the present invention.

FIG. 1 is a block diagram of memory addressing apparatus for addressing interleaved data according to an embodiment of the invention. The embodiment of FIG. 1 will be described in conjunction with a memory having two logic states (i.e., binary, so H=2), a rotation of abbreviated interleaves comprising a complete cycle of abbreviated interleaves to address all memory banks of a single wing an equal number of times, and a complete interleave encompassing all rotations necessary to utilize all data addresses of all banks of a single wing, there being one or more rotations per complete interleave. As explained in greater detail below, a memory having plural wings (e.g., M wings, where Ω>0 and (M/$2^Ω$)>0 and (M/$2^Ω$) is an integer) employs M/$2^Ω$ complete interleaves.

Address 10 holds a virtual address having at least four fields: an A-bit fixed sized field containing a value [A], a B-bit fixed sized field containing a value [B], an n-bit variable sized field containing a value [n], and an i-bit variable sized field containing a value [i]. The n-bit and i-bit variable sized fields together form a (i+n)-bit fixed sized field containing a value [i+n]. For sake of simplicity, all embodiments of the invention assume that rotations and thus pagelets are identical in size and each requires $2^A$ cells of each of all memory banks of a wing, $2^A$ of $2^C$ total cells per bank, C≧A. The sizes of fields A and B correspond to the number of the respective $2^A$ cells in each of the respective $2^B$ banks of each wing of a memory. Since each memory bank contains $2^C$ cells, the number of pagelets in M wings of a memory is M·$2^{C-A}$ (or M·$2^{C-A-Ω}$ where Ω>0). The value [n] is a pagelet select value indicating the pagelet addressed of $2^n$ pagelets in a page. Value [i] is a virtual identification of a page indicating the page addressed of $2^i$ same-sized pages that may be in virtual memory. Fields n and i are oppositely variable in size and collectively fixed; as the number of pagelets per page increases (with larger pages), the possible number of same-sized pages per virtual memory decreases. The sizes of field n and field i and the boundary between fields i and n are appropriately adjusted by associative 30 using mapping information (not shown) for the $2^n$-pagelet size of a certain sized page currently accessed by the current virtual address in address 10.

Bank Selection

The concatenated (A+B)-bit value of fields B and A from address 10, [B+A], is applied to read-only memory (ROM) 14 to select a B-bit wide bank select value. The bank select value is decoded by decoder 16 to provide an enable bit to one of the $2^B$ memory banks 12 in each of the wings 0, . . . , M–1 of memory banks. ROM 14 is described in greater detail in connection with FIGS. 2 and 5.

Associative Selection

Associative 30 receives the virtual page ID value [i] and the pagelet select value [n] from address 10 without an indication of the boundary shown dotted between fields i and n. Associative 30 includes dedicated registers and/or memories (not shown) holding an ordered table containing entries defining the mapping in the memory of virtual pages to physical pages. To uniquely identify and locate a mapping, each entry in the table has a page size indicator, a correctly sized i-bit virtual page ID value, and a correspondingly sized (W+C–A–n)-bit physical page select value. Each successful access of memory addressed from address 10 for a virtual address is of a match found by associative 30 between address 10 value [i] and some table entry's i-bit value, both sized per the found entry's page size. The found entry's (W+C–(A+n))-bit value as sized per the found entry's page size and thus n value, is outputted from associative 30 as a physical page select from all memory. The n-bit field in address 10 is sized per the found entry's page size and the value thereof passed through associative 30 unchanged as a pagelet select.

The size of the page ID field i is of a fixed number of more bits than is the physical page select, W+C–(A+n), for any same sized page from associative memory 30. $N_{max}/N_{min}$ is the maximum/minimum number of bits of a pagelet select value [n] for selecting one of $2^{N_{max}}/2^{N_{min}}$ fixed sized pagelets in the memory's largest/smallest page size. In complementary fashion where i is $I_{min}/I_{max}$ when n is $N_{max}/N_{min}$, $I_{min}/I_{max}$ is the minimum/maximum number of bits of a virtual page select identification value [i] for selecting one of $2^I_{min}/2^I_{max}$ of the memory's largest/smallest page sizes.

Wing Selection

That associated of physical page select, W+C–(A+n), is segmented into a wing select, W, and C–(A+n) of cell select. The wing select value of W bits, [W], is one of the values 0, 1, 2, 3, . . . , M–1. The value of W is fixed by the number of memory wings, M, where $(2^{W-1}+1)≦M≦2^W$. The wing select value [W] is decoded by decoder 36 to select one of M wings of memory banks 12.

Cell Selection

The value [A] of the A bits of field A of address 10 is such that $2^A$ is the number of selectable cells of one pagelet in each of $2^B$ banks in one wing. The cells are bijectively selected, and easily so, because data may be read into and from the cells using the addressing scheme of the present invention as shown in FIG. 1, bits of field A simply concatenate at concatenator 34 and are decoded as selecting one of $2^A$ cells according to each bit-aligned ½$^B$th part of a pagelet. Concatenator 32 concatenates the C–(A+n) bits from associative 30 with the n bits input from address 10 via associative 30 to derive C–A bits, which in turn are concatenated with the A-bits from address 10 to derive a C-bit cell select value [C] input to decoder 18. The number of bits C is such that $2^C$ is the bank size in terms of data cells. Thus, the value [C−A] of the C−A bits is such that $2^{(C−A)}$ is the number of selectable pagelets in each set of $2^B$ banks in each wing as for each complete interleave. The value [n] of the n bits of field n of address 10 through associative 30 to concatenator 32 is such that $2^n$ is the number of selectable pagelets of one page of that size in each of $2^B$ banks in one wing. Thus, the value [C−(A+n)] of the (C−(A+n)) bits is such that $2^{(C−(A+n))}$ is the maximum number of selectable pages of size $2^n$ pagelets which can be in each wing of $2^B$ banks.

The pagelet select value [n] has a number of bits value, n, between a maximum value $N_{max}$ and a minimum value $N_{min}$, where $N_{max} \geq n \geq N_{min} \geq 0$. Smaller minimum values of $N_{min}$ provide progressively better results, with the best results obtained where $N_{min}=0$ such that one smallest page is one period of bank usage, a single pagelet. $N_{max}$ is the maximum value of n for a pagelet select value [n] as value $[N_{max}]$ for selecting one of $2^{N_{max}}$ pagelets in the memory's largest page size.

Selection Summary

Using the wing select enables from decoder 36, the bank select enables from decoder 16 and the cell select enables from decoder 18, one of $2^C$ cells within a selected one of $2^B$ memory banks within a selected one of M wings of the memory is selected. Thus, the W, C and B bit-signals feeding decoders 36, 18, and 16 form a (W+B+C)-bit physical address for [W+B+C] addressing one of the physical memory's $M \cdot 2^{B+C}$ addressable data cells.

Data Structure of ROM 14

Figure 2:
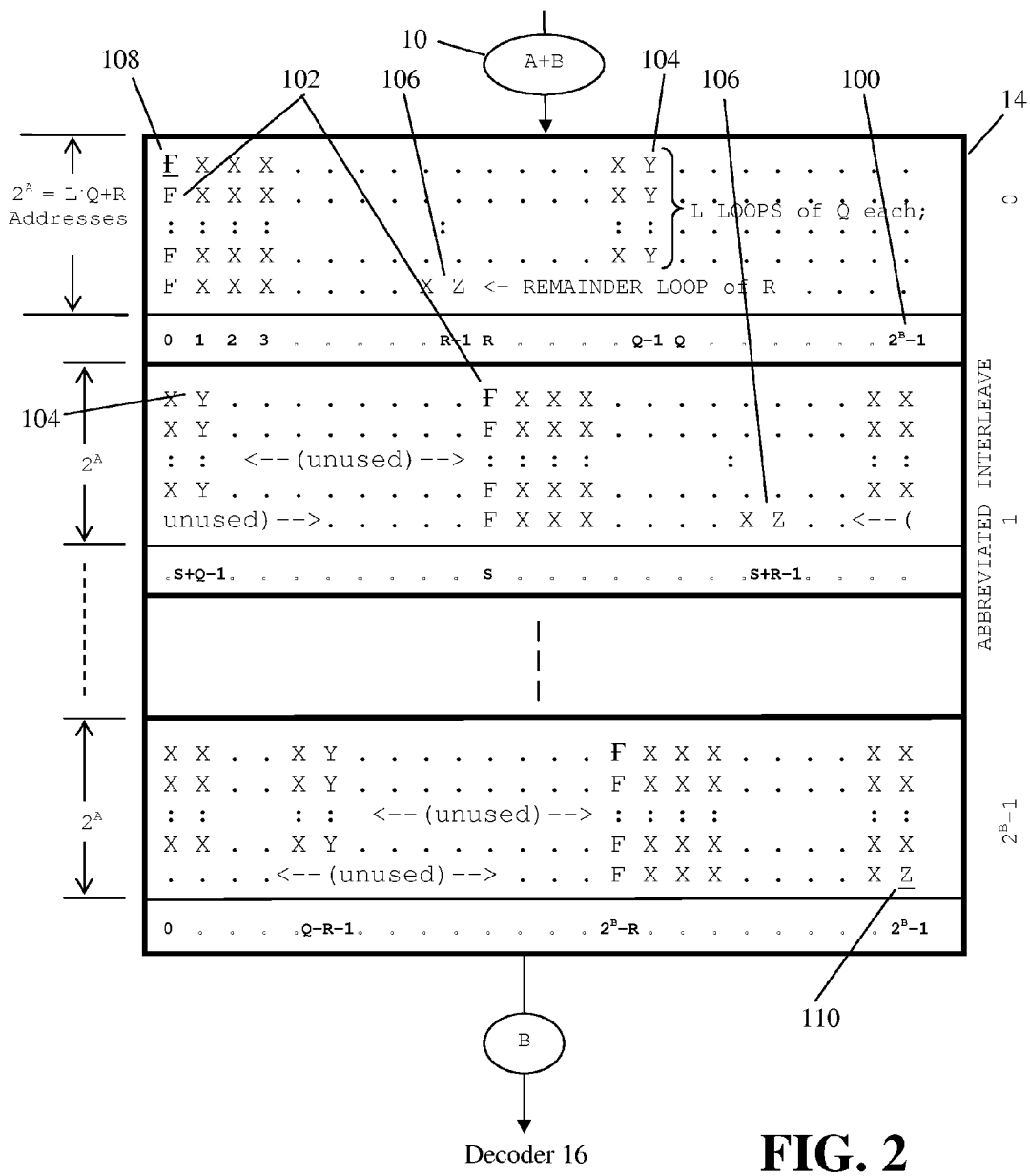
FIG. 2 is a functional diagram showing a specific memory apparatus and data structure for generating a bank select value for the apparatus shown in FIG. 1.

FIG. 2 diagrammatically illustrates the data structure of ROM 14 of FIG. 1. As will be explained, successive abbreviated interleaves of a rotation are offset by a value S number of banks or bank selects. FIG. 2 illustrates the environment where S is only positive. As will be explained, particularly in conjunction with FIG. 5, the offset value S may be either positive or negative.

As shown in FIG. 2, ROM 14 contains that of a table for a rotation of abbreviated interleaves defining sub-tables of rows and columns representing successive abbreviated interleaves 0, 1, . . . , $2^B-1$. The bottom line of each sub-table, that separated by a line, identifies $2^B$ relative bank select values 100, identified as being values 0, 1, 2, . . . , $2^B-2$, $2^B-1$ although some are expressed in other terms without modulo $2^B$ applied. The relative bank select values are arranged identically for all sub-tables so that each sub-table contains $2^B$ columns, each corresponding to a respective one of the $2^B$ relative bank select values. Each abbreviated interleave has L full loops of Q consecutive locations and a last or remainder loop containing R consecutive locations, where 0<R<Q and 2<Q<$2^B$, the first location of each loop being in the same column. A bank select value corresponding to each column and Q being odd, the number of locations of a loop is an odd number specifying the number of contiguous (with wraparound as shown by abbreviated interleaves 1 and $2^B-1$) and selectable memory banks per wing in any one of the L loops. In preferred embodiments, Q is a prime number 3, 5, 7, 11, 13, 17, . . . , a prime number more than H and less than the wing's number of banks.

For purposes of explanation, the first location 102 of each loop of Q and R locations is designated F or F̄, with the first location of the first loop of each abbreviated interleave being F, the last location 104 of each loop of Q locations is designated Y, the last location 106 of a loop of R locations is designated Z and each location between a first and last location of each Q or R locations is either explicitly designated or implied (dots between Xs) to be X. Each letter of the table represents a different value, [B+A], of the lower order A+B bits of a data address from address 10 (FIG. 1). The B-bit relative bank select values 100 are arranged across all $2^B$ columns of all sub-tables, once across in the separated line (lowest) for each sub-table, so that each A+B-bit address (value) from address 10 represented by a letter F/F̄,X,Y,Z in each loop L and R in each sub-table corresponding to a respective bank select value 100. Since the number of address locations in each loop is either Q or R, which is less than the total number ($2^B$) of columns in each sub-table, the addresses in each sub-table correspond to some set of more than H and less than all of the bank selects. Each sub-table represents one abbreviated interleave because $L \cdot Q+R=2^A$. A single bank select value 100 corresponds to all address values in the same column so that matching an address value represented by a letter in the table to concatenated address value [B+A] from address 10 selects a corresponding B-bit relative bank select value 100 from the same column for output to decoder 16.

As shown particularly by comparison of abbreviated interleaves 0 and 1, the first positioned letter shown by F̄ of the first loop of Q in any sub-table is at the next consecutively addressed position following that of letter Z in the remainder loop of the prior abbreviated interleave or higher sub-table (with top to bottom wraparound), shown by Z in interleave 0 followed by F̄ in interleave 1. Thus the first positions F or F̄ of each loop Q and R of an abbreviated interleave are offset by S or R (FIG. 2, S=$R_{odd}$) from the first positions of each loop of the prior abbreviated interleave, as shown by comparing the separated bottom lines of the sub-tables corresponding as to interleaves 0 and 1. If the consecutive letter positions of R and/or Q addresses reach beyond the bounds of the right-most column of bank select value $2^B-1$, each sequence wraps around on the same line as in the same row from the $2^B-1$ to the 0 valued position, as shown in sub-tables of interleaves 1 and $2^B-1$. In any case, it will be appreciated that there will be $2^B-Q$ unused positions in each line with a loop containing Q addressed positions and there will be $2^B-R$ unused positions in each line with a remainder loop. All unused positions are shown as dot ranges labeled unused in FIG. 2.

In FIG. 2, R is odd and thus S is positive, odd and S=R. As will be more fully understood, particularly in connection with FIG. 5, R may be odd or even, and when R is even, S will be negative. Thus, regardless of R's primness to 2 (oddness), S will be odd, either positive or negative. The same results if memory logic operates in H states, where H and Q are such that for $H^B$ banks in a wing, 1<H<Q<$H^B$ and mod(H,mod(Q,H))≠0, then R=mod($H^A$,Q) and S=if(mod(H, mod(R,H)),R, R−Q) for $H^A$ addresses in an abbreviated interleave, as explained herein.

It will be appreciated that the total number of addressable locations in the Q and R sequences on each abbreviated interleave is $L \cdot Q+R$, and that the Q and R sequences of letters represent $2^A$ addresses of the corresponding abbreviated interleave of any rotation so aligned. Thus, $2^A=L \cdot Q+R$. Moreover, Q is an odd number specifying an odd number of contiguous and selectable memory banks in a loop. Thus, each letter F,F̄,X,Y,Z represents an (A+B)-bit address input to ROM 14 where a corresponding B-bit bank select value is stored. The shape of the two-dimensional layout of letters in FIG. 2 reveals bank usage frequency and sameness by address groups and abbreviated interleave groups (which Q banks used).

The bottom loop of each interleave defines a remainder loop that contains R addresses, where 2<R<Q because for binary logic, the number of address of an abbreviated interleave is a bit-order, $2^A$, and Q is odd (prime to the number of states of binary logic). Depending on the values of A and Q, R will be either an odd or an even number, $R=\text{mod}(2^A,Q)$. As will be more fully understood below, it is more preferred that values selected result in R being nearer to 0 or Q. For two R values equally near 0 or Q, the even R value is preferred over the odd, except that R=1 (odd) and R=Q−1 (even) are equally preferred. The value of R and the value of L are the result of selecting the values of Q and A, where $2^A$ is the number of data addresses in an abbreviated interleave. Thus A and Q determine the shape of an abbreviated interleave where $R=\text{mod}(2^A,Q)$ and $L=\text{trunc}(2^A/Q)$. The abbreviated interleave shape is that of (L loops) times (Q addresses per Q-loop)+(one R-loop) times (R addresses per R-loop)=$2^A$ addresses per abbreviated interleave, $L\cdot Q+R=2^A$.

As shown in FIG. 2, the rotation commences with the uppermost letter F (as does abbreviated interleave 0) at the left in the top loop (at reference numeral 108) and sequences right through the letters of a loop and thusly down through the loops of the first interleave, including the remainder loop, ending with Z at reference numeral 106. The next sequential letter in order after Z of abbreviated interleave 0 is F at reference numeral 102 of the top loop of the next abbreviated interleave 1. The sequence continues through the each interleave, with wraparound as necessary, with the location of the letters F of each successive interleave offset by S positions (columns) from those before. Thus, in all embodiments as in FIG. 2 for ROM 14 of FIG. 1, S is an odd number.

For the cases shown by FIG. 2, offset S is only as positive. S is always made odd whether positive (as in FIG. 2) or negative so S is prime to two, the binary H value, and thus, S shares no non unitary factor with the number of banks of a wing, $2^B$, a bit-order number having no odd factor. As will be more fully understood herein, where the number of logic states (H) of the memory is other than binary (H>2), S may be odd or even (prime to two) when either positive or negative, but $H^B$ and S will not share a common non unitary factor, that is, S and H will be prime to one another. As will be more fully understood in connection with FIG. 5, $S=\text{if}(\text{mod}(R,2)=1,R,R-Q)$, and therefore may be negative, R−Q. As in FIG. 2 where S is positive as well as where S is negative (not shown by FIG. 2), the last letter Z (reference numeral 110) of the last (remainder) loop of the last abbreviated interleave $2^B-1$ (the $2^B$th) is the last letter or address of the rotation thereof, and as shown in the example of FIG. 2 where S is positive, the last address of a rotation of abbreviated interleaves is always in the last column or relative bank select position, but as not shown where S is negative, the last address is always in the (Q+1)th column or that of relative bank select value Q. As for S positive, the position of F of a next rotation (first address of a rotation's first abbreviated interleave as is next address after last address of previous rotation) is offset right by +S (R) from the position of F the last abbreviated interleave of the rotation thus prior, and consequently that first address of next rotation is at the first position as it was for the prior rotation. Conversely as for S negative, the position of F of a rotation is also always the same from rotation to rotation. The Z of last abbreviated interleave of a rotation is at the (Q+1)th column (that of relative bank select Q), and F of last is R to the left at the (Q+1−R)th position, making F at the 1$^{st}$ position |R−Q| to the left as it should be for negative S equaling R−Q. Consequently, all abbreviated interleaves are offset equally from one to the next, and all rotations are identical as concerns relative bank usage order between wings and as concerns actual bank usage order for those within each wing.

With the first letter F of the first abbreviated interleave assigned an actual address value, where $0\leq F<2^A$, then all the $2^{A+B}-1$ other letters take on actual values. Consequently, the row of bank select values immediately below lettered address values, represented in the separated bottom row below each abbreviated interleave, can be uniformly shifted end-around by any amount. This feature permits design flexibility as the first letter F can be assigned to any of the $2^B$ choices for actual bank select value as well as itself being any of $2^A$ choices of input address. This flexibility of content of ROM 14 permits implementation of ROM 14 as a SRAM to have different choices of content for different uses or users for purposes of security.

The last letter Y of each such loop of any abbreviated interleave is at a position where a relative bank select value is calculated (ignoring wraparound) as X·S+Q−1 where X is the abbreviated interleave, $0\leq X\leq 2^B-1$. As will be explained below, S is an odd signed shunt value that causes the loops, and hence the bank selects from ROM 14, to be offset from one abbreviated interleave to the next. The value of S is evaluated as $S=\text{if}(\text{mod}(R,2)=1,R,R-Q)$, where R is a remainder value evaluated as $R=\text{mod}(2^A,Q)$. Thus and because R is shown only odd in FIG. 2, as in abbreviated interleave 1, its L+1 loops commence at the position where the relative bank select value is both R and S as shown by abbreviated interleave 1.

The data content of ROM 14 produces one period of the smallest repeated pattern of bank usage per wing aligned in the form of a rotation of abbreviated interleaves. The value of S calculates the offset which progressively positions the common same relative pattern of successive abbreviated interleaves 0, 1, . . . , $2^B-1$. For ease of understanding, some embodiments set F in the first interleave to 0 so an aligned rotation of abbreviated interleaves aligns to the boundaries of ROM 14, first address of ROM 14 addresses bank select value first of rotation of abbreviated interleaves and so on to the last address of both, and thus, a pagelet is of the bank selects of a single rotation of abbreviated interleaves. For additional simplicity such embodiments also have ROM 14 output bank select 0 for address F as shown by FIG. 2.

Figure 3:
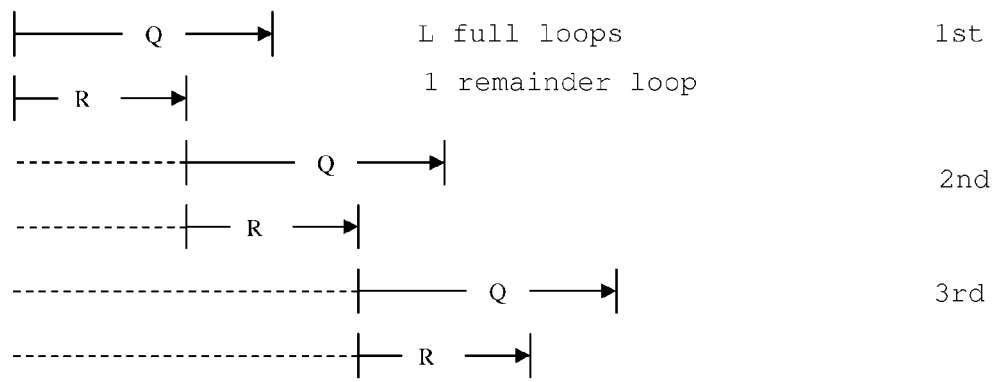
FIGS. 3 and 4 are diagrams useful in explaining a generalized version of the diagram of FIG. 2.
Figure 4:
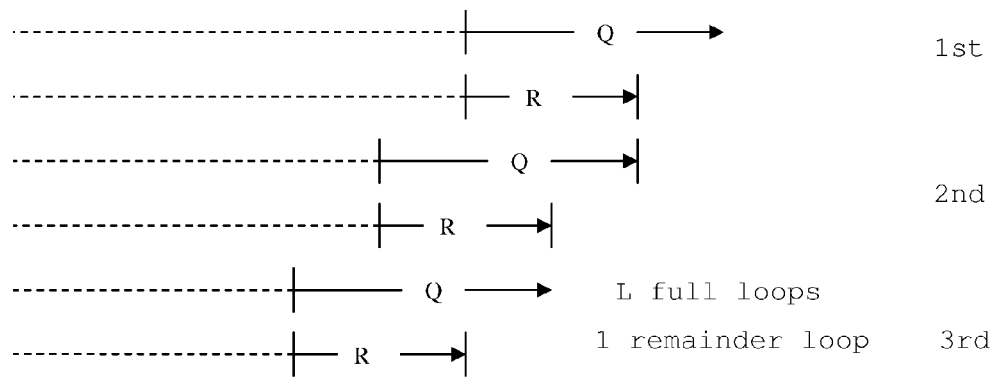

FIG. 3 illustrates a pattern of three consecutive abbreviated interleaves within a rotation, where, because R is odd, S=R (an odd positive value), as in FIG. 2. FIG. 4 illustrates a pattern of three consecutive abbreviated interleaves within a rotation, where, because R is even, S=R−Q (an odd negative value). In either case, adjusting A and/or Q so that $R=\text{mod}(2^A,Q)=1$ (odd nearest to 0) or Q−1 (even nearest to Q) forms the tightest and generally best arrangements using the least banks per some number of consecutive abbreviated interleaves. As will be more fully described below, an odd R nearer 0 or even R nearer Q increases a measure, G, of range of the uninterrupted interleave effect of loops of Q banks where no banks appears in more than one loop position (parameter G to be described below).

Figure 5:
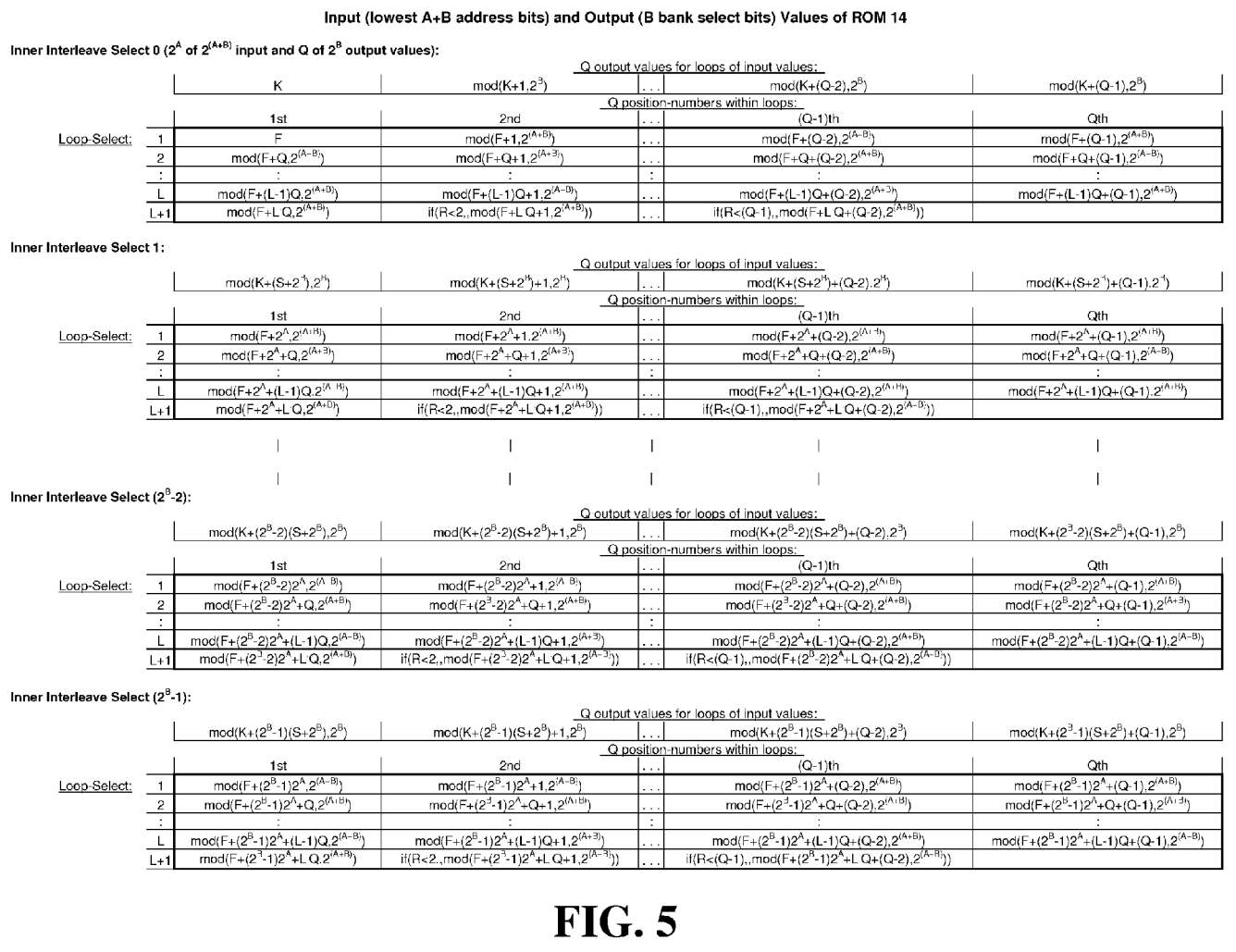

FIG. 5 is a table of sub-tables as in FIG. 2 defining the contents of ROM 14 for all shapes and arrangements of abbreviated interleaves within a single rotation. ROM 14 is physically designed to have at least $2^{A+B}$ B-bit wide, addressable data cells to hold corresponding bank select elements. The expressions of FIG. 5 are evaluated by fixing the values of A, B, Q, F and K so that $2\leq B<A$, $3\leq Q_{odd}<2^B$, $\text{mod}(Q,2)=1$, $0\leq F<2^A$ and $0\leq K<2^B$. From the chosen values of A and Q, the derived values affecting shape and arrangement of L, R and S are calculated as $L=\text{trunc}(2^A/Q)$, $R=\text{mod}(2^A,Q)$ and $S=\text{if}(1=\text{mod}(R,2),R,R-Q)$.

The table of FIG. 5 applies to any four or more bit-order (e.g., $H^2$ or more digit-order (H>1)) number of abbreviated interleaves within a rotation of such. It applies to all arrangements (determined by the value of S) and shapes (based on deriving L, Q and R values from valid A and Q values) of the abbreviated interleaves within one rotation. The interleave pattern illustrated in FIG. 5 is applicable to all alignments (valid F values) of rotation form (shape and arrangement of abbreviated interleaves) to the cell select bit-aligned pagelet, and thus alignment within ROM 14. The pattern is applicable to all alignments of bank selects (valid K) within ROM 14 and thus to the rotation's form and to the banks of wings to which pagelet has cell select alignment. For example, consider an address location and corresponding bank select in FIG. 5. As will be more fully described in connection with FIGS. 9 and 10, $2^\Omega$ commonly selected banks are selected (one from each of some $2^\Omega$ commonly selected wings). Where $\Omega>0$, the first $2^\Omega$ commonly selected cells of first $2^\Omega$ elemental data (all that of first largest interleaved data) of each pagelet are selected, starting at each of common cell selects, e.g., $0\cdot 2^A$, $1\cdot 2^A$, $2\cdot 2^A$, $3\cdot 2^A, \ldots, (2^{C-A}-1)\cdot 2^A$.

The sub-tables of FIG. 5 illustrate the pattern of each abbreviated interleave $0, 1, \ldots, 2^B-2, 2^B-1$. Each abbreviated interleave has dimensions of L+1 loops or rows by Q bank select positions or columns and contains an expression in all $Q\cdot(L+1)$ cells of each sub-table except the last cell of the last loop which is always empty and thus contains no expression and always evaluates no value as blank. All non-empty cells in each abbreviated interleave's last loop, except the first cell, have expressions that conditionally evaluate as either values or blanks. The first cell of the last loop and all the cells of the other loops of a sub-table have expressions that are not conditional and always evaluate as values.

Left to right, cell by cell in a loop, and loop by loop from top to bottom, the first $2^A$ of the $Q\cdot(L+1)$ cells have expressions that identify (A+B)-bit values starting with F consecutively increasing by +1 modulo $2^{A+B}$. Thus when the self-sufficient expressions (any one can be evaluated without the others) of the first sub-table are all fully defined and evaluated, the evaluations appear to be that incremented modulo $2^{(A+B)}$ from that of F in the upper-left most cell to that equaling the evaluation of $mod(F+2^A-1,2^{A+B})$, which is the same as the evaluation of $mod(F+L\cdot Q+R-1,2^{A+B})$ in the Rth cell of the (L+1)th (last) loop. This last non-blank evaluation is also identified as Z referencing the relative bank select labeled R-1 in FIG. 2. The last $Q\cdot(L+1)-2^A$ cells in the last loop either evaluate blank or are always blank (very last cell). Thus, by basic definition and after evaluation, the number of non-blank (value) evaluations (all left positioned cells) in the last loop is R, and the number of non-valued (blank) cells in the last loop's remaining cells (all right positioned) is Q-R.

Each sub-table has two headers respective to Q columns. Each first header identifies the Q position numbers and is labeled $1^{st}, 2^{nd}, \ldots, Q^{th}$ as relative positions of both inputted (A+B)-bit address expressions in each row and outputted bank select expressions of the second header of each abbreviated interleave. The second header, labeled as the Q output values for loops of input values, holds Q bank select expressions also for evaluation. For example, the bank select values for abbreviated interleave 0 are identified as K, $mod(K+1,2^B), \ldots, mod(K+(Q-2),2^B), mod(K+(Q-1),2^B)$; each of other sub-tables has its own header of $2^B$ unique bank select expressions for a unique range of successive modulo $2^B$ evaluations, each range having a different first evaluation as one of $0, 1, 2, \ldots, 2^B-1$.

In the embodiment of FIG. 1, the contents of the table of FIG. 5 are stored in ROM 14 as a physical storage device of stable content when in use. The fully evaluated table has valid chosen fixed values for A, B, Q, F, K and thus valid derived fixed values for L, R, and S, where A>B, $2<Q_{odd}<2^B$, $0\leq F<2^A$, $0\leq K<2^B$, $L=trunc[2^A/Q]$, $R=mod[2^A,Q]$, and S=if $[mod(R,2)=1,R,R-Q]$. Thus, for the first sub-table (abbreviated interleave select 0), ROM 14 stores a B-bit data having a value K at the (A+B)-bit address equal to F as shown by the first position of the top (first) header (Q output values . . . ) and the first position of loop 1 (1st) positioned by the bottom (second) header (Q position-numbers . . . ). Similarly, ROM 14 has a $mod(K+1,2^B)$ data value at the address $mod(F+1,2^{A+B})$ value as shown by the second position of the top header and second-left-most cell of loop 1. Thus the output data for a given input address value is known. F points to the ROM 14 address and its corresponding output bank select value K. By definition for the first abbreviated interleave, F is the smallest and thus the earliest first address of any of the $2^B$ abbreviated interleaves of a rotation.

The pattern of the first abbreviated interleave and thus rotation commences with F. As concerns just itself, the alignment of any interleave whether abbreviated or rotation, is determined by the value of F. The alignment is bit-aligned where F=0 and is misaligned by F addresses where F>0. Thus, for any valid value of F $(0\leq F<2^A)$ a rotation (and thus a first abbreviated interleave) begins its unique pattern of bank usage at a pagelet's (F+1)th address. The first $2^{(A+B)}-F$ addresses of a rotation (and thus, all the addresses of all the first $2^B-1$ abbreviated interleaves and the first $2^A-F$ addresses of the last abbreviated interleave) are in a like sized last part of a pagelet. Complementally, the last F addresses of a rotation (and thus the last F addresses of the last or $2^B$th abbreviated interleave) are in a like sized first part of a pagelet. Thus, a pagelet is a bit-aligned rotation of bit-aligned parts of abbreviated interleaves.

The (A+B)-bit input addresses shown in the abbreviated interleave sub-tables of FIG. 5 increase in expressed (even those conditionally blank) value by one modulo $2^{A+B}$ from left to right across a loop, and by Q from one loop to the next from top to bottom of an abbreviated interleave. When parameters are defined and expressions are evaluated, the last loop, L+1, of an abbreviated interleave always ends with R, as at least one but no more than Q-1, valued (non-blank) cells. The R valued cells are to the left of Q-R blank cells. Finally, the expressed addresses (even those conditionally blank) increase by $2^A$ modulo $2^{A+B}$ from one sub-table (abbreviated interleave) to the next and from the last sub-table back to the first.

The bank select expressions of the top header of each abbreviated interleave of each sub-table in FIG. 5 increase by one per position from left to right with wraparound at $(2^B-1)$ to 0, where necessary. For successive sub-table top headers and from that of last sub-table to first, these bank select expressions also either increase or decrease by the signed offset S, with wrap-around from $(2^B-1)$ back to 0 for positive offsets or from 0 directly to $(2^B-1)$ for negative offsets.

Thus in FIG. 5, the address expressions in respective cells and bank-select expressions in positions 1 to Q for the first loop (loop number 1) of addresses of the first sub-table (abbreviated interleave select 0) are F & K,
$mod(F+1,2^{A+B})$ & $mod(K+1,2^B), \ldots,$
$mod(F+(Q-2),2^{A+B})$ & $mod(K+(Q-2),2^B),$
$mod(F+(Q-1),2^{A+B})$ & $mod(K+(Q-1),2^B);$ the address expressions and respective bank-select expressions for the second loop (loop 2, abbreviated interleave 0) are $mod(F+Q,2^{A+B})$ & K,
$mod(F+1+Q,2^{A+B})$ & $mod(K+1,2^B), \ldots,$
$mod(F+(Q-2)+Q,2^{A+B})$ & $mod(K+(Q-2),2^B),$
$mod(F+(Q-1)+Q,2^{A+B})$ & $mod(K+(Q-1),2^B);$ and so on to the $L^{th}$ loop where the address expressions and respective bank-select expressions are $mod(F+(L-1)Q,2^{A+B})$ & K, mod(F+1+(L−1)Q,$2^{A+B}$) & mod(K+1,$2^B$), . . . ,
mod(F+(Q−2)+(L−1)Q,$2^{A+B}$) & mod(K+(Q−2),$2^B$),
mod(F+(Q−1)+(L−1)Q,$2^{A+B}$) & mod(K1+(Q−1),$2^B$).

In like manner, the address expressions and respective bank-select expressions in the same column for the (L+1)th (last) loop, are mod(F+LQ,$2^{A+B}$) & K,
   if[R<2,(blank),mod(F+1+LQ,$2^{A+B}$)]
    & mod(K+1,$2^B$), . . . ,
   if[R<(Q−1),(blank),mod(F+(Q−2)+LQ,$2^{A+B}$)]
    & mod(K+(Q−2),$2^B$),
   (blank) & mod(K+(Q−1),$2^B$).

The abbreviated interleaves that fill ROM 14 share the same shape and the same relative arrangement. Consequently, if larger than its upper limit, $2^A$−1, a thus overly large F redundantly points to the first address of some abbreviated interleave after the first (abbreviated interleave select 0), the first still being that with a first address within a range, 0≦first address<$2^A$. Thus, the content of ROM 14 is exactly the same for correctly bounded values, F=x and K=y, as for those of an overly large F value but still within the rotation where F=mod(x+z·$2^A$,$2^{(A+B)}$) and K=mod(y+z·(S+$2^B$),$2^B$) where z of a range 0<z<$2^B$ makes F overly large and z=0 does not. The values of F and K are fixed as totally independently chosen elemental parameters of the implementation of ROM 14 and affect neither size nor performance of memory; $2^A$>F≧0 and $2^B$>K≧0.

As shown in FIGS. 1, 2 and 5, the value of the lowest (A+B) bits of a virtual address value in address 10 selects one of ROM 14's $2^{A+B}$ words to output a B-bit wide bank select value shown in the same column of a sub-table of a fully defined and evaluated table (FIGS. 2 and 5). For example, if A=8, B=4 and Q=7, then an abbreviated interleave's $2^A$=256 data addresses are interleaved among Q=7 of $2^B$=16 banks and a rotation's $2^{A+B}$=4096 data addresses are interleaved equally, same respective $2^A$ of $2^C$ cells per bank, among all the $2^B$=16 banks of a wing. From this, it can be shown that R=mod($2^A$,Q)=4, S=if(mod(R,2)=1,R,R−Q)=−3 and L=trunc($2^A$/Q)=36. Also, if F=0 as the first address of both the rotation and the first abbreviated interleave (abbreviated interleave select 0), and if K=0 as the bank select value stored in ROM 14 at that first address (zero, and thus the pagelet's first address), then the second sub-table of expressions (abbreviated interleave select 1) of FIG. 5 can be evaluated for the second sub-table of values as appropriately presented:

| | $2^{ND}$ ABBREVIATED INTERLEAVE OF A 8.4.7.0.0 ROTATION | | | | | | |
|---|---|---|---|---|---|---|---|
| | Q Bank Selects | | | | | | |
| Q Position #s | 13<br>$1^{st}$ | 14<br>$2^{nd}$ | 15<br>$3^{rd}$ | 0<br>$4^{th}$ | 1<br>$5^{th}$ | 2<br>$6^{th}$ | 3<br>$7^{th}$ |
| Loop Number 1 | 256 | 257 | 258 | 259 | 260 | 261 | 262 |
| 2 | 263 | 264 | 265 | 266 | 267 | 268 | 269 |
| 3 | 270 | 271 | 272 | 273 | 274 | 275 | 276 |
| . | | | | | | | |
| . | | | | | | | |
| L or 36 | 501 | 502 | 503 | 504 | 505 | 506 | 507 |
| L + 1 or 37 | 508 | 509 | 510 | 511 | | | |

If, for example, the virtual address in address 10 addresses the $512^{th}$ cell in ROM 14 (selected by the lowest (A+B) or 8+4 or 12 bits=511), a B or 4-bit bank select value of 0 is selected as shown by the above example (by finding ROM address 511 of the bottom loop and then looking straight up to 0 in the top-most header line). The bank select value selected is applied to decoder 16 (FIG. 1) in a B-bit wide word (e.g., bit-values of 0000, in the example).

It will be appreciated that the above example also demonstrates that the remainder loop contains four values (R=4) and that the bank select value 13 of abbreviated interleave 1's first position is 3 positions to the left (S=−3) of bank select value 0. This occurs because K=0 is the bank select value in abbreviated interleave 0's first position and the offset of bank select values between consecutive abbreviated interleaves is S=if(mod(R,2)=1,R,R−Q)=if(false,4,4−7)=−3.

The bank select value (VBS) can be expressed as:

$$V_{BS}=\text{mod}(\text{mod}(\text{mod}([A]-F+2^A,2^A),Q)+[B]·(S+2^B)+K+2^B,2^B)$$

where [A] and [B] are the values held in fields A and B of address 10, fields having A and B bits respectively. If F=0 and K=0, then the expression reduces to:

$$V_{BS}=\text{mod}(\text{mod}([A],Q)+[B](S+2^B),2^B).$$

It will also be appreciated that sets of addresses are distributed among $2^B$ banks per wing at the rate of $2^A$ addresses per bank for each repeat of the complexly patterned period of bank usage for $2^{C−A}$ repeats, where $2^C$ is the number of data cells in each memory bank and $2^A$ is the number of addresses in each abbreviated interleave. The abbreviated interleave is a simple pattern that consecutively distributes Q of the $2^A$ addresses during each of L loops, and then distributes a remainder R of the $2^A$ addresses during a remainder loop. Thus, $2^A$=L·Q+R where 0<R<Q. In preferred embodiments, Q is an odd number and more preferably is also a prime number so more different patterns of data are distributed evenly among all banks. The simple pattern of the abbreviated interleave is repeated $2^B$ times for each repeat of the complex pattern of the rotation. The bank usage pattern of each successive abbreviated interleave is relative to and offset from the pattern of the interleave before it by offset S, based on remainder R. S=R or S=R−Q, whichever causes S to be odd, and all abbreviated interleaves of a rotation are offset to a different set of the $2^B$ different sets of Q consecutive bank selects. Consequently, the transition between last cell of one abbreviated interleave and the first cell of the next abbreviated interleave is either +1 or −Q for orderly transitions between different consecutively used sets of Q consecutive bank selects.

The period of the interleave as concerns bank usage is most conveniently described as two patterns: one where the addresses are bit-misaligned by F addresses as rotations of abbreviated interleaves and the other where the addresses are bit-aligned as pagelets or bit-aligned rotations of bit-aligned parts of abbreviated interleaves. Each (aligned and misaligned) is $2^{A+B}$ contiguous data addresses long. Whatever the alignment, one cycle of the bank usage pattern of the interleave is most easily depicted by a period of bank usage aligned to the first address of the first loop of a rotation of abbreviated interleaves as are the depictions FIGS. 2 and 5. Each of the $2^B$ banks of a wing of memory has $2^c$ total addressable cells that together are used by the $2^{B+C}$ physical data addresses that are interleaved among the $2^B$ banks, the complete interleave of the banks needing $2^{C−A}$ pagelets of a like number of rotations of abbreviated interleaves. The abbreviated interleave period of bank usage is Q contiguous data addresses long, having (L+(R/Q)) periods or cycles of such (same Q banks/simple cycle) bank usage, each period of Q addresses. Therefore, there are $2^B$ abbreviated interleaves which comprise every individual rotation of same and share equally its $2^{A+B}$ contiguous data addresses. Moreover, the $2^B$ abbreviated interleaves are successive as first all of one before the next for every rotation, and there are $2^{C-A}$ successive pagelets thereof or bit-aligned rotations per wing, which each wing or complete interleave having a complex pattern with managed discontinuity between $(L+(R/Q))\cdot 2^{B+C-A}$ periods of Q consecutive data addresses using Q banks per period while also having an unusual but uniform pattern for $2^{C-A}$ bit-aligned periods (pagelets) of $2^{A+B}$ consecutive data addresses equally using $2^B$ banks per period.

There may be $2^{A+B}$ different versions of the content of ROM 14 with different pairs of values of F and K, any of which will operate an interleaved memory equally well as concerns performance (efficiency of distributing all data patterns among the repeated banks) for the same values of A, B and Q.

The design of the memory interleave usually commences with two parameters defined by design specifications, 1) a predetermined smallest page size to support paging, and 2) a predetermined odd minimum value for Q to allow banks under some maximum cycle time for no more than some maximum cost to exceed some minimum rate of accesses of memory. Thus, an initial trial B is defined as B=ceil(log$_2$ (predetermined minimum $Q_{odd}$)). B can be progressively larger, freeing Q to be larger, placing less stress on banks which can be cheaper due to longer cycle times, recognizing there are unpredictable total-cost/performance tradeoffs between more slower banks and fewer faster banks designs. An initial trial pagelet size ($2^{A+B}$ addresses) is set equal to some smallest page size as may be preferred (it being preferred that pagelet sizes are no smaller than the smallest page, and that larger differences are incrementally less preferred). An initial trial A is defined as A=log$_2$(predetermined smallest page size÷$2^{initial\ trial\ B}$). Equally preferred pairs of trial A and trial B values sum equally to initial trial A+initial trial B. Where a pagelet larger than the smallest page can not be avoided, progressively less preferred trial A and B pairs have progressively smaller sums, and a smaller B lowers the upper limit for Q where pagelets are progressively smaller than given smallest page size. Thus, once pages smaller than pagelet increase demands on system software for restricting assignment of certain physical pages to certain virtual space, the design can continue farther, without regard to the total difference, pagelet size>page size, except for unknown costs and concerns for software.

Next, all highly preferred prime (over much less preferred non-prime) odd values for Q that are of a range, predetermined minimum $Q_{odd} \leq Q_{prime} < 2^{trial\_B}$, are tested using a few trial A values and paired trial B values, testing sets of A, B, and Q where A equals (preferred) or is more than (progressively less preferred) the initial trial A value. All resulting values for S, S=if(mod(R,2)=1,R,R-Q) where R=mod($2^A$,Q) for tested sets of A, B, and Q values, are calculated recorded. Selections for A, B, and Q where S=-1 or +1 (|S|=1) are equally most preferred for having a wide range of addresses for parallel accesses. S for |S| progressively larger than 1 are progressively less preferred with negative S preferred over same absolute valued positive S. A larger A and/or B and/or a smaller Q allows for a greater maximum range of data addresses, differentiating the largest and smallest data addresses of data of fixed separation accessed in parallel. A smaller A and/or B allows for a smaller pagelet-size for a smaller smallest page-size. A larger pagelet size may be necessary to allow a larger A and/or B and thus larger Q, more preferred S, and/or larger G. A large Q increases the performance of a larger number, P, parallel accesses and/or a prime number Q for more fixed spacings and/or selection of Q in the form ($2^J-1$) or ($2^{J-1}+1$) where ceil(log$_2$ Q)$\leq$J$\leq$B, for a higher density of possible values of A for which |S|=1.

If no |S|=1 exists for usable values of A and Q, then the next choices are progressively of increasing values of |S|, choosing that of negative S over positive where S is of the same absolute value more than 1, until the best available values for A and Q and thus B can be chosen.

The present invention is particularly useful with a paged and bit-addressed memory which, as concerns its interleave, can sustain a rate of P parallel accesses per the minimum time between the initiation of two serial accesses to a single bank where P is of a range, 2$\leq$P$\leq$Q. Thus, P accesses to the data of P data addresses in P banks occurs with a fixed spacing between sequential data addresses of from 1 to trunc[G÷(P-1)] data addresses, but not including spacings equal to multiples of the non-unitary prime factors of Q, where G=if(mod(R,2)=1,
$2^A$·trunc((($2^B$-Q-R+1)÷S)+Q+mod($2^B$-Q-R+1,S),
$2^A$·trunc((Q-$2^B$)÷S)+1+R).

The derived parameter, G, is the maximum difference between the smallest and largest data addresses of data of fixed separation which is accessible in parallel, guaranteed conflict-free. Noteworthy, G=($2^A$·($2^B$-Q)+Q), where R=1 and where R=(Q-1); |S|=1 for both. Thus both S=+1 and S=-1 are equally preferred. Also noteworthy, G is slightly larger for R being even than for R being odd, where |S|>1 and |S|, A, B and Q are the same for both. Therefore a smaller absolute value for S is preferred over a larger absolute value, and a negative S is preferred over positive of the same absolute value where |S|>1.

The efficiency of the interleave scheme according to the present invention for addressing seven banks (Q=7) is the same as the Ranade scheme, namely 87.8%, meaning that 87.8% of the banks, on the average, hold the data of a large range of fixed stride values. However, the present invention permits addressing of paged memories, which the Ranade scheme cannot. By comparison, for distributing data of a fixed stride value among eight repeated data banks a classic interleave scheme has an efficiency of 67.2% and a pseudorandom scheme has an efficiency of about 66%.

A modification of the embodiment of FIG. 1 allows elimination of decoder 16 by widening ROM 14 to output a bank select that is $2^B$-bits wide, instead of B-bits wide. Thus, a single bit on one of the $2^B$ output lines from such a modified ROM 14 is input directly into the bank enables of banks 12 to select a single bank 12 of each wing M. The advantage of this modification is the elimination of delay due to decoder 16, but at a sacrifice of increased size of ROM 14.

Figure 6:
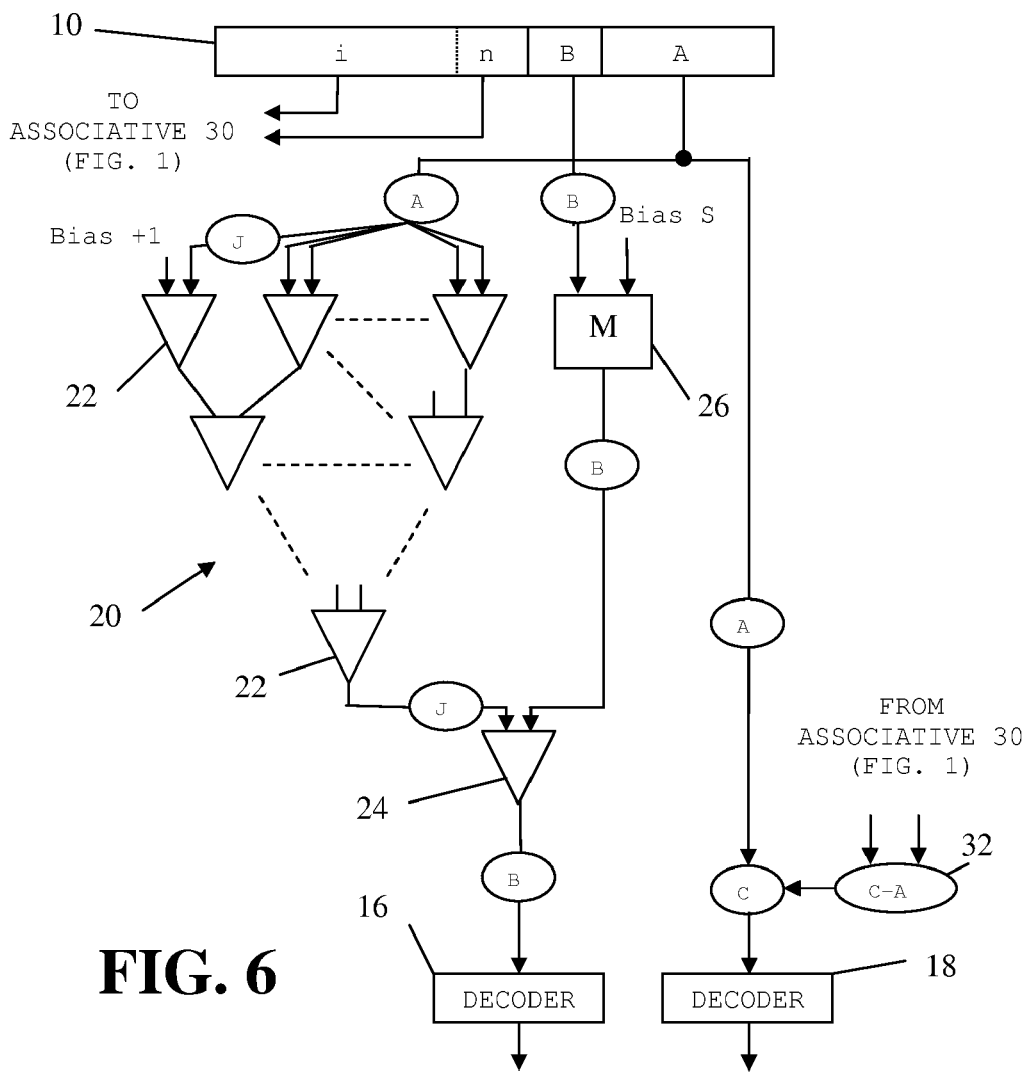
FIG. 6 is a functional diagram showing a logic tree for generating a bank select value for an addressing apparatus according to a modification of the present invention.

In another embodiment of the present invention, shown in FIG. 6, if Q=($2^J-1$) where J is of the range, 1<J$\leq$B, ROM 14 may be implemented as a J-bit wide pyramid 20 or tree of J-bit wide end-around-carry adders 22, where J=ceil(log$_2$ Q). The lowest order A bits of the data address 10 are input to tree 20 ordered as trunc(A÷J) J-bit inputs from field A, taken J by J starting from right most J. Any additional right justified less than J-bit remaining input is taken from field A's left most mod(A,J) bits. The J-bit output from tree 20 is input, right justified, into one input of the single adder, B-bit wide no-carry-out adder 24.

The second input to adder 24 receives the B-bit output from multiplier 26. Multiplier 26 is a B-bit wide multiplier that multiples the highest order B bits of the lowest order (A+B) bits of the data address 10 multiplied by a multiplication factor based on S. Where S is positive, the multiplication factor is S; where S is negative, the multiplication factor is S+$2^B$. The output of adder 24 is a B-bit bank-select value to decoder 16 to select one of the $2^B$ memory banks 12 (FIG. 1)

per wing. In addition to being inputs to tree 20, the A bits concatenated with the C–A bits from associative 30 are decoded by decoder 18, as previously described, to select one of the $2^C$ data cells in the memory bank or banks selected by decoder 16 (FIG. 6) and decoder 36 (FIG. 1).

For the cases where |S|>1 and where S=−1 (i.e., when S is not +1), tree 20 is biased by an additional +1 input shown as the upper left input of the upper left adder 22. While the +1 bias may be used, for the special case where S=+1 (and R=1) the +1 bias to tree 20 is not necessary and may optionally be eliminated. Also, other biases between +1 and $H^J-1$, may optionally be employed for unique results. Note that only a very few of the $2^{A+B}$ alignments of address and bank possible with ROM 14 (values for F and K) are possible with the tree, and that F=0 is not possible. Additional different possible values of F are the result of the +1 bias being different larger values such as the adder input can input.

Figure 7:
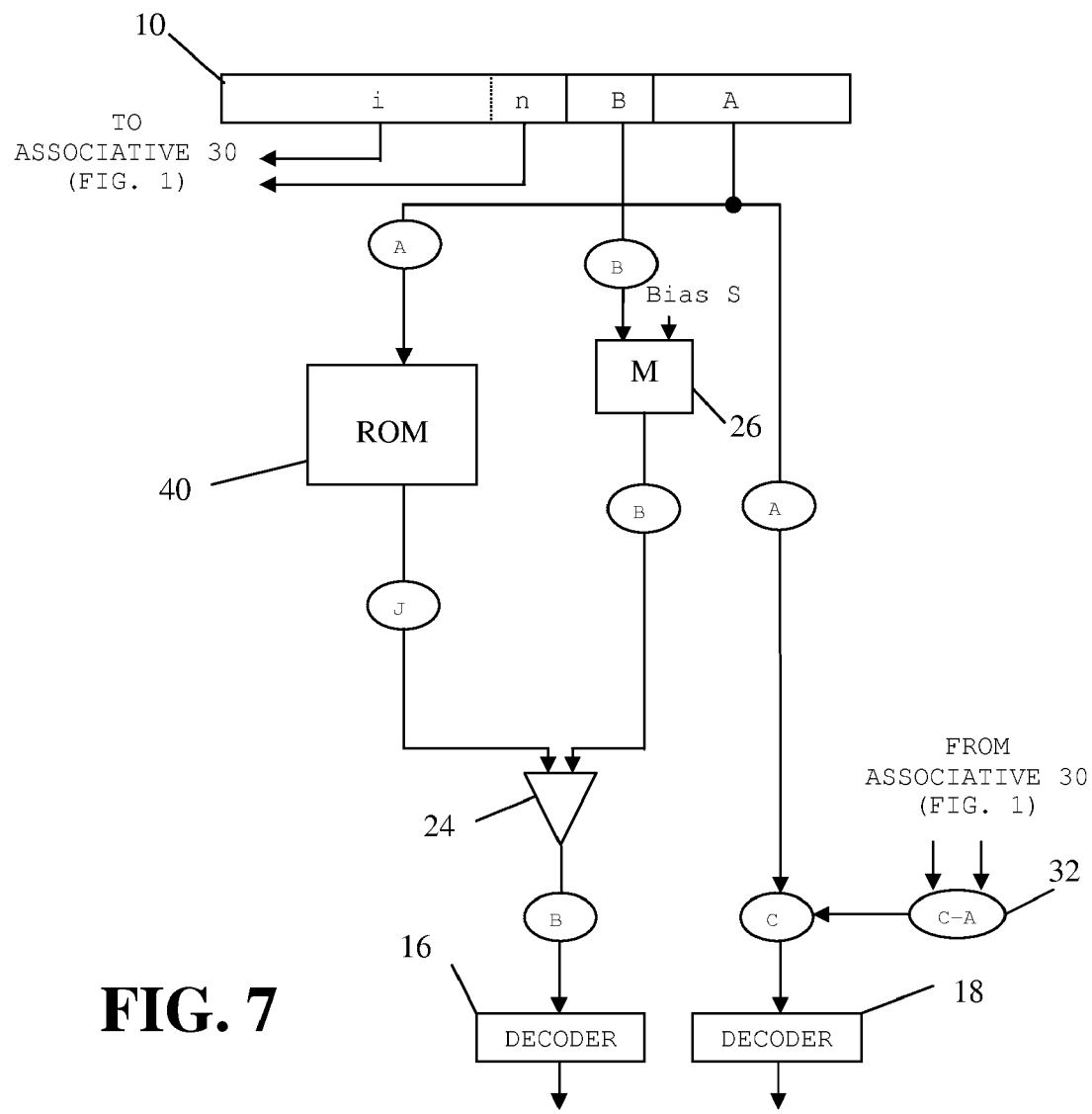
FIG. 7 is a functional diagram showing another memory apparatus for generating a bank select value for an addressing apparatus according to another modification of the present invention.

FIG. 7 illustrates another embodiment of the present invention, similar to that of FIG. 6, except that tree 20 is replaced by read-only memory (ROM) 40, which stores at least $2^A$ data segments (as opposed to ROM 14, which holds at least $2^{A+B}$ data segments). In this case, ROM 40 receives the ordered A bits to derive a J-bit wide output for input into adder 24 where J is some value of the range, ceil($\log_2$ Q)≦J≦B. If K=0 and F=0, as is preferred where J become smaller, then in FIG. 7, J=ceil($\log_2$ Q), and ROM 40's data width is optimal (least) as concerns K and F. Whereas, if K>0 or F>0, then J's value becomes a function of A, B, Q, F, and K. In these cases, J is best found by close examination and simulation of ROM 40's full range of outputted bank select values as shown by the data structure of FIG. 8, where J=ceil[$\log_2$(ROM 40's largest output value)]. In some cases, K and/or F may vary in a single design, such as for security reasons, so the data structure of FIG. 8 is not defined, and J=B, creating the largest possible ROM 40 data width. ROM 40, multiplier 26, and no-carry-out adder 24 implement the function of ROM 14 for all valid A, B, Q, F and K.

FIG. 8 is a representation of the data structure of ROM 40, and presents the data structure needed to produce a single abbreviated interleave from adder 24 for each value of field B if F=0 and produce complimentary parts of two successive abbreviated interleaves for each value of field B if F>0 (last F addresses of one followed by the first $2^A-F$ of the next). FIG. 8 presents the data structure as that of two abbreviated interleaves in a table of expressions with a single sub-table, providing one set of Q output values where input values are smaller than F and providing a different set of Q output values where input values are greater or equal to F. In this case, however, relative bank select expressions become the outputted values of ROM 40 (as opposed to those not relative of ROM 14) when defined and evaluated. The expressions of that outputted ROM 40 are presented in two of three aligned headers of Q positions FIG. 8, one header above the other and both (one for input values<F and the other for input values≧F) above the third (that showing position within an abbreviated interleave's period of bank usage). The body of the table has expressions for A-bit inputted values representing all $2^A$ possible values of only field A in virtual address 10. One header has Q outputted relative bank select values for the case where the input values are less than F, and the other header has Q values for the case where the inputted A-bit values are greater than or equal to F. As expressed in terms of elemental and derived parameters of an interleave, all the table's input values increase by one modulo $2^A$, cell by cell, left to right, across a whole row of Q positions and by one modulo $2^A$ from right most cell of one row to left most cell of next row, thus increasing by Q modulo $2^A$ from row to row, from top to bottom row.

The A-bit value of the lowest order A bits of virtual address 10 selects one cell of ROM 40 to output a J-bit wide relative bank select value as from one position of one of the two headings of such values of the table (depending on whether the input value is smaller than F or equal to or larger than F). The outputted J-bit wide word then becomes a right-justified input to B-bit wide adder 24 (FIG. 7) to generate an actual (non-relative) bank select value for input to decoder 16.

For example, if the lowest order A bits of an interleaved virtual address is less than F and is represented by the expression in some $2^{nd}$ position cell of any row of the table of FIG. 8, the outputted J-bit value of ROM 40 is mod(K+($2^B-S$)+1, $2^B$) as presented in the same position of the top header of the table. Otherwise, if the inputted value is equal to or greater than F but is still represented by that in some $2^{nd}$ position cell of some other row, then the outputted J-bit value is mod(K+1,$2^B$) as located in the 2nd position of the middle (next lower) header.

Both top headers in FIG. 8 have relative bank select expressions that evaluate as values that increase by one from left to right with wrap-around from $2^B-1$ to 0 as necessary. The values of the top header (for the A-bit values in table<F) are offset from those of the middle header by minus the signed offset S with wrap-around either from $2^B-1$ to 0 for subtracted negative offsets or from 0 directly to $2^B-1$ for subtracted positive offsets, wrapping around in either case only as necessary. The top header causes ROM 40's outputs to compensate for the value of field B of virtual address 10, [B], addressing bit-aligned blocks by definition (bit-aligned blocks of $2^A$ data addresses of last F addresses of finishing abbreviated interleave followed by first $2^A-F$ of starting), the content of ROM 40 being that (relative bank select values) of appropriate parts (last F followed by first $2^A-F$ data addresses) when not bit-aligned (F≠0) rotations of abbreviated interleaves are implemented for a memory. ROM 40's input to multiplier 26 does not need compensation as from the top header and none occurs where F=0, and thus, abbreviated interleaves are bit-aligned. However, where F>0, the top header is needed and used by the table, FIG. 8, to present the relative bank selects of the first F data addresses of each abbreviated interleave as for a value of field B prior to B value current and for the last $2^A-F$ data addresses of the same abbreviated interleave.

FIG. 8 is made a general design tool for any value of F by showing the upper header as having values even when irrelevant for F=0.

An abbreviated interleave, and a rotation thereof where [B]=0, begins (as that before ends) respective to where ROM 40's represented A-bit input values from virtual address 10 field A transition from mod(F−1+$2^A$,$2^A$) to F. Thus, when F>0, at transitions from (F−1) (ending) to F (beginning), but when F=0, ($2^A-1$)→0 at A field wraparound.

The derived parameter, J, for the input and output data bit width of the tree of XORs of FIG. 6 is a singular expressed value, J=ceil($\log_2$ Q). Whereas J as the output data bit width of ROM 40 for FIGS. 7 and 8 is of the range ceil($\log_2$ Q)≦J≦B, where in some cases of Q and B values, J can be larger than ceil($\log_2$ Q).

Similar to the expressed input values of each of the $2^B$ sub-tables of (A+B)-bit inputs of ROM 14 shown in FIG. 5, the represented A-bit input values as expressed in the table of FIG. 8 also increase by one modulo $2^A$, cell by cell across each loop from left to right for Q cells with Q expressions/loop, and the last loop also has Q−1 expressions and one right-most empty (expressionless and blank) cell thus always containing no value. Thus, cells of the same position in successive rows increase by Q modulo $2^A$ from loop to loop from top to bottom and back to the top again of the table. L full loops have Q expressions, and the last and remainder loop has Q−1 expressions plus one right-most empty, expressionless and blank cell of no value. Also similarly, input values increase by one with wrap-around as necessary, but from a value of $(2^A-1)$ to 0 instead of from $(2^{A+B}-1)$ to 0. Again similarly, the last or loop number L+1 of the table ends with at least one but no more than Q−1 positions evaluating as a value and not a blank. When fully defined and evaluated, the line of this last loop will have R valued positions in its R left-most cells and Q−R blank right-most positions. Here again for FIG. 8 as in FIG. 5, R=mod($2^A$,Q) and L=trunc($2^A$/Q) and S=if(mod(R,2)=1,R, R−Q) and also A, F, B, K and Q are chosen as valid fixed values of a design as before.

Figure 9:
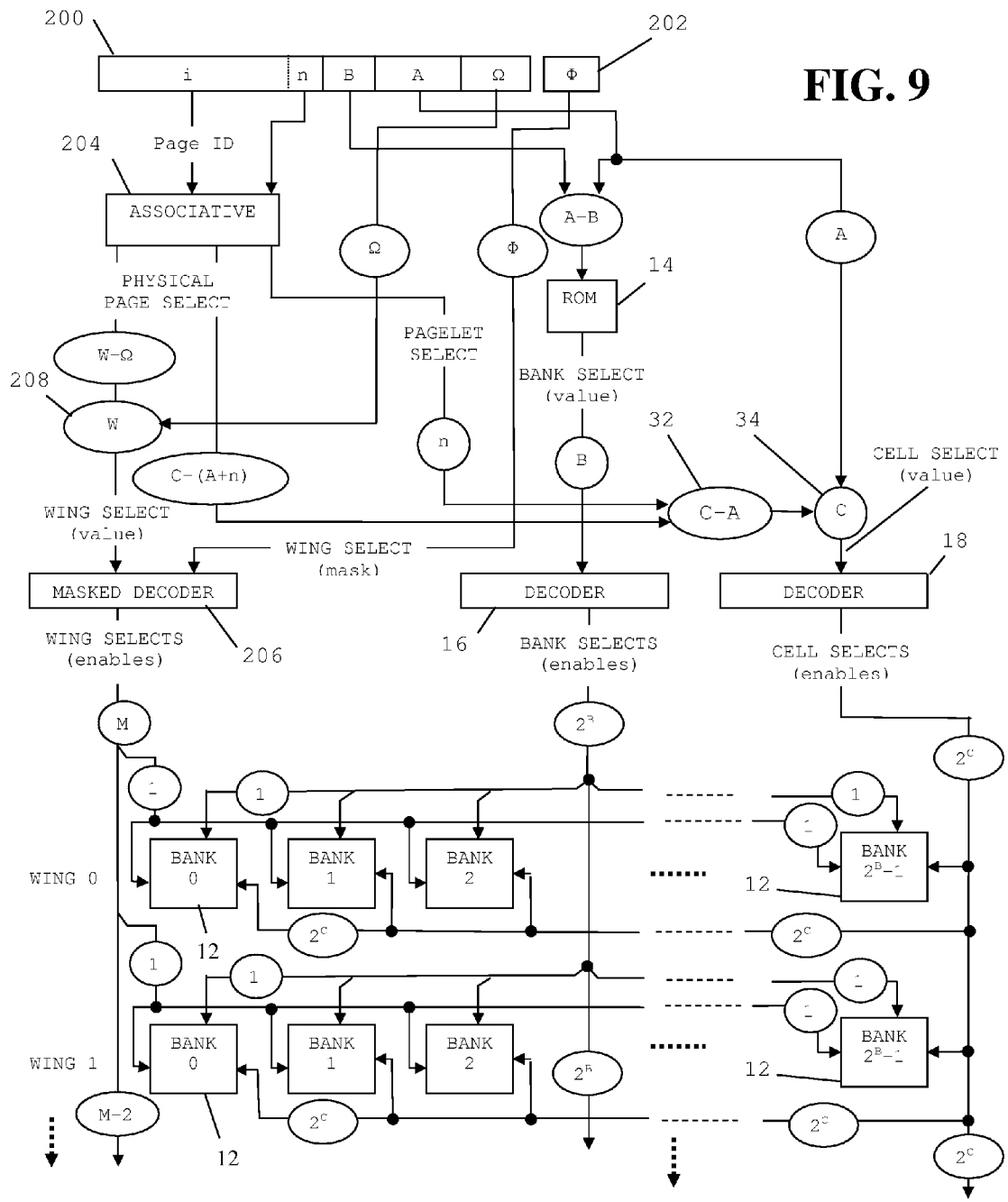
FIG. 9 is a diagram, as in FIG. 1, illustrating apparatus for addressing a paged memory containing various sized data blocks according to another modification of the present invention.

FIG. 9 is a block diagram of another modification of the present invention particularly useful to access interleaved data of various sizes. The embodiment of FIG. 9 is particularly useful for general purpose and personal computers. Briefly, the concept of the invention shown in FIG. 9 extends the concepts of the invention shown in FIGS. 1-8 by establishing a single smallest size data block per access for each memory bank and accessing per access a memory bank in each of plural wings to access larger sized data from the plural wings. For ease of explanation, like elements in FIGS. 1 and 9 carry like reference numerals.

Virtual address 200 is similar to virtual address 10 (FIG. 1) in that it includes i, n, B and A fields, but it also includes a Ω field containing Ω bits representing a value [Ω], where 0≦[Ω] <$2^Ω$. Moreover, unlike associative 30 (FIG. 1) which is responsive to fields i and n to supply wing select value W as part of the physical page select, associative 204 supplies only a fixed number of the most significant bits of W. The least significant bits of wing select value [W] are the Ω bits from the Ω field. Thus associative 204 supplies the physical page select as W−Ω+C−(A+n). The C−(A+n) bits of the physical page select are applied through concatenators 32 and 34 to derive the cell select values, as in the case of the embodiment of FIG. 1.

The additional Ω bits from the lowest order bits of virtual address 200 are concatenated at 208 with the bits from associative 204, now as W−Ω, to derive a larger wing select value W for selecting more wings than associative supplies. The W wing select value bits are applied to masked decoder 206. Decoder 206 is similar to decoder 36 (FIG. 1), except that one or more of the least significant bits of bits W, the Ω from address 200 being least Ω bits of bits W, may be masked by a mask 202 having Ω bits, 0<Φ≦Ω. The right-most φ bits of mask 202 may have some common value (e.g., binary "1") to create a φ-bit wide mask, with 0≦φ≦Φ. Ω and Φ are fixed parameters of a design whereas φ may vary within a design, and will vary according to accessed data size and plurality of wings accessed per access.

As in embodiment of FIG. 1, the interleaved memory being addressed has M wings each containing $2^B$ memory banks. In the embodiment of FIG. 9, M is an integer multiple, greater than 0, of $2^Ω$. Consequently, the memory has M/$2^Ω$ bit-aligned blocks of $2^Ω$ wings per block. The $2^B$ abbreviated interleaves of ROM 14 (previously described for complete interleaves encompassing one wing containing $2^{B+C}$ cells in $2^B$ banks as ordering bank usage per cell address) orders aligned bank-set usage per aligned cell-set address for an aligned $2^Φ$ of $2^Ω$ aligned wings of a complete interleave containing $2^{B+C+Ω-Φ}$ sets of $2^Φ$ cells per set in $2^{B+Ω-Φ}$ bank-sets of $2^Φ$ banks per set. Thus as shown where φ=Φ and Φ=Ω, the (largest) interleaved data size of ROM 14's interleave is $2^Ω$ commonly addressed cells of $2^Ω$ commonly addressed banks of some bit-aligned block of $2^Ω$ wings.

Each interleaved data size larger than the smallest is a different bit-order multiple of the smallest interleaved data size (the smallest being that of a single cell of a single bank). The largest data size is that of the $2^Ω$ wings of a rotation of abbreviated interleaves. The spread of any sized interleaved data is across $2^Φ$ commonly addressed cells of a bit-aligned block of $2^Φ$ commonly addressed banks of a bit-aligned block of $2^Φ$ wings, where φ is a value within the range 0≦φ≦Ω if Φ=Ω. For accessing the smallest element of interleaved data, φ=0 and $2^Φ$=1. For accessing the largest interleaved data size, Φ=Ω, φ=Ω and $2^Φ$=$2^Ω$, although the largest interleaved data size is not actually accessed where Φ<Ω, and any or all values of φ, 0≦φ≦Φ, may not be accessed by a reasonable design except φ=Φ and φ=0.

Mask 202 outputs a mask for selecting bit-aligned blocks of one or multiple wings per access. The mask has a variable φ right-most bits of a common bit value (e.g. binary 1) differentiating any left-most which causes masked decoder 206 to remove decoding of the φ right-most bits of the W-bit encoded wing select value. Consequently, the φ least-significant bits of W, which are the lowest from the Ω portion of virtual address 200, are ignored as concerns differentiation of outputted enables from masked decoder 206. Thus if φ is 0 for accessing the smallest amount of data ($2^Φ$=1), then none of the W bits is masked off and only one of the M outputted wing select (enables) selects a wing. If φ is 1 ($2^Φ$=2), the right-most bit (least-significant) of the W bits is masked off and a bit aligned pair of wings are selected by the remaining (W−1)-bit encoded wing select value. Consequently, masked decoder 206 outputs two activated enables of its M total possible enables. Data from $2^Φ$ banks are accessed because the φ right-most bits of the mask remove the φ right-most bits from the W bits, resulting in the remaining left-most (W−φ) encoded bits operating masked decoder 206 to output a bit-aligned block of $2^Φ$ activated enables of the decoder's M total possible enables which in turn select a bit-aligned block of $2^Φ$ of the memory's M wings to access one data from one bank for each selected wing.

ROM 14 and decoder 16 select one bank per selected wing each access, and all the inputs to decoder 18 cause it to select one elemental data per selected bank each access. Thus the outputs of the decoders 16 and 18 and masked decoder 36 cause all selected banks 12 to access some interleaved data of $2^Φ$ commonly addressed elemental data of the $2^C$ such interleaved data of some set of $2^Φ$ commonly addressed banks of the $2^B$ such sets of some bit-aligned block of $2^Φ$ wings of the $2^{Ω-Φ}$ such blocks of some bit-aligned block of $2^Ω$ wings common to a complete interleave of $2^{C-B}$ rotations of abbreviated interleaves of the first M/$2^Ω$ such blocks of memory. The first M/$2^Ω$ bit-aligned blocks of $2^Ω$ wings per block common to a complete interleave of $2^{C-B}$ rotations are all physical memory, where φ is a single unique value for each actually accessible interleaved data size.

The number of wires necessarily outputting from mask 202 is a number equal to $\log_2$ of largest actually accessible interleaved data size (shown as Φ in FIG. 9), which is some number from zero to Ω depending on a memory's design, Φ=0 and Ω>0 being a practical choice for some row latching DRAM designs accessing cache lines.

Where φ=0, the interleaved data size is that of the elemental addressable data of a single bank. An interleaved memory addressable with the apparatus of FIG. 9 need only have a minimal number of wings M, where M is some multiple of $2^Ω$. Moreover, $2^Ω$ being larger than $2^Φ$, random accesses can be expected to perform well. In any case, a memory has one complete interleave of $2^{B+\Omega}$ memory banks for each bit-aligned block of $2^{\Omega}$ wings for any and every implemented interleaved data size from $\phi=0$ to $\phi=\Phi$.

The memory addressed by the apparatus of FIG. 9 would have $2^{(B+C)} \cdot M/2^{\Omega}$ consecutive physical addresses for the largest interleaved data size, $2^{(B+C+\Omega-\phi)} \cdot M/2^{\Omega}$ consecutive physical addresses for the smallest interleaved data size, and $2^{(B+C+\Omega-\phi)} \cdot M/2^{\Omega}$ consecutive physical addresses for an intermediate interleaved data size. The period of bank usage is $2^{(A+B)}$ consecutive physical addresses for the largest interleaved data size, $2^{(A+B+\Omega)}$ consecutive physical addresses for the smallest interleaved data size, and $2^{(A+B+\Omega-\phi)}$ consecutive physical addresses for an intermediate interleaved data size.

The abbreviated interleave's relative period of bank usage is Q consecutive physical addresses for the largest interleaved data size, $Q \cdot 2^{\Omega}$ consecutive physical addresses for the smallest interleaved data size, and $Q \cdot 2^{(\Omega-\phi)}$ consecutive physical addresses for an intermediate interleaved data size.

One feature of an interleaved memory addressed by the apparatus of FIG. 9 is that it efficiently distributes and thus accesses various patterns (including pseudo-random patterns) of multiple sizes of interleaved data.

Figure 10:
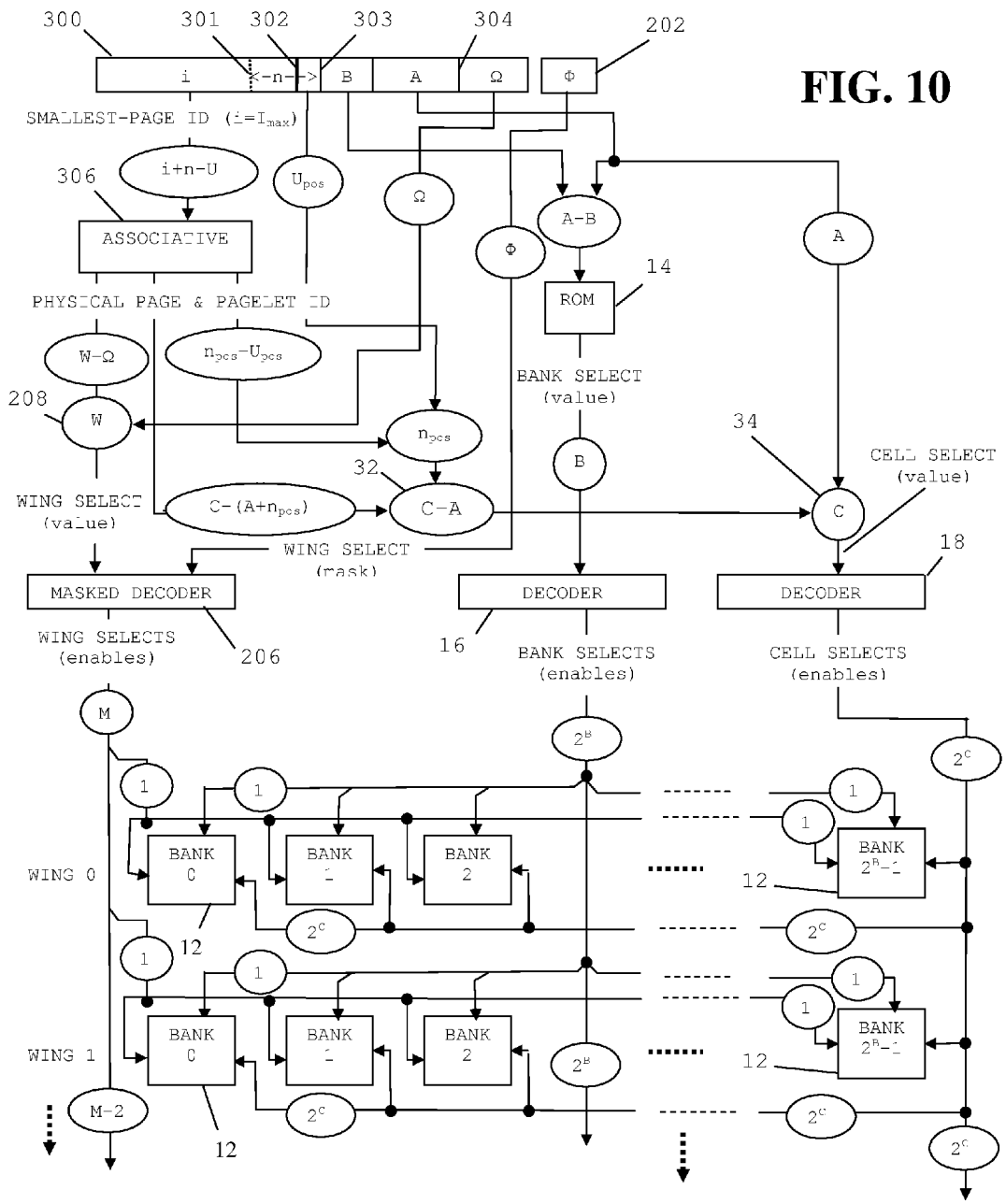
FIG. 10 is a diagram, as in FIG. 9, illustrating apparatus for addressing a memory containing pagelets larger than pages according to yet another modification of the present invention.

FIG. 10 is a block diagram of another modification of the present invention particularly useful to memories having pagelets larger than a single page. Previously, the size of a pagelet was assumed to be as small or smaller than memory's smallest page size, and the n field of the virtual address was used to define the number of whole pagelets per page. Thus, there were $2^n$ pagelets per page where $n \geq 0$. The embodiment of FIG. 10 allows application of the invention to accommodate not only one or plural pagelets per page as before, but also a partial pagelet on a page. Briefly, the concept of the invention shown in FIG. 10 extends the concepts of the invention shown in FIGS. 1-9 by establishing a fixed-per-design integer-parameter, U, such that $2^U$ is a whole number of pagelets or a fraction of a single pagelet, for a smallest page size. The value of U is selected such that $U \geq 0$ for whole numbers of pagelets and $U<0$ for fractions of pagelets. For ease of explanation, elements in FIG. 10 carry the same reference numeral as like elements in FIGS. 1 and 9.

FIG. 10 not only shows but labels a dotted boundary 301 between fields i and n of virtual address 300. For any specific design and as before, the position of boundary 301 is variable according to mappings of pages found by associative 306 for the different implemented page sizes being accessed. In any case, boundary 301 can be anywhere not right of a fixed barrier 302. Barrier 302 may be established as left of, at, or right of the B field left boundary at 303. More particularly, barrier 302 may be established anywhere between and including boundary 301 (between the i and n fields) and boundary 304 (between the A and $\Omega$ fields). The absolute value of parameter U is equal to the number of bits that barrier 302 is displaced from boundary 303. Also, U is positive if barrier 302 is displaced left of boundary 303, is negative if barrier 302 is displaced right of boundary 303, and is zero if barrier 302 coincides with boundary 303. In FIG. 10, barrier 302 is arbitrarily shown to the left of boundary 303, where U is positive. Barrier 302 is not a boundary of any field. Field i, as the virtual page identification, never extends past, or to the right of, barrier 302. Field i may extend to coinciding with barrier 302 as a design's largest virtual identification of its smallest page.

For any particular design, $U=n_{min}$ and $n \geq U$, and the range of U extends between $-(A+B)$ and $(i+n)$, $-(A+B) \leq U \leq (i+n)$. Since U may be negative in a given design, n may be negative for such designs for at least smallest pages and also for some larger or even all larger including the largest page.

Within its various allowed extremes as for all those extreme designs having $U=-(A+B)$, the variable boundary 301 between fields i and n may vary, always from barrier 302 at the left boundary of field Q where smallest page size is equal to only one largest accessible data, to somewhere left depending on largest page size to as far left as the left boundary of field i where left and right boundaries of i coincide and i=0. It can be shown that because the i and n fields are inversely variable, boundary 301 could coincide with the left boundary of field i, resulting in i=0. In such a case, barrier 302, which can coincide with boundary 301, could coincide with the left boundary of field i. Under such circumstances, the largest page needs no identification as it is all virtual memory, and thus the virtual memory's size equals only one physical memory. For this reason, most designs will establish U and the largest page size away from their extreme limits such that the smallest page holds a number of the largest actually accessible data and the virtual memory size is a number of whole physical memories.

As in the prior embodiments, (i+n) is still a fixed value for any particular implementation because for as much as i can now be more than (i+n), n will be negative by the same amount, up to as much as U is negative. When n is negative, negative field n folds back within right end of field i, reaching back through the left end of field B to B's left boundary 303.

Associative 306 receives the variable virtual page identification as a not yet completely specified input, not specified yet to one of a fixed number of fixed formats, one for each implemented page size. The input comprises the left-most (i+n-U) bits from address 300, comprising all bits to the left of barrier 302. Thus the input contains the maximum number of bits, $i_{max}$ bits, for the largest format, field i for the smallest page. With each attempted access of memory via address 300, associative 306 attempts to match the value of the necessary number of left-most bits of the (i+n-U)-bit input of unknown format from address 300 to each mapped virtual page identification according to each particular mapped page's implemented size known only by associative 306. The match defines (i+n-U)-bit input from address 300 as having left-most bits uniquely matching some particular matching page's value for i-field for necessary number of bits according to the particular page's size. Thus and if one exists, the matching page identification from a table of mapped pages defines the format of input to associative 306 from address 300, the number of bits of virtual page identification field (i) and of the pagelet identification field (n) and its sign, both of address 300 and the position of their common boundary 301.

From a found entry in a table of all mapped pages, virtual to physical, associative 306 supplies the $(W-\Omega+C-A-n_{pos})$-bit physical identification (left two outputs of associative 306) that is either a page or pagelet (or both where same sized) identification, whichever is fewer bits, and is all or portion of the physical page, pagelet or both identification associated with each defined virtual page identification, where $n_{pos}=$if $(n>0,n,0)$. Depending on the size (and thus sign) of U and the currently accessed page size, a portion of the output from associative 306 is any $(n_{pos}-U_{pos})$-bit unassociated portion of the physical pagelet identification, where $U_{pos}=$if$(U>0,U,0)$. The $(n_{pos}-U_{pos})$ bits are unaltered in value as that of those of field n either left of barrier 302 or left of boundary 303 whichever is left most. Any unassociated portion of the physical pagelet identification not from associative 306 is the $U_{pos}$ bits directly from any in field n right of barrier 302 and left of boundary 303. The three portions of the physical pagelet identification are the $(W-\Omega+C-(A+n_{pos}))$portion (left two outputs of associative 306), the $n_{pos}-U_{pos}$ portion (right output of associative 306) and $U_{pos}$ portion (from any portion of field n in virtual address 300 right of barrier 302 and left of boundary 303, there being no portion except barrier 302 being left of boundary 303).

When n is positive or zero (and U is positive, zero or negative), associative 306 and address 300 as combined for field $n_{pos}$ act as described earlier in the FIG. 1 and FIG. 9 embodiments, just associative or associative 204 for field n: The prior associated physical identifications of (W+C−(A+n)) and (W−Ω+C−(A+n)) are now (W−Ω+C−(A+$n_{pos}$)) bits, and the prior n is now $n_{pos}$, and $n_{pos}$ is any positive or zero number of unaltered pagelet identification bits right of field i and left of field B that pass through and/or around associative 306 and/or directly from address 300 to define $n_{pos}$ bits as that part of (C−A) bits at concatenator 32.

When n is negative (and U is at least as negative), the concatenation by concatenator 32 is always a pagelet select despite accessing pages smaller than a pagelet. Associative 306 does not otherwise produce a page select per pagelet for pages smaller than a pagelet. Any |n| bits right of boundary 303 are the right-most of a physical page select as within a physical pagelet identified, that from left two outputs from associative 306 with $n_{pos}$, $U_{pos}$, and thus $n_{pos}$−$U_{pos}$ all being zeros. Thus when virtual data or data space is initially mapped into physical memory and the amount mapped is that of a certain size page smaller than a pagelet, mapping is not arbitrarily to any available such sized physical page but is to an available one of only those selected by the common value of all mapped data addresses' common n field as for page size to be mapped, with there being one so selected within every so sized physical space available if not already mapped but not necessarily available to this mapping by un-mapping and remapping if already mapped. Such selective mapping of pages smaller than a pagelet permits the memory's virtual space mapped to such smaller physical pages to be ordered for bank usage as expected. Preserving expected order of bank usage for programmers of programs is usually important for good memory performance.

If a read access is not successful because its data are not mapped into physical memory, all virtual data not in physical memory is in other storage (often disk storage via system controlled input/output accessing such storage), including that data currently needing to be read. The system, with information from various sources to manage system resources for all those using the system including that with the unsuccessful read access, chooses a page size to include the read data needed in physical memory. Also, there is a (i+n−U)-bit smallest-page identification value as from virtual address 300 for the unsuccessful read access, an identification value known to the system through the state change package giving such information to the system for unsuccessful accesses. Thus, if n is negative for the page size chosen by system, system knows the value of the thus necessary common identification as from between boundary 303 and 301 of address 10 as for the page size chosen. Thus, the system must supply a physical page for data to be read from disc or other storage, a physical page with the same necessary common identification as will soon be from address 300 from between boundaries 303 and 301 when a new attempt is made for read access. The system also having placed or replaced an entry in associative 306's table of mappings, activates that with the read access still to be successful via the state change package for same. Thus the data with data to be read are loaded into a page with the necessary common identification for page within pagelet for the page of size chosen, and are mapped into the chosen physical page with a new or updated entry in associative 306's table of all mappings.

When the chosen page size is less than pagelet size, the virtual data can be mapped into only $\frac{1}{2}^{|n|}$th of such pages possible in physical memory. Thus, as the ratio of page size to pagelet size shrinks below 1, available physical memory space shrinks by the same ratio. Whereas, for all ratios not less than one, all physical memory space is usable.

For example, if n=−2 for the chosen page size and [n]=1 for all the virtual data to be thereof, then the two bits of any data address accessing page's data, as are just right of boundary 303 of address 300, select second page of four pages per pagelet, those four selected by selects 0, 1, 2, and 3. The virtual data can only be mapped to a physical page having select value equal to a value of common field n, a value of 1 in this example, for all virtual addresses of data ever to be mapped to physical memory by this mapping when become an entry in the table of such mappings used by associative 306. Thus, $\frac{3}{4}^{th}$ of all physical memory space is unavailable to any one mapping of a page where n=−2.

It is possible that under certain circumstances multiple data stream processing may become unbalanced, favoring one stream over another. A managed pseudo-randomness to the bank select order may aid in minimizing unbalanced conditions without disrupting the high data rates achieved by the interleave scheme according to the present invention.

Figure 11:
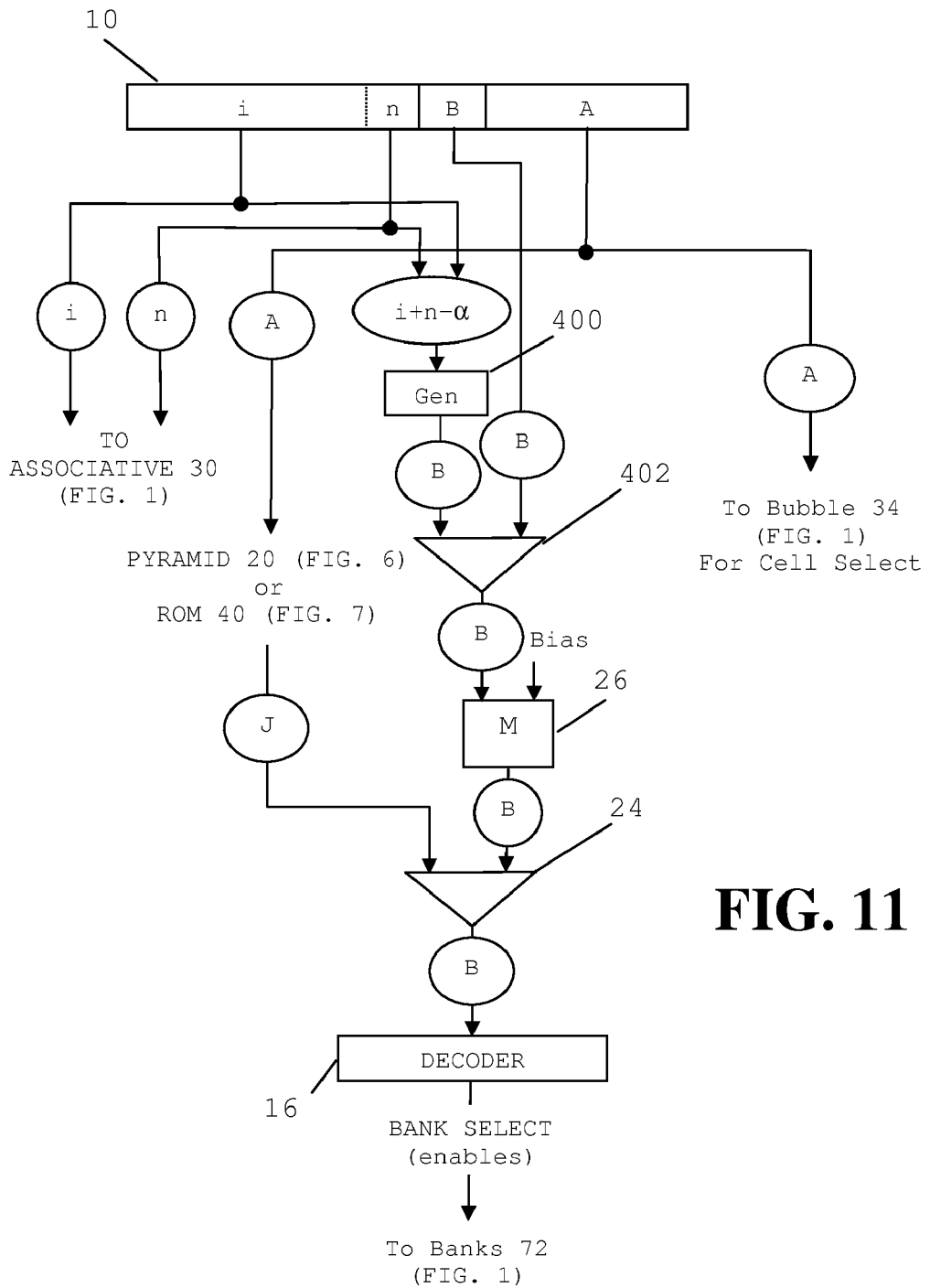
FIG. 11 is a diagram, as in FIGS. 6 and 7, illustrating another modification of the invention to provide a managed pseudo-random bank select order for multiple data stream processing.

FIG. 11 illustrates a modification to the embodiments shown in FIGS. 6 and 7 for generating bank selects into decoder 16, a modification for managing pseudo-randomness to the bank select order. Like FIGS. 6 and 7, FIG. 11 does not show all needed that is unchanged from FIG. 1 but also from FIGS. 6 and 7, but shows enough as unchanged to convey the boundaries between that changed and that not changed. The connections to that not redrawn and thus unchanged of FIG. 11 are with associative 30, banks 12 and bubble 34, all of FIG. 1, pyramid 20 of FIG. 6, and ROM 40 of FIG. 7. Any randomness to the bank selects lowers efficiency of distribution of data of all fixed separations if over about 66% without the randomness. Thus, that shown by FIG. 11 is of no use for selection of I-banks 72 (to be described in connection with FIG. 12) where 100% efficiency of distribution of data accessed is necessary.

The i field and n field of address 10 (FIGS. 1 and 11) are inputs to associative 30 (FIG. 1) as before. The concatenated (i+n−α) bits as left-most of combined fields i and n of address 10 are applied as a seed input to pseudo-random generator 400, which in turn outputs a B-bit pseudo-random value to a first input of B-bit wide adder 402. The second input to adder 402 is field B of address 10. The output of adder 402 is applied to the B-bit wide input of multiplier 26 (otherwise as in FIGS. 6 and 7) for input to B-bit wide no-carry-out adder 24 (as in FIGS. 6 and 7). Thus, the B-bit output from adder 402 replaces address 10's B field input to multiplier in FIGS. 6 and 7. Adder 24 receives its second input in the form of J bits (ceil($\log_2$ Q)≦J≦B) from pyramid 20 (FIG. 6) or ROM 40 (FIG. 7) as thereby produced before. Moreover, in most cases F is set to zero, F=0, so the boundaries of the defining form of abbreviated interleaves are bit-aligned to address 10 and specifically field B.

In one form of the embodiment of FIG. 11, adder 402 is a full B-bit wide 2's compliment adder, which is adjustably least pseudo-random for pagelet size. In this case, the bank select value inputting to decoder 16 as $V_{BS-1}$ is expressed as:

$$V_{BS-1} = \mathrm{mod}(\mathrm{mod}(\mathrm{mod}([A]-F+2^A,2^A),Q) + \mathrm{mod}([B]+fpr([(i+n-\alpha)],2^B),2^B)\cdot(S+2^B)+K+2^B,2^B),$$

where the function "fpr" uses a first parameter as a seed to be a pseudo-random value modulo second parameter. Generator 400 outputs the value of function, fpr.

This first form of pseudo-randomness is adjustable for less randomness by applying pseudo-randomness at larger bit-aligned block boundaries, implemented by increasing the value of α, 0≦α, thereby reducing the number of seed-bits (i+n−α). Thus, α is an additional fixed parameter of a memory design as the number of bits of address 10 left of field B's left boundary not of seed (i+n−α) as first parameter to function fpr and input to generator 400.

In another form of the embodiment of FIG. 11, adder 402 is a simple bit-by-bit B-bit wide partial adder (B 2-way XORs) which is most random for pagelet size. In this case, bank select value, $V_{BS-2}$, is expressed as:

$$V_{BS-2} = \mathrm{mod}(\mathrm{mod}(\mathrm{mod}([A]-F+2^A,2^A),Q)+fpr([B],[(i+n-\alpha)],2^B)\cdot(S+2^B)+K+2^B,2^B),$$

where the function, "fpr", is a one-for-one pseudo-random translation of the first parameter values, modulo third parameter, using the second parameter as a seed. In this case, the value of function fpr represents the output of partial adder 402 where generator 400 and its input and output are the same for both cases.

This second form of pseudo-randomness performs equally well for all values of S because the pseudo-randomness of the design is at the abbreviated interleave level. Since the input to multiplier 26 from adder 402 is already thus affected pseudo-randomly, the biased input to multiplier 26 can be any constant value independent of S. Consequently, the value of parameter S and the value of any biased input to multiplier 26 can be unrelated as is not true for the first form of pseudo-randomness where the bias must be S. In such a case as the second form, multiplier 26 can be biased by +1 instead of S and can be implemented as B wires connecting B input bits to B output bits.

Figure 12:
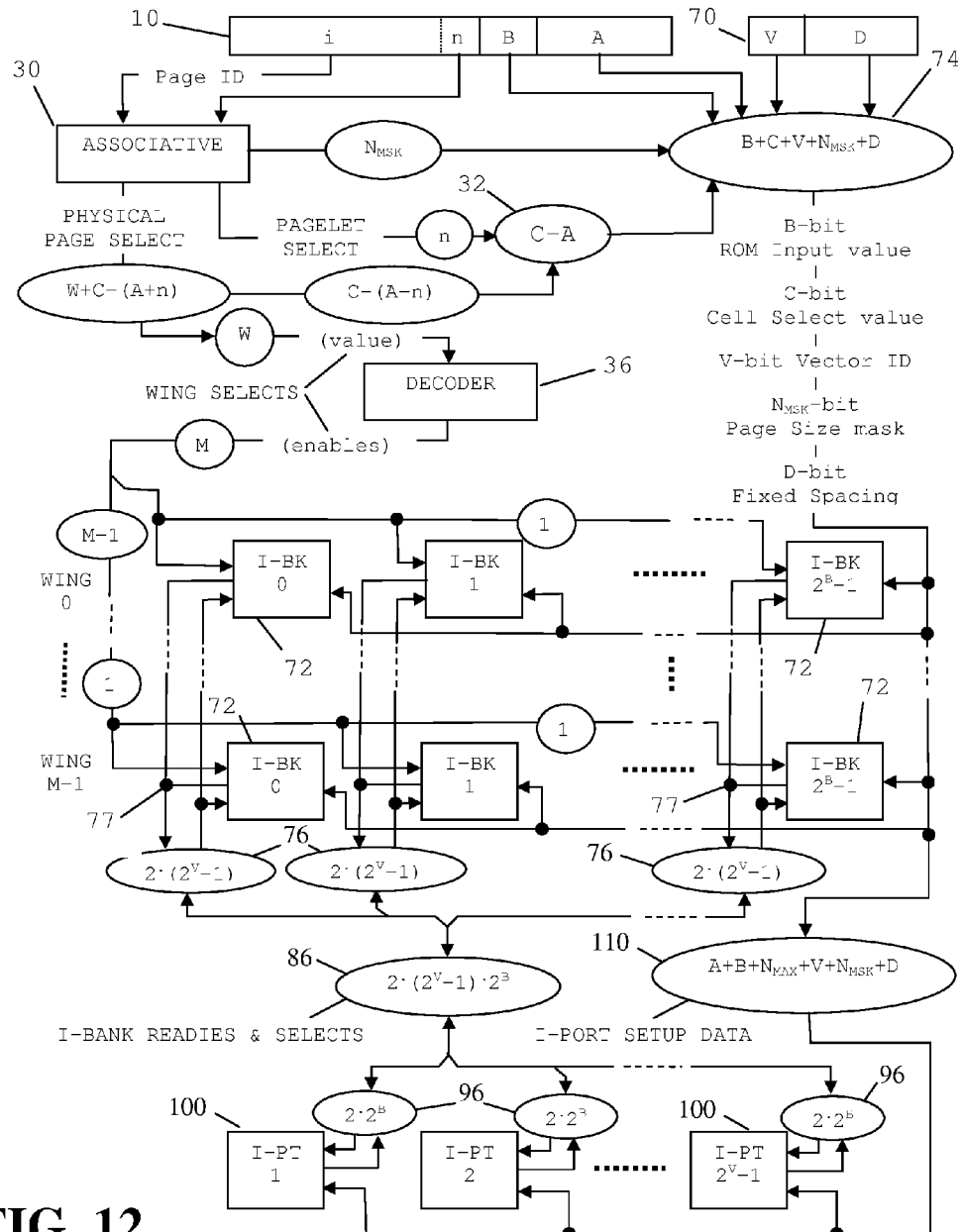
FIG. 12 is a diagram, as in FIGS. 1 and 2, illustrating apparatus for vector processing according to another modification of the present invention.
Figure 13:
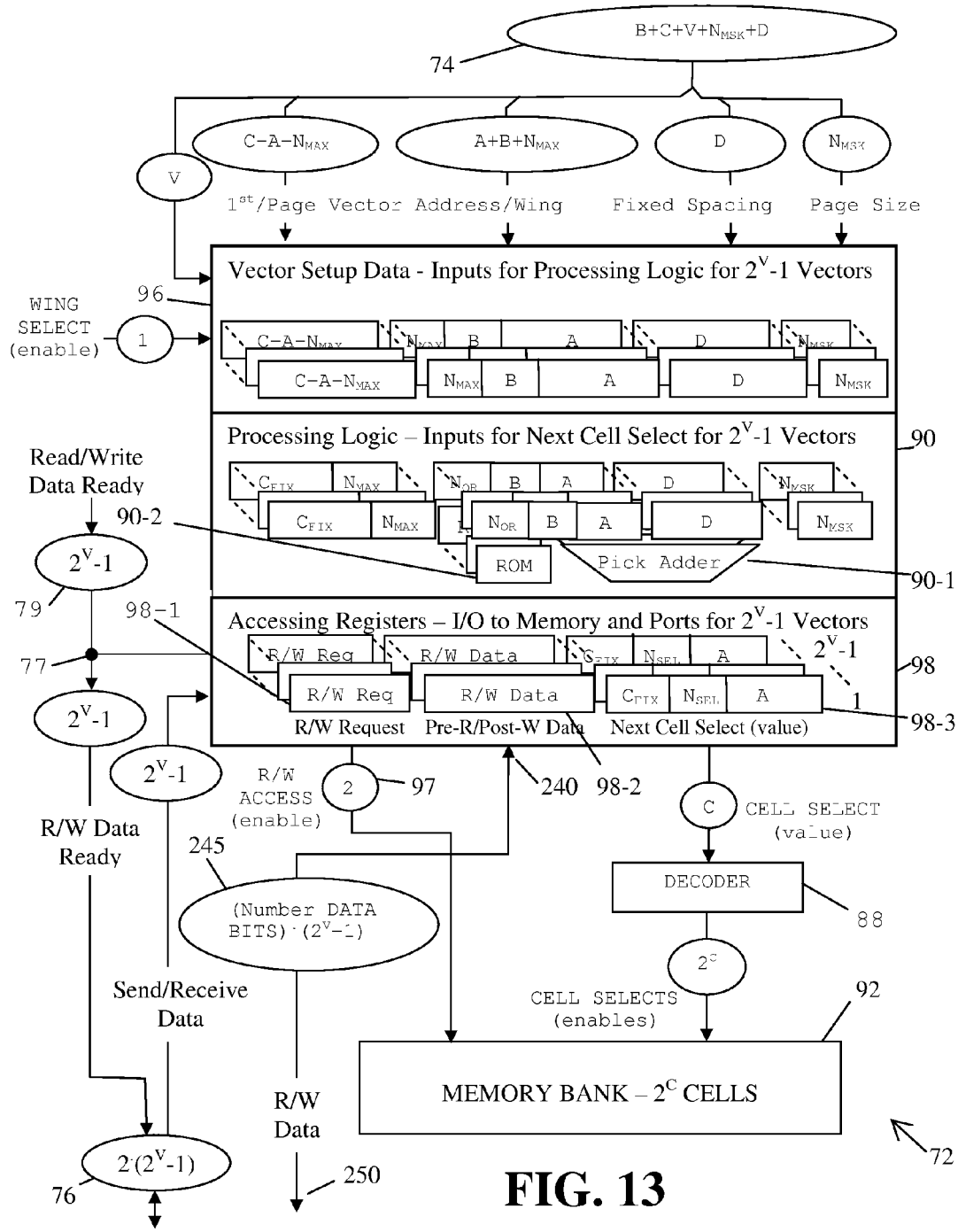
FIG. 13 is a diagram of an intelligent memory bank according to a second embodiment of the present invention.
Figure 14:
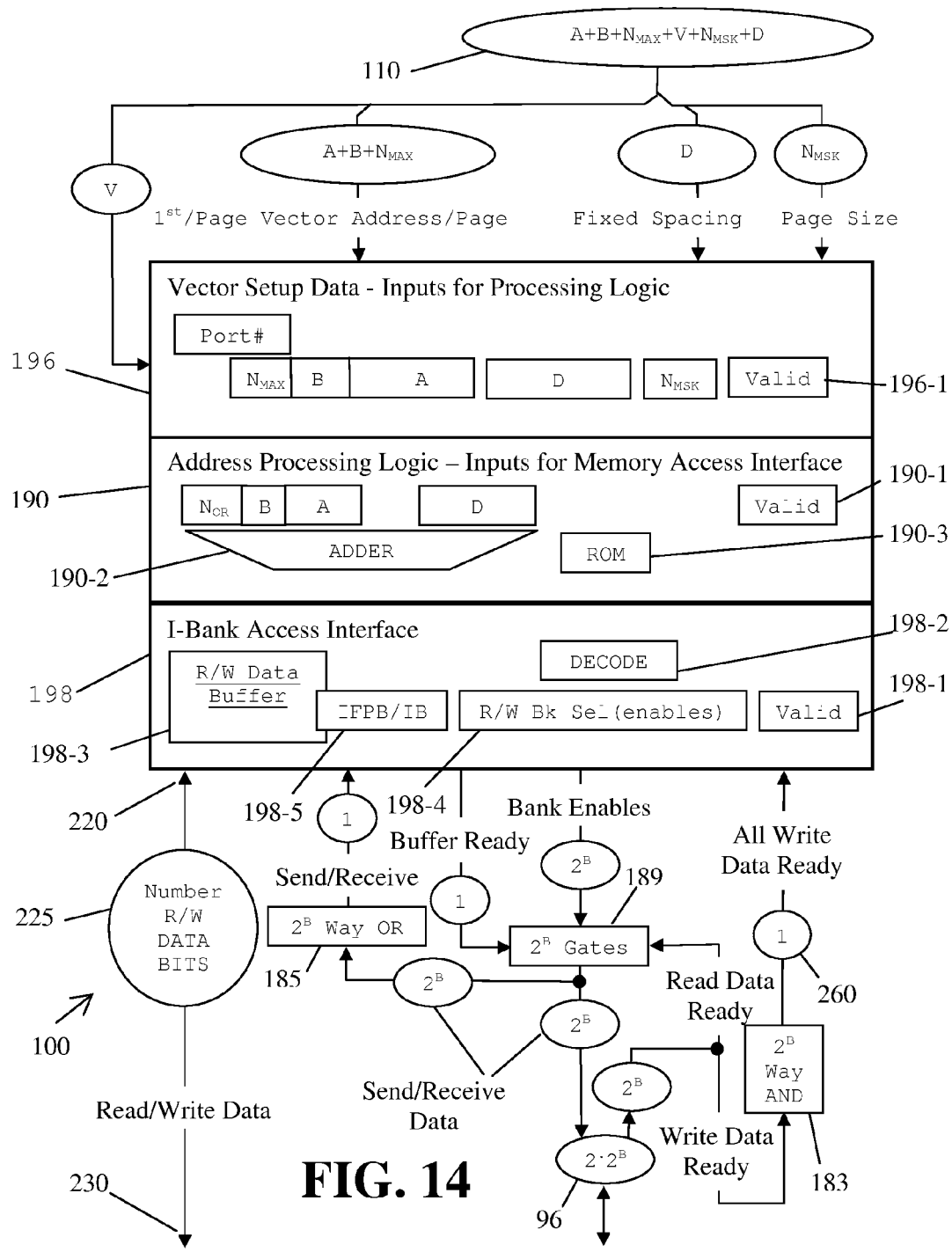
FIG. 14-16 are diagrams of an intelligent port and read and write logic useful with an intelligent memory bank according to FIG. 13.

FIGS. 12-16 illustrate an embodiment of the invention employing novel intelligent memory banks (I-banks) according to another embodiment of the invention. In particular, FIG. 12 illustrates the I-banks of a wing (or $2^\Omega$ wings if also according to the embodiments of FIGS. 9 and/or 10) and accompanying I-ports that operate respective I-banks of all wings. There are $2^B$ I-banks for each wing and there are up to $2^V-1$ I-ports for all wings. FIG. 13 illustrates details of one I-bank 72 and FIG. 14 illustrates details of one I-port 100. This embodiment will be described for a memory having M complete interleaves where Ω is not used or Ω=0, although the principles can be extended to a memory where Ω>0.

As shown in FIG. 12, each wing 0, 1, . . . , M−1 contains $2^B$ I-banks 72, each I-bank (FIG. 13) containing a memory bank 92 of $2^C$ cells for general purpose data including some vector data as in a general purpose computer. In conjunction with a data stream's initial virtual address value that is of all fields of virtual address 10, vector setup 70 (FIG. 12) provides a V-bit vector identification and a D-bit fixed spacing value. The V-bit vector identification differentiates no setup of any addressing ([V]=0) and some setup ([V]≠0) for addressing of all different normally needed accesses of memory (data cache line loads and stores, instruction cache line fetches, system state package exchanges, searches of the memory portion of the table of virtual to physical page mappings by associative 30, system input/output to shared memory or permanent storage, etc.). These accesses enable function and performance as those of multiple vectors, each vector concurrently accessing memory being a different single stream of memory data. Consequently, plural different streams can be concurrently streamed based on each being of some different non-zero identification. Each non-zero identification value indicates read from or write to memory as of a particular I-port [V] so dedicated, just this from actual non-zero value of setup 70 [V]. Each such identification value being any non-zero value indicates an initial address from address 10 for accessing the initial data accessed of the page found by associative 30 for the initial address and indicates the fixed value of addressing separations (absolute value) and directions (sign) from setup 70 [D] for all data accessed of the one page found by associative 30 for the initial address 10. Thus, each indication, [V]≠0, is for accessing only the one found page as for either reading or writing the page's data beginning at the initial address, proceeding, by other means to be explained, to any additional addresses separated next from former by signed value [D], and stopping, by means to be explained, just before accessing data of another page.

The field values of address 10 and setup 70 defining memory addressing as that of streaming data are sent thusly for only the initial access of each page of data for each of up to $2^V-1$ vectors possibly actively accessing memory at one time. All field values are re-sent with the appropriately updated address value through address 10, associative 30 and setup 70 for each initial access of each next page of each vector. Each time field values are sent, an indication, [New] as of setup 70, is also sent that either the same vector is being continued or a new vector is started. If the fields in address 10 and setup 70 represent a resending for the same vector, any currently active addressing values in a row of processing logic 90 (FIG. 13) and beyond, and in a port of processing logic 190 (FIG. 14) and beyond, are preserved active until reaching a page boundary and thus causing that of the resending for the next stream for the next page to become active in processing logic 90 and 190. The addressing values waiting to be processed for the next page of data wait in a bank's row of setup data 96 (FIG. 13) and port's setup data 196 (FIG. 14). The delayed addressing values move into the respective I-bank's row of processing logic 90 and beyond, and respective I-port's processing logic 190 and beyond when the address values of the prior stream reach their page boundary and stop their processing for accesses of memory bank 92. A carry-out of adder 90-1 and 190-2 indicates that a row of processing logic 90 and logic 190 has reached a page boundary while processing addressing values for next bank select 198-4 (FIG. 14) and next cell select 98-3 (FIG. 13) values. The adder carry-outs cause the fresh stream waiting in a row of setup data 96 and setup data 196 to respectively replace the exhausted stream in the row of logic 90 and logic 190.

Indication of a new vector via setup 70 causes any currently active stream or streams in setup data 96, logic 90 and beyond and in setup data 196, logic 190 and beyond to be stopped, controls reset, and any unused read data thereof, effectively discarded. If any write data to be stored in memory 92 is not yet stored, read/write request 98-1, read/write data 98-2 and next cell select 98-3 for the respective bank is not cleared, and is allowed to complete its store operation into the respective memory 92. Thus, any new vector's initial stream does not wait but begins immediately.

A length specification for a vector is not required by logic 90 nor by logic 190. All of a page of data can be accessed upon commencing addressing processing by logic 90 and logic 190 by writing data into, or there being room in, read/write buffer 198-3 (FIG. 14). Each successful resending of a setup for streaming a page of data for the same vector, a setup through address 10 and setup 70, means the next page is in physical memory and the mapping entry is found and held by associative 30. An early successful resending to have the next stream waiting in setup data 96 and 196 is useful to keep data streams moving when crossing page boundaries. It is also useful to write data streams to avoid costly protecting against too much write data produced needing unavailable pages.

This embodiment of the invention allows an implementation of associative 30 to search memory to find a mapping entry while multiple vectors (even the vector causing the search) continue their accessing of memory at full rate. Each newly-started read data vector, such as each search of memory by associative 30, may endure a short initial period before full data rates are sustained.

Some very short vector operations will not need any resending through address 10 and setup 70. Data of a cache line will never cross a page boundary, and if the initial address 10 value gets mapped by associative 30, it can complete.

Each sending and each resending of vector setup 70 occurs for each non-zero value in field V of setup 70. As shown in FIG. 12, each non-zero occurrence is combined with the (A+B)-bit ROM input address from address 10, the (C−A)-bit value from associative 30 via concatenator 32, and an $N_{MSK}$-bit page size value also from associative 30 for input to and use by one, that selected by [V], intelligent port (I-port) 100 (FIG. 14), and each intelligent bank 72 (FIG. 13). All I-banks of both selected and not selected wings of banks use each sending of a setup, including the $2^B$−1 banks of the selected wing not initially accessed by the address value through address 10 and including all the banks of all wings not selected. Each I-bank of the selected wing prepares next cell select 98-3 for accessing memory bank 92 for port [V]'s upcoming use of the bank. If port [V] is a read data port, then each I-bank proceeds to pre-read the next data into read/write data 98-2, updating next cell select 98-3 to that of the next pre-read. Each I-bank of each not selected wing does the same as the corresponding I-bank of the selected wing, shadowing every step except not actually accessing memory bank 92 and not getting in the way of any actual accessing for another I-port. Thus each I-bank of both selected and not selected wings awaits read/write request 98-1, supplying pre-read read data, catching post-write data, or shadowing such supplying or catching. Thus, as shown at bubble 74 in FIGS. 12 and 13, all I-banks as for an actual (not shadowed) page of vector data (as resides in some single wing where Ω=0 or in $2^Ω$ wings where Ω>0) receive the B-bit ROM input value, C-bit cell select value from which the A-bit input (lowest order A bits of C-bit cell select) and the maximum sized (number of bits) pagelet select for the largest page size (lowest order $N_{MAX}$ bits of the (C−A)-bit concatenator 32), a V-bit vector and I-port 100 identification, an $N_{MSK}$-bit page size mask value for masking bits of the $N_{MSK}$-bits for smaller pagelets found by associative 30 and a D-bit signed fixed spacing value. Thus, a non-zero V-bit vector identification selects one of up to $2^V$−1 vector ports, or I-ports, 100 shown in FIG. 12. FIG. 14 shows an I-port 100 in greater detail. As shown by bubble 110, the selected I-port receives much of the same setup information that an I-bank receives via bubble 74.

To access read or write vector data in memory, an updated vector address is resent through address 10 for each regular, as well as each return from interrupt, initial data address of a page. Corresponding vector identification and offset or fixed spacing value through setup 70 arises when each active vector's I-port 100 and the port's part of all I-banks of the current page have successively updated addresses in logic 90 and 190 ($N_{OR}$,B,A in logic 190 (FIG. 14) and $N_{OR}$,B,A in logic 90 (FIG. 13)) for successive accesses of memory data about to cross a page boundary (indicated by a carry out of adder 190-2 in FIG. 14 and pick adder 90-1 in FIG. 13).

With each page boundary crossing, both the port and the banks of the next page preferably have already received a continuation setup from address 10 and setup 70. The continuation setup is updated to first access of the next page with updated address and page size mask and same offset and identification. If the port and banks have not received continuation setup information into vector setup data 96 and 196 (FIGS. 13 and 14), data flow pauses to wait for a setup.

The first setup information of a vector to arrive via bubble 110 at vector setup data 196 in FIG. 14 has a value [V] equal to [Port#] to select the one I-port 100 having matching [Port#] in setup 196. A bit (not-shown) bubble 110 indicates whether or not the vector is a new vector. [V] being equal to [Port#], whether new vector or not, causes correspondingly numbered bits of bubble 110 to latch into $N_{MAX}$,B,A,D,$N_{MSK}$ blocks of setup data 196 and causes a Valid bit 196-1 to set.

Setting valid bit 196-1 for a new vector directly and immediately resets valid bits 190-1 and 198-1, and clears or resets a count of in-flight plus in-buffer read data or one write data in buffer, IFPB/IB 198-5, and read/write data buffer 198-3. A cleared or resetting valid bit 190-1 or a carry-out of adder 190-2 causes values of setup data 196 to latch into corresponding positions in address processing logic 190, causes valid bit 196-1 to be cleared (unless it is again being set by a subsequent [V] input equal to the [Port#] in setup 196), and causes $N_{MAX}$,$N_{MSK}$ in setup 196 to latch into $N_{OR}$ in logic 190 with there being a bit by bit logical OR of the two fields into the one field, the mask value in $N_{MSK}$ 196 forcing any upper bits of $N_{OR}$ not addressing pagelets within the current page be carry enables to adder 190-2. All this occurs on the next address clock cycle from when valid bit 190-1 was cleared or was resetting or when there was a carry out of adder 190-2.

When $N_{OR}$,B,A in logic 190 is not being inputted from vector setup data 196, it can be inputted by the output of adder 190-2. If $N_{OR}$,B,A are not input from setup 196 or adder 190-2, it remains unchanged. Adder 190-2 has the same number of bits as $N_{OR}$,B,A in logic 190 and it adds [$N_{OR}$,B,A] and a right justified [D] to produce the same number of bits of sum and a carry-out bit. D is always less than A+B because [D] can be no larger than G/(one less than the number of banks interleaved), G/(Q−1), where Q is predetermined and G is a derived parameter of the interleave. Also, [D] cannot have any non-unitary factor equal any non-unitary factor of Q. A cleared valid bit 198-1 or a send/receive enable from OR gate 185 causes the bank selects decoded by the decoder 198-2 from ROM 190-3 for the valid in B,A in logic 190 to be latched in read/write bank selects (enables) 198-4 and a valid bit 198-1 be latched. One of $2^B$ send/receive data signals from gates 189 causes a send/receive enable from OR gate 185. Gates 189 outputs a single logical "1" using a single valid bank-enable of the $2^B$ bank enables from that also singular and valid in the read/write bank select in logic 198. Gates 189 also supply the valid $2^B$ send/receive data signals to the I-banks 72 via arrow downward through bubble 96. As only for read data ports and only when all of the $2^B$ banks of the wing selected for a particular read data port provide read data ready indications for that port will gates 189 of a read port produce its single logical "1" output signaling a single I-bank of the selected wing to send read data. The $2^B$ lines shown, read data ready, inputting into gates 198 do not exist for FIG. 14 being a write data port, but do exist as lines shown, write data ready, inputting into also conditionally existing AND gate 183 for FIG. 14 being a write data port. There are $2^V$−1 read/write-data-ready signals respective of $2^V$−1 ports from the accessing registers 98 (FIG. 13) of each same-bank 72 (FIG. 12) of M wings inputted into $2^V$−1 respective wires 77, one wire per port. Some wires 77 are for read data ports and the remainder for write data ports. Thus, of the M·($2^V$−1)·$2^B$ read/write data ready signals from all banks, all wings, they divide, $2^V$−1 signals per M banks, $2^B$ signals per port. Only one bank of M or each of $2^B$ banks of a wing can signal read/write data ready as not-ready on a wire 77, a single signal per bank of the wing selected for a port when processing a vector's addresses (valid bit 190-1 of port set). Thus, all of the $M \cdot (2^V-1) \cdot 2^B$ read/write data ready signals from all banks, of all wings not selected by an actively vector-processing port, signal ready not as data-ready but as an enable to respective wires 77. Thus, gates 189 and AND gate 183 are inputted from paths 76 (FIGS. 12 and 13), 86 (FIG. 12) and 96 (FIGS. 12 and 14) from each I-bank 72 of all memory.

Gates 189 only outputs its lone one-bank-selecting output when a buffer ready from access interface 198 signals buffer ready because the count in IFPB/IB 198-5 shows either room in read/write data buffer 198-3 for another read data being put in-flight or that a single cycle of write data is present in buffer 198-3. The IFPB/IB counts up with each send/receive from OR 185 for read data and counts down with each send/receive for write data. That producing write-data into buffer 198-3 increments the count in IFPB/IB 198-5 by one with each write data put into buffer 198-3. That using read data decrements the count in IFPB/IB by one with each read data taken from buffer 198-3. Each send/receive from OR 185 updates enables selecting next bank in read/write bank select 198-4 and valid bit 198-1 and that in $N_{OR}$,B,A in logic 190. Each send/receive also updates the status in D in logic 190 and valid bits 190-1 and 196-1 if there is a carry from adder 190-2. The next updated value into $N_{OR}$,B,A in logic 190 is from adder 190-2 if no carry from the adder 190-2. The next update is from a valid $N_{OR}$, B,A in setup 196 if a carry from adder 190-2, even if not immediately because valid bit 196-1 is clear (in which case valid bit 190-1 clears until set again after valid bit 196-1 sets again with the awaited setup from address 10, associative 30 and setup 70).

Using all the information in bubble 74 from address 10 and setup 70, the I-banks 72 of memory are setup for streaming a page of vector data at the same time and for the same vector stream as an I-port 100. All I-banks 72 respond to a new-vector indicator as in bubble 74 in much the same way as does the I-port 100 selected by [V] in bubble 74. The new-vector indicator, as with setup arriving in vector setup data 96, sets and clears in one cycle so that in every I-bank of all memory for the selected I-port, timing chains are reset for arriving read data, valid latches are cleared for processing addresses in logic as are two valid bits for next cell select 98-3 and for read/write data 98-2 to hold pre-read read data. Where the new vector is for write data, all clears and resets the same as for read data except write data received in read/write data 98-2 by any I-bank of all memory as for the I-port with new-vector indicated and its next cell select 98-3 are not cleared but the data are stored to memory 92 as addressed. Each I-bank of all memory as for other I-ports not selected by the [V] indicated new-vector are not cleared and reset nor directly affected.

The I-banks of the selected wing latch the setup information and a valid bit in the selected I-port's row of latches in setup 96 just as does setup 196. The setup in setup 96 either waits or does not wait to move into processing of addresses in logic 90 just as setup 196 waits or not to begin processing in processing logic 190. The timing is for the same reason. An I-bank either checks or skips checking all addresses to find just its own next cell selects, its own never being more frequent than every $Q \cdot [D]$th address. An I-port, on the other hand, processes an I-bank select for every data address of a vector, namely every [D]th address. Also, the processing of addresses to find the I-bank's next cell select can be different for read data I-ports than for I-ports for write data. I-banks as for write data ports need only search for the next cell select, searching every [D]th address. Yet, write data next cell selects may and read data next cell selects must be searched for faster by skipping checking more than [D]−1 addresses per check by presenting an address to ROM 90-2's inputs and detecting its single bit output for address of bank or not. That added by adder 90-1 to cell address within page, processing logic 90 [$N_{OR}$,B,A], must be a multiple of processing logic 90 [D]. Thus the pick adder adds picked bit-order products of [D] to successively cell address sums for checking. More than x1 picks are done only after each cell address found to be of the bank. Multiple adders or a multiply pyramid would be faster, but so fast is not necessary and may not be preferred in a crowed logic space. So, both read and write data ports require only one adder per port.

Whether for reading or writing data, the next address for the next cell select of a bank as for a port is known only by the output of a ROM 90-2 with a single bit per address value, [B,A]. ROM 90-2 is similar to ROM 14 (FIG. 1), except that it does not output B-bit bank selects for all banks of the interleave. Instead, ROM 90-2 outputs a single bit set to a "1" only for those addresses selecting the respective I-bank. ROMs 90 are the same for the same respective I-banks of each wing, but different between different I-banks of a wing.

The data addresses of a vector are every [D]th address starting with the initial address setup from address 10. To search every data address for those producing a "1" from an I-bank's ROM 90-2 takes only one adder 90-1 per port or row of logic 90 logic. A faster search searches every [D]th data address except those after each producing a "1" then again searching every [D]th address. The exception being some multiple of [D] from $2 \cdot [D]$ up to the lesser of two upper limits. $Q \cdot [D]$ data addresses is one limit for that added after each add producing a "1". For sake of simplicity of description, [D] is assumed to be positive. Those skilled in the art will recognize that the technique described herein can be applied to both positive and negative [D], such as by using no carry for negative [D] to detect address adder overflow. The multiple of [D] added ought not be more than Q, nor cause (multiple)'[D] to be no more than $\mathrm{trunc}((2^B-Q)/|S|) \cdot 2^A+R+\mathrm{if}(\mathrm{mod}(R,2)=1,$
$\mathrm{mod}(2^B/S),|S|-\mathrm{mod}(2^B/|S|))$.

Otherwise, a data address producing a "1" from ROM 90 might be skipped.

A fast search for all addresses separated by [D] producing a "1" from ROM 90-2 uses an adder for each "1" bit of a value from 2 to Q to pick and add the different left shifts of [D], the adds forming the product, (value)·[D] and adding them to the data address which last produced a "1" from ROM 90. Each [D]th data address following those checked and not producing a "1" are still checked through ROM 90-2). It should be remembered that D also has a limit for 100% efficiency distribution among banks. To be assured that Q data addresses of a fixed separation, [D], are distributed among Q banks, |[D]| must be no more than G/(Q−1). If the bit pick add functions are performed one per address cycle, only one adder 90-1 is needed for each row of logic of logic 90 for each read (and write) port. As explained, the picks do at least one x1-pick and do at least one x1 last after doing all others.

For each row of logic 90, for any write data port, there is a valid bit (not shown) similar to valid bit 190-1. The valid bit in logic 90 validates addresses $N_{OR}$,B,A for both those searched not found and found to be for the I-bank by ROM 90-2. The search is halted as $C_{FIX}$,$N_{MAX}$(upper masked bits), $N_{OR}$(lower masked bits) and A are found by ROM 90-2 next to be inputted after any next cell select already to $C_{FIX}$,$N_{SEL}$ and A of accessing registers 98 along with a valid bit for just $C_{FIX}$,$N_{SEL}$ and A for the next cell select for the port of the row of accessing registers 98. For write data, the cell select waits for write data to show up in data 98-2 as indicated by request 98-1 being set by the write data I-port with a send/receive data signal via bubbles 96, 86 and 76. Once set, request 98-1 holds itself and the write data in data 98-2 set until cleared by the write of the data into memory 92 as scheduled at the convenience of each I-bank, post-writes. Bank busy logic (not shown) measures the bank cycle time in address cycles since the last access of the I-bank's only memory bank 92 by any I-port. Access priority logic (not shown) chooses among request 98-1 of all write data I-ports and among all needs (cell select 98-3 valid and NOT read data valid, hereinafter described) to access memory 92 for read data which of those currently needing to access memory bank 92 to do next. When the request 98-1 of the waiting write data 98-2 has the top priority, request 98-1 being set and bank busy logic shows memory 92 is not busy, a write access latch is set with the clearing of the top priority request 98-1. Write access clears after one cycle of being set, clearing after the clearing of request 98-1. The write access latch sends write access 97 to memory bank 92, selects data 98-2 to memory bank 92, and causes the next cell select from logic 90 to be inputted into $C_{FIX},N_{SEL},A$ in accessing registers 98. A following valid as inputted from logic 90's valid bit is applied to accessing registers 98 if logic 90 has already found the next address with a "1" in ROM 90-1 (and thus selecting the I-bank's memory 92), and all waiting for any (none if end of vector) setup to setup data 96 if logic 90 has no set valid bit after having reached a page boundary as indicated by carry from adder 90-1 while searching for next address in ROM 90-2.

For accessing read data, I-banks function much the same way as for accessing write data through having a valid next cell select in $C_{FIX},N_{SEL},A$ in accessing registers 98. The access priority logic used by all needing access to memory 92 sees the read data need because the valid bit for next cell address 98-3 is set and the valid bit for read data 98-2 is clear. If access priority gives priority to the read data need and the bank busy logic indicates memory 92 is recovered from the last access, then shortly if not immediately the data valid latches (signaling read data ready through wire 77 to the I-port for the I-bank) and holds itself set and the read access latch sets for only one address cycle starting a pulse down a timing chain. The read access latch sends a read access 97 to memory bank 92 with the $[C_{FIX},N_{SEL},A]$ already in next cell select 98-3. On the next cycle, cell select 98-3 is updated to next with a renewed $[C_{FIX},N_{SEL},A]$ and its valid latch is updated in the same manner as for write data. This releases processing logic 90 with ROM and adder to search for next cell address value. At an appropriate point in the timing chain started by access priority pulsing read access, the pulse latches the read data latch which signals read data ready via wire 77 back to the I-port via bubbles 76, 86 and 96, signaling data ready early of data arriving at data 98-2 from memory 92. Consequently and preferably, any waiting of the I-port meets the read data arriving from memory bank 92 at data 98-2 with a send/receive data back through bubbles 96, 86 and 76. The last pulse of the timing chain updates data 98-2 to latch the read data from memory 92.

FIG. 12 shows all I-banks 72 of a memory and all I-ports 100. Address 10, associative 30, bubble 32, decoder 36 for wing selects, and the M wings of $2^B$ banks per wing are as in FIG. 1 except the banks 12 are I-banks 72. For FIG. 12, address 10 always presents its fields along with vector setup 70 presenting its fields, they present together always. A new set of values in the fields of address 10 and setup 70 can be presented each address cycle. All that in bubble 74 is for the same address cycle of values. That from decoder 36 and bubbles 74 and 110 presented to all I-banks 72 and to all I-ports 100 is of the same address cycle. Fields A and B from address 10 FIG. 12 to bubble 74 are as the A and B fields from address 10 FIG. 1 to ROM 14 FIG. 1. That from bubble 32 FIG. 12 to bubble 74 is as that from bubble 32 FIG. 1 to bubble 34 FIG. 1.

The $N_{MSX}$-bit value from associative 30 FIG. 12 is an indication of the page size found by associative 30 for that in address 10. $N_{MSK}$ from associative 30 has the same number of bits as n for the largest page size. $[N_{MSK}]$ is a mask differentiating upper $N_{MSK}$-n bits from lower n bits for the page size currently mapping the address in address 10. $N_{MAX}$ in bubble 110 also has the same number of bits as n for the largest page, and $[N_{MAX}]$ is the value of the lowest order same number of bits of that in bubble 32. Fields V and D, setup 70, are respective vector identification and fixed spacing for vector data. All in bubble 74 arrives at all I-banks 72 along with the wing select (enables) from decoder 36 and all in bubble 110 arriving at all I-ports 100. These signals (bubble 74, wing selects and bubble 110) are all for the same address cycle of values in address 10 and setup 70.

An address cycle of information from address 10 and setup 70 is indicated by $[V]\neq 0$, and an address cycle of no information is indicated by $[V]=0$. Associative 30 only responds to [i] and [n] in address 10 when $[V]\neq 0$. Also, every wing of I-banks responds to all that in bubble 74 when $[V]\neq 0$, but all wings but one shadow the one selected by wing select (enables) from decoder 36, the one wing of I-banks actually accessing memory and the I-banks of other, not selected, wings shadowing selection (but not actually selecting accesses) to keep their respective places in the vector for making actual accesses if selected for a following page. Additionally, the one of the I-ports whose number matches [V] responds to all that in bubble 110 when $[V]\neq 0$.

All that on FIG. 12 below address 10 and setup can respond to successive address cycles of certain (not all) different information in address 10 and setup 70 for either the same [V] or for different [V] all $[V]\neq 0$. Each address cycle of $[V]\neq 0$, is a different vector or data stream setup for accessing data in memory in a single page. Ignoring page faults, which are not part of the present invention, all addresses are assumed to be found and mapped by associative 30. Thus, a vector accessing data in a number of pages must have an equal number of setups sent through address 10 and setup 70 (and associative 30), each page being mapped once and no additional information coming from address 10 and setup 70. Thus, that needed from setup for all accesses of a page must be retained in the I-banks and/or the I-port.

The one I-port of a vector, vector [V], retains information for making successive bank selects for accessing successive data of a fixed spacing. The retained information allows an I-port 100 to choose and send one of $2^B$ bank selects into bubble 96 for each access of memory of a vector. Each bank select presents itself through bubbles 96, 86 and 76 to M I-banks of M wings, all the same bank number. The $2^B$ I-banks of both the wing selected and those not selected at setup retain information for making or shadowing successive cell selects, each of the M·$2^B$ I-banks producing only those cell selects it needs to access or shadow access its part of memory, its memory bank 92 (FIG. 13). Thus, the $2^B$ I-banks of the wings not selected at setup also retain the same information for making successive cell selects, without actually accessing data, yet keeping their relative places in the vector, knowing where to come in and begin actually accessing data if another wing is selected at setup for a following page of data.

Each I-port accesses memory either for read data from memory or to write data to memory. Each I-port is described as either being a read data port or a write data port although all I-ports share the same drawings and thus many similarities. If $2^V-1$ different vectors are accessing memory with each its own valid fixed separation not too large and prime to Q as was explained, all the I-ports will be in use and they can generate bank selects one at a time from each I-port. Collectively, the I-ports generate $2^V-1$ bank selects at a time to memory without regard to any number selecting the same I-bank at the same time. I-ports can select a bank and send it data on demand, namely as fast or as slow as that producing or consuming memory data via the I-port are able to go, from stopped to an access per address cycle or any rate between, starting and stopping any time. This access on demand may not occur until after an initial period following the first setup of the first page of a vector.

Each I-bank outputs $2^V-1$ either read or write data readies, one for each I-port, according to the I-port data type, read or write, and according to being selected if a read port. The M I-banks 72 of the same bank number of M wings output all their data readies for the same I-port into a single wire AND 77. Only the $2^B$ I-banks of the wing currently selected for a read I-port can produce $2^B$ "not-ready" signals on the $2^B$ wires 77 of the port, producing a signal a wire a selected bank. Whereas, all M·$2^B$ I-banks, selected or not, produce M·$2^B$ "not-ready" signals on the $2^B$ wires 77 of the port, producing M signals a wire each M banks selected or not but only after setting up and before beginning a "new" vector in the port. Thus, not-ready from bubble 260 signals when left-over not-yet-stored write data remains from the last vector to use a write port now wanting to begin a new vector. Thus, the $2^B$ data readies input to a particular read port are per bank as for the read port of the wing selected for the port whereas data ready input to that producing write data for a particular port is for all memory as for the write port. The $2^B$ read/write data readies shown inputting into each I-port are those of the $2^B$ wires 77 for that port. Read/Write data readies shown from I-banks to wire AND 77 exist for both read and write ports. Yet, the $2^B$ readies shown entering I-ports from bubble exist differently within read ports versus existence within write ports. The read ports have $2^B$ data readies inputting gates 189 (FIG. 14), but write ports do not although gates 189 functions otherwise the same. Whereas, the write ports have $2^B$ data readies inputting AND gate 183 (FIG. 14), but read ports do not. AND gate 183 and bubble 260 not exist within a read port. I-ports for read data do not send send/receive data signals to an I-bank if it is signaling that its read data is not ready. I-banks of unselected wings shadowing a read data port's progress do not signal read-data not-ready to that I-port until not shadowing as currently selected to access memory. Whereas, I-ports for write data supply the output from AND gate 183, that from bubble 260, to that which produces write data for input to read/write data buffer 198-3 so production of write data does not begin for a newly setup write data vector until after all write data of the previous write data vector of the write port is stored into a memory bank 92.

With reference to FIG. 14, an I-port 100 has three areas of logic with latches in a single row. Each address cycle of setup information from bubble 110 enters the vector setup data 196 and latches into the row of latches to be held there for one or more address cycles. Each row contains the same total number of bits as in bubble 110. A new vector bit (not shown) in setup 196 indicates whether or not the information reflects a new vector. The Port# represents a logical bias (or address) of the particular I-port 100, one of from 1 to $2^V-1$. The value of [V] represents the number of input to setup 196, with the value of [V]=1, 2, ... $2^V-1$ identifying one [port#] and the value of [V]=0 meaning there is no valid setup data. Values of fields $N_{MAX}$,B,A,D,$N_{MSK}$ of bubble 110 are input into corresponding latches of vector setup data 196. The outputs of all latches of vector setup data 196 except the new Vector bit are input into the $N_{OR}$,B,A,D latches of address processing logic 190. The information for latches B,A,D are transferred as is as to field name. The input for the [$N_{OR}$] is the bit by bit logical OR of [$N_{MAX}$] and [$N_{MSK}$] with any resulting lower bit values of $N_{OR}$ being those of $N_{MAX}$ and any upper bit values being enables to adder 190. [$N_{MSK}$] reflects the page size being accessed, the bits of $N_{MAX}$ masking to adder 190-2 enables for paging. Adder 190-2 supplies an input to latches $N_{OR}$,B,A in logic 190, there being a select between the two inputs to the $N_{OR}$,B,A latches. Adder 190-2 has the same bit width as its one input, $N_{OR}$,B,A. The other input to adder 190-2 is the D latch, right justified within the input with the upper most bit of D, the sign bit, extended to the left as an enable to adder 190-2 if a negative sign. Adder 190-2 outputs a highest order carry bit for control or glue-logic, a bit just higher than the highest of $N_{OR}$,B,A to complete its sum.

ROM 190-3 is similar to ROM 14 of FIG. 1 and is input from B,A. I-bank access interface 198 has latches, IFPB/IB 198-5, read/write bank select 198-4, and valid 198-1. Valid 198-1 is inputted from valid 190-1. The $2^B$ bits of bank select 198-4 is inputted directly from decoder 198-2, which is inputted from ROM 190-3. The multiple bits of a read data port's in-flight-plus-buffer 198-1 count or the one bit of a write data port's in-buffer 198-1 count of 0 or 1, latch IFPG/IB 198-5 is inputted from itself as incremented, decremented, or unchanged from logic. IFPB/IB 198-5, together with a buffer readiness feature in interface 198 identifies buffer fullness or readiness to either receive more read data from an I-bank or send another write data to an I-bank. Buffer readiness may be a single bit indicating either data buffer's 198-3 readiness to send write data or receive read data, a count in IFPB/IB 198-5 either being less than some multiple amount filling data buffer 198-3 with read data, count being less indicating readiness for more read data, or being equal to "1" indicating readiness to receive data (thus indicating that data may be immediately sent for writing). Data buffer 198-3 either is inputted from bubble 225 according to arrow 220 with read data from one of the I-banks 72 (FIG. 13) via bubble 245, arrow 250, bubbles 280 (FIG. 15) and bubble 225 or is inputted from that producing write data within interface 198. Interface 198 as write data producer increments IFPB/IB 198-5 on the same address cycle that it puts each write data into data buffer 198-3, producing write data at any rate from stopped to one per address cycle, as driven by the computer processor (not shown). Data buffer 198-3 outputs write data to bubble 225 according to arrow 230 with write data flowing to an I-bank 72 via bubble 225, bubbles 282 (FIG. 16) and bubble 245 according to arrow 240 FIG. 13. Finally, data buffer 198-3 outputs to that using read data, and decrements the count in IFPB/IB 198-5 on the same cycle it removes read data from buffer 198-3.

Bank select 198-4 outputs its $2^B$ enables to gates 189 which, either immediately or when ready, outputs $2^B$ send/receive data signals to all the I-banks 72, M I-banks per enable, via bubble 96, bubble 86 FIG. 12 and bubbles 76 FIGS. 12 and 13. The $2^B$ outputs from gates 189 also input into $2^B$-way OR 185. The single bit output of $2^B$ way OR 185 either increments the count in IFPB/IB 198-5 for each enabling of read data's sending from an I-bank 72 or decrements the count for each enabling of write data's receiving by (sending to) an I-bank.

If I-port 100 is a read data port, gates 189 is also input with $2^B$ read data ready signals from all I-banks 72, M I-banks on each read data ready bit or wire 77 of the port, all signals via bubbles 96, 86, and 76. Gates 189 perform a bit by bit combining of the $2^B$ enables from bank select 198-4 and the $2^B$ read data readies from I-banks 72. Thus, the gated bit to be sent to M I-banks is gated by the read data ready from the same M I-banks. More particularly, if a read data ready from bubble 96 indicates its selected I-bank as for the port is not-ready, then the corresponding bank enable to the M banks of the selected I-bank from bank select 198-4 can not become a send/receive data signal from gates 189. If I-port 100 is a write data port, then gates 189 for that port has no $2^B$ read/write data ready signals inputting to it and gating corresponding enables from becoming send/receive. Instead, the signal lines that are present for the write port in bubbles 96, 86, 76 are inputted to $2^B$ way AND 183 to produce a signal from bubble 260 indicating that the last write data of last write vector of the port has written its last write data from any data 89-2 (FIG. 13) of the port in any I-bank 72 of any wing of all memory into that I-bank's memory bank 92. Hence, write data for a new vector setup in setup data 96 and 196 and beyond can be produced from within interface 198 when bubble 260 indicates ready for all previous vector's write data being written to some memory bank 92. Write data for a new vector setup must not be put into data buffer 198-3 until two address cycles after the new vector's setup latches at setup data 196, and then only if bubble 260 indicates ready. A read data port needs no $2^B$ way AND 183. For both read and write data ports, all the $2^B$ enables inputting into gates 189 are gated by a single bit buffer ready from I-bank access interface 198, gated from becoming some one of $2^B$ send/receive data signals by buffer ready from interface 198 being not-ready. I-port 100 includes glue-logic that outputs a Buffer Ready [Buffer Readiness 198]*[valid 198-1]*[not New Vector 196]. In addition to the Buffer Ready, the glue logic of an I-port provides its New Vector bit which indicates whether or not the data in setup 196 is for a new vector and latch enables (herein described) for the various latches.

The timing of a send/receive data signal from gates 189 via $2^B$ way OR 185 starts Read Access Timing Chain of the port's glue-logic, timing each read access of the port. The last latch of read access is inputted to the FIFO data entry controls of data buffer 198-3 to catch the data on bubble 225 via arrow 220. Another piece of glue-logic outputs [New Vector]OR [Not Valid 196-1]OR[Not Valid 190-1]OR[[Not Valid 198-1] AND[[adder 190-2 carry bit]XOR[D 190 sign bit]]]OR[[$2^B$-way OR 185]AND[[adder 190-2 carry bit]XOR[D 190 sign bit]]], as the latch enable for $N_{MAX},B,A,D,N_{MSK}$,valid. The New Vector bit in setup 196 has no latch enable, latching every address cycle. The glue logic also outputs [Not Valid 190-1]OR[Not Valid 198-1]OR[$2^B$-way OR 185], as the latch enable for $N_{OR},B,A$. Another piece of the glue logic outputs [New Vector]OR[Not Valid 190-1]OR[[Not Valid 198-1] AND[[adder 190-2 carry bit]XOR[D 190 sign bit]]]OR[[$2^B$-way OR 185]AND[[adder 190-2 carry bit]XOR[D 190 sign bit]]], as the latch enable for D,valid. The final piece of glue logic outputs [New Vector]OR[Not Valid 198-1]OR[$2^B$-way OR 185], as the latch enable for bank select, valid. IFPB/IB 198-5 latches every address cycle, and its count is reset to zero data by the new vector bit in setup 196. Data buffer 198-3 is a FIFO buffer with its own control logic, it too being reset to 0 data by the new vector bit.

With reference to FIG. 13, an I-bank 72 has three areas of logic, each having separate logic in different rows for use by each I-port or vector, each I-port or vector being thus represented by much logic of a common appearance and use, but not all in every way because some I-ports are for read data and others are for write data. The I-banks 72 are most common in setup data 96 and is least common in accessing registers 98. With each address cycle of [V]≠0, valid setup information from bubble 74 enters vector setup data 96, fanning out to the latches of all rows but latching into just one of $2^V-1$ rows of logic as valid data or vector setup information for one vector. Each cycle that [V] is non-zero latches valid information into row [V], rows, ports and vectors being counted from one to $2^V-1$ from front to back. That shown in each row of setup data 96 has the same total number of bits as does bubble 74 only with field C further broken out into more fields, field C–A–$N_{MAX}$ being C–A–$N_{MAX}$ bits of the highest order in field C of bubble 74, field A being the A bits of lowest order in field C, and field $N_{MAX}$ being those bits of field C between the A and C–A–$N_{MAX}$ bits.

Each I-bank 72 has glue logic that forms various latches and enables herein described. Each row of vector setup data 96 contains New Vector, Valid and Wing Select latches. In like manner, each row of processing logic 90 contains Valid and Wing Select latches, as well as a Pick Timing Chain of some number of latches for a one bit wide timing chain. Each row of accessing registers 98 contains a Next Cell Select Valid and Wing Select latch, one bit each. Again in like manner, each row of data that is for read data has Read Data Ready, Read Access Valid and Shadow Read Access latches, as well as a Pre-Read Timing Chain of some number of latches for a one bit wide timing chain, the first latch of the timing chain also being a Pre-Read Access bit for a valid read access or timing chain time. Finally each row of data for write data has a Post-Write Access, Shadow Write Access and Write Data Not Ready latch, each being a single bit latch. Memory bank 92 and decoder 88 are two single items of each I-bank 72 used serially to access the memory data of the I-bank, the data in memory bank 92. Memory bank 92 and decoder 88 are accompanied by the latches of the two one-bit wide timing chains, Memory Bank Busy From Read and Memory Bank Busy From Write which are also singular and serially used.

The glue-logic includes glue for setup 96, logic 90 and accessing registers 98 that is duplicated in each row for parallel use for both read data and write data ports, glue for logic 90 and accessing registers 98 for each row for parallel use for only read data, glue for each row for parallel use for only write data and glue for both read and write data.

Each bit of the information from bubble 74 is presented to the input of the corresponding bit of each row 96, each bit fanning out to $2^V-1$ respective inputs. [V] from bubble 74 is decoded and presents a different non-zero decode to the input of each of (up to) $2^V-1$ Valid latches in setup 96, presenting decodes from 1 to $2^V-1$ to respective Valid latches from front to back row. The one bit wing select enable from decoder 36 (FIG. 12) inputs vector setup data 96 FIG. 13 and is fanned to the $2^V-1$ inputs of as many wing select latches. A single new vector bit from setup 70 (FIG. 12) via bubble 74 indicates whether or not the vector is a new vector [[New Vector]=1] AND[[V]≠0] (as opposed to a continuation setup of a continued vector [[New Vector]=0]AND[[V]≠0]) with vector's initial setup information in bubble 74. The new vector bit is fanned to same input of $2^V-1$ 2-input logical AND gates for one per row, the other input of all the rows being from a [V] decoder and representing a different non-zero decoded output, matching the row number, for [V] from bubble 74 inputs each. The $2^V-1$ outputs input the $2^V-1$ new vector latches. Each row of latches of vector setup data 96 outputs its information to the inputs of corresponding rows of latches in processing logic 90, there being rows 1 to $2^V-1$ of $C_{FIX},N_{MAX},N_{OR},B,A,D,N_{MSK}$ latches, Wing Select latch, and Valid latch.

Logic 90 includes $2^V-1$ sets of associated logic (not latches), ROM 90-2 and pick adders 90-1, each set being for each row of latches of processing logic 90, all for processing the addressing of vectors 1 to $2^V-1$ of I-ports 1 to $2^V-1$. The outputs of latches of a row of vector setup data 96 are inputs either directly or indirectly (via glue logic) to the latches of processing logic 90 of the same field name and row number, $C_{FIX}$ equaling $C-A-N_{MAX}$ for number of bits of respective fields. $C-A-N_{MAX}$ is input directly to $C_{FIX}$. Values from $N_{MAX}$ and $N_{MSK}$ in setup 96 are put through a bit for bit 2-input logical OR ($N_{OR}$). That from the $N_{OR}$ OR gate and B,A fields is one input of a ($N_{OR}$+B+A)-bit wide 2-input Lower Address Select in logic 90 which outputs to latches, $N_{OR}$,B,A in logic 90. The other input to the Lower Address Select is the sum outputted from pick adder 90-1. The bit width of pick adder 90-1 is the same as the width of $N_{OR}$,B,A. As from the $N_{OR}$ OR gate, $N_{OR}$ has pick adder 90-1 enables for any masked upper bits not address bits of interleaved data addresses (addresses of that of one access of one I-bank) within the page size being accessed. Any lower bits are respective lower bits of $N_{MAX}$. One input to pick adder 90-1 is $N_{OR}$,B,A, and the other input is D, right justified with sign bit extended to the left as adder enables for negative D values. For a write port, D in logic 90 is the same bit-width as D in setup 96 including one bit (left most) for the sign bit. For a write data I-port, the value in D in setup 96 is the only value inputted into D in logic 90.

For a read port, the bit width of D in logic 90 is more than the bit width of D in setup 96 but less than that of pick adder 90-1 and the pick adder's other input, $N_{OR}$,B,A. For read ports, there are multiple inputs to D in logic 90. One input is from D in setup 96 right justified with its sign bit, extended left to the left end of D in logic 90. All the other inputs for D in logic 90 are itself to itself, shifted right or left. That in D is shifted left by all the shifted inputs from itself to itself but one which shifts right. One or more of each of the left shifts results in that originally from setup 96 being fully shifted to the left end of D in logic 90 with a single left most sign bit. Zeros are extended from the right by each left shift. The one shift to the right returns that fully shifted to the left fully back to the right as it was originally from setup 96. D in logic 90 is right justified within the wider input to pick adder 90-1. Within the D input to pick adder 90-1, the left-most bit of D is fanned to each pick adder input bit of the same or higher order. The sequence of shifts is fixed, those left first, as of one or more of smallest to largest in any fixed order. The right shift is last. This sequence of bit-order picks of [D] is repeated any number of times after D receives each setup. Repeated picks can occur anywhere in the sequence as part of the fixed order and all can represent a single additional input to D, a zero shift or x1 pick. Yet, zero shifts require zero additional inputs (any number of zero shifts is implemented by holding the same value in D in logic 90 any same number of address cycles). The number of inputs to implement a large multiple of [D] can be very reasonable. For example, implementation of D as of setup 96 (a realistic example where Q=31), only 5 picks (x1,x2,x4,x8,x16) are needed requiring only three inputs with a few bits having only one or two inputs. Those having only one input have upper bits always of the sign value are held constant after being receiving the D input from logic 90; the lowest bit of those having two inputs needs input from D in logic 90 and from that one right shifted. Zeros shifted-in from right require no input, only not selecting all inputs.

For each $N_{SEL}$ in logic 90, glue logic selects any upper bits from $N_{MAX}$ and any lower bits from $N_{OR}$ according to $N_{MSK}$. Each ROM 90-2 is inputted from B,A and outputs a single bit as a "1"-bit for [B,A] of data addresses held in memory bank 92 of the I-bank. The single bit output of ROM 90-2 inputs to the first latch of the Pick Timing Chain in glue logic 90 to send a single timing bit down the timing chain for selecting shifted inputs inputting into D. As ROM 90-2 of a read port sets the first latch of the pick timing chain, the first selected and least left shifted value is already in D, that zero shifted as x1 pick and requiring no action from pick timing chain or ROM output bit. Thus, the value chosen for (value)·[D] for at least the scheme here presented for selecting picks or shifts of [D] must be odd which is no problem as Q is always odd as in Q·[D as from setup 96], (value)=Q being preferred. As the timing bit travels down the pick timing chain, each successive latch except the last selects another larger or same left shift to update D for the next pick adder 90-1 sum. The last latch of the pick timing chain selects the right shifted value into D as it clears, leaving the timing chain quiet and [D]=[D as from setup 96] for at least one address cycle. A pick timing chain latch which makes no input select causes a repeat of the last D value, the case when quiet. If the multiple of [D] summed during one cycle of the pick timing chain is Q, then ROM 90-2 may output another one-bit just when D again holds its least value—that first sent from setup 96. Thus, D in setup 96 outputs into a read glue, Dx select in logic 90 selects inputs into D in logic 90, where there are no more different inputs than two more than the number of latches in the pick timing chain, and mostly likely fewer. As here presented as least required logic, there is no pick timing chain for a write data port, and D remains at the same x1 value for all picks of the lower address in $N_{OR}$,B,A.

For both read and write data ports, each wing select for setup 96 of an I-bank as for a particular port is direct input to the wing select for logic 90 of the port corresponding row. Also, each valid in logic 90 is inputted from the valid in setup 96 of the corresponding row. The new Vector inputs to no additional latch in logic 90. New vector of setup 96 is latched for a single address cycle for each new vector setup. Each wing select for Next Cell Select 98-3 is inputted from a 2-input AND as a wing gate of logic 90, inputted by the wing select for logic 90 and the NOT new vector of setup 96 of the rows corresponding to row. A 3-input AND gate, ROM Cell Gate, is formed in the glue of logic 90 and is inputted from ROM 90-2, logic 90's valid and the NOT new vector. Each valid for next cell select 98-3 is inputted from ROM Cell Gate in logic 90 of the corresponding row. The latches of each $C_{FIX}$,$N_{SEL}$,A in accessing registers 98 are inputted from that of $C_{FIX}$,$N_{SEL}$,A in logic 90 in the corresponding row, the logic 90 $N_{SEL}$ being glue logic delineated earlier.

For read data I-ports, each data 98-2 is directly inputted by fanned out read data from memory bank 92 via a path (not shown) as wide as data 98-2. The latches of data 98-2 are enabled for a single latching from the last latch of the pre-read timing chain of the read glue in accessing registers 98. The timing chain in bank for port is active for each access of memory bank 92 for pre-reading data before next send/receive data signal from bubble 76 from port to bank. Each read port's data 98-2 outputs to the Read Data Select, a data wide data select of read glue logic of accessing registers 98. The selecting input to the read data select pulses for one address cycle upon a read/write request 98-1 to output, for one address cycle to bubble 245, all the read data bits (already accessed and held in read/write data 98-2) from memory bank 92 for that port for one access of memory bank 92 generally many address-cycles before. The $2^V-1$ send/receive data signals of both read and write data ports from bubble 76 input to the like number of read/write requests 98-1 each of which immediately latches a set signal to it. The set-and-hold action of the latches for write ports will always be clear when signaled to set. Latches for read ports freely latch set or clear every address cycle. A signal from an I-port can occur every address cycle. A signal from a port to an I-bank can occur no more than once every Q address cycles. Thus and as for each I-port, the time is Q address cycles to do one pre-read or one post-store in an I-bank before another is signaled or requested to same bank.

Thus, both read and write ports send send/receive data signals to I-banks. Send/receive data signals are sent from a read port to some request 98-1 of the accessing registers 98 thereof sending next read data from held in data 98-2 for the port since last pre-read of memory bank 92. The requested read data in data 98-2 is sent to requesting port via the read data select in accessing registers 98 to bubble 245 using arrow 250 for read data direction. In like manner, send/receive data signals are sent from a write port to some request 98-1 for accessing registers 98 thereof receiving and holding write data in data 98-2. Write data is latched in data 98-2 by latching and holding both request 98-1 and data 98-2 as write data arrives through bubble 245 and arrow 240 and fans out to all data 98-2 of all I-banks of all memory. Only the one I-bank of the selected wing requested by the I-port latches and holds the write data. Thus, for write data, request 98-1 latches and holds set on setting by enabling its latch from the output of a 2-input OR, Write Request Latch Enable, glue logic of accessing registers 98. Write request latch enable has one input from the NOT output of request 98-1 and the other input from row and port respective one of $2^V-1$ outputs of an I-bank's 72 priority logic for ordering the I-bank's needed accesses to memory bank 92. Each latched and held request 98-1 for waiting until post-writing write data outputs its NOT output into all the latch enables of its respective read/write data latches 98-2, latching and holding the write data until after the read/write request is cleared with the setting of the write access latch of accessing registers 98 as controlled by the priority logic.

The access priority logic, which is part of the singular glue logic of I-bank 72, selects the one next to use memory of all those write or read of the I-bank's accessing registers needing to use the bank's memory bank 92. The access priority logic receives a one or more bit input from each of the $2^V-1$ possibly needing as all necessary bit-conditions for indicating each current need to access memory bank 72 as soon as possible. Thus, an I-bank accesses its memory bank 92 as for a port (a row of accessing registers 98 of I-bank) indicating its data for read or data space for write is not ready. An I-bank becomes data-not-ready as for a port either by sending its pre-read (early read) data to the port and thus needing to get another from memory bank 92 or by receiving write data from the port and thus needing to recover its data space by doing a post-write (delayed write) of held write data into memory bank 92. The access priority logic has outputs for $2^V-1$ output signals to as many rows of accessing registers possibly needing as for $2^V-1$ I-ports. Only the row of accessing registers 98 as for an I-port having the highest-priority is signaled to proceed with a single access of memory bank 72. Any next access need as of an I-port just gaining access is required to again enter the queue of the access priority logic. Each possible need to write of one input of access priority logic has two necessary condition bits of a single row of accessing registers 98 as prepares the I-bank wherein to service a single respective write I-port, a bit each from read/write request 98-1 and the wing select glue 98. Thus, each current write access need inputs two set condition bits into one input of the access priority logic, queuing for accessing memory as prepares next to be needed write data space or read data in each selected I-bank as for each write or read port. Each current read access need inputs three set condition bits into one input of access priority. The access priority logic has one addition two-bit input for two single-bit necessary conditions for any use of memory bank 92: a Memory Bank Not Busy From Write and a Memory Bank Not Busy From Read. The memory bank not-busy from write outputs as a logical AND of that inputted from the logical NOT of each latch of memory bank busy from write timing chain. In like manner, the memory bank not busy from read outputs as a logical AND of that inputted from the logical NOT of each latch of memory bank busy from read timing chain. The first latch of the memory bank busy from write timing chain is inputted from the write access line of bubble 97 (FIG. 13). The first latch of memory bank busy from read timing chain is inputted from read access line of bubble 97. The read line of bubble 97 from accessing registers 98 to memory bank 92 is inputted from a Read Access Collector logical OR of I-bank glue having as many inputs as read ports. The write line side of bubble 97 from accessing registers 98 to memory bank 92 is inputted from a Write Access Collector OR of I-bank glue having as many inputs as write ports. The Read access collector is inputted by the less than $2^V-1$ latches of read access of read glue of accessing registers 98, and the write access collector is inputted by the complimentary other less than $2^V-1$ latches of write access also of write glue of accessing registers 98.

The write access latches have single-bit inputs and are set to cause writes into memory bank 92 responding to respective outputs of the access priority. The Write Access Collector is one input to a 3-input get next cell select OR write glue, which is the latch enable to the $C_{FIX}, N_{SEL}, A$, wing select and valid 98-3. The other two inputs to the get next cell select are the NOT of the valid and the Shadow Write Access, both latches of accessing registers. Shadow write access is inputted from a 2-input AND glue, whose inputs are request 98-1 and the NOT of the Wing Select.

A Write Data Select glue of the I-bank 72, responsive to a write access, selects the access' respective write data in read/write data 98-2 as for respective write port to send the selected write data to memory bank 92 by the data path as wide as data not shown in FIG. 13. The Write Data Select has enough different data inputs for those read/write data 98-2 as be for all write ports with each select selected by a different write access respective to data selected. The output of the Write Data Select is an input to memory bank 92 along with the write access signal through the Write Access Collector as one of the two lines in bubble 97. The Read Access Collector outputs into the other line in bubble 97. A C-bit next cell select value selected by the write access of accessing registers 98 is sent as the cell select value through decoder 88 and $2^C$ enable to the cell of memory bank 92. The next cell select selector is glue of accessing registers 98 for both read and write data, there being $2^V-1$ inputs each C-bits wide with selection of $2^V-1$ different cell select values distributed among read and write data ports. Thus, a number of write accesses select the respective number of $C_{FIX}, N_{SEL}, A$ of accessing registers with the read access selecting the respective remainder, all $2^V-1$ $C_{FIX}, N_{SEL}, A$. Finally on the write data side, the Write Data Not Ready latch as of accessing registers has a 2 input AND inputting to the latch with one input of the AND from the respective New Vector in setup 96 and the other is the respective read/write request 98-1. Write data not ready has a latch enable inputted from its 2-input OR, whose inputs are the NOT of the Write Data Not Ready and the Write Access, both respective latches.

For read data, each access priority logic input is from the respective next cell select valid, the read access valid and the wing select of the accessing registers 98, all per read port including separate priority outputs and outcomes. The AND of the three input signals indicates a need for a particular port to get into memory. Only one port gets through Access Priority at a time, and then only every minimum period of time respective of the length of the two memory bank busy from read and from write timing chains. The read outputs of access priority are inputs to read access valids that are latches of read glue of accessing registers 98 as for each read port. The latch enable for read access valid is a 2-input OR read glue having respective inputs from the NOT of Access Valid and the read/write request 98-1, these in each I-bank as for each read port. Each Read Access Valid and respective Access Priority Logic output have that forming a one-shot each access as for the respective port with Access Valid keeping the one-shot from being fired again by the respective access priority logic output. Each respective one shot is from its 2-input AND receiving inputs from the Not of its Access Valid and its output from the access priority logic of an I-bank. The one shot sets a timing bit down the Read Access timing chain whose first latch is Read Access which inputs Read Access Collector 98 to send an access to memory bank 92. Farther down the Read Access timing chain, a timing chain latch is input to Read Data Ready also of accessing registers which latches and holds until read/write request 98-1 is pulsed. Thus, each read data ready has its 2-input OR of read glue whose inputs are the NOT of same Read Data Ready and the respective read/write request 98-1. Each Read Data Ready Signal on each respective wire AND node 77 as of accessing registers 98 receives the output of a 2-input Wire AND Driver OR of read glue whose inputs are the NOT of Wing Select and Read Data Ready, all respective and of accessing registers. Thus by wings not-selected are respective Read Data Valid signals forced to enable the respective wire ANDs. The last latch of the read access timing chain samples read data accessed from memory bank 92 via the data path from memory bank 92 to all read/write data 98-2 of an I-bank (not shown).

The data paths between latches are presented to the data input of latches to receive the data, but the receiving latches do not receive that presented until their latching is enabled. Data once received are outputted by the latch until the next enabling of its latching mechanism. Data travel between latches from one latch enabling time to the next with all latching times considered synchronous and each address cycle.

For each respective row of setup data 96 as for write port latches, each six gated-input logical OR of write glue, Write Setup Data Enable, which enables all the latches except the new vector latch, is inputted from [New Vector]OR[Not Valid 96]OR[Not Valid 90]OR[[Not Valid 98]AND[carry out of pick adder 90-1]]OR[[Write Access 98]AND[carry out of pick adder 90-1]]OR[[Shadow Write Access 98]AND[carry out of pick adder 90-1]], and thus, the latches C–A–$N_{MAX}$, $N_{MAX}$, B, A, D, $N_{MSK}$, valid, new vector, and wing select, all of rows of setup data 96 as for write ports are enabled. Each new vector 96's latch enable is always enabled. Still for each write data row of setup 90, each 3-input Write Lower Address Input Select OR of write glue 90 selects the input from setup data 96 when inputted from [New Vector 96]OR[Not Valid 90]OR[carry out of pick adder 90-1], else it selects the input from pick adder 90-1. Again for each write row thereof of setup 90, each 6-input Write Lower Address Latch Enable OR of write glue 90 is inputted from [Not ROM 90-1]OR[New Vector 96]OR[Not Valid 90]OR[Not Valid 98]OR[Write Access 98]OR[Shadow Write Access 98], and thus, the write port latches $N_{OR}$, B, A of logic 90 are enabled. For write, each row of setup 90, each four gated-input Write Processing Logic Latch Enable OR of write glue is inputted from [New Vector 96]OR[Not Valid 90]OR[[Not Valid 98]AND[carry our of pick adder 90-1]]OR[[Write Access 98]AND[carry out of pick adder 90-1]]OR[[Shadow Write Access 98]AND [carry out of pick adder 90-1]], and thus, the write port latches $C_{FIX}$, $N_{MAX}$, D, $N_{MSK}$ of logic 90 are enabled.

For each respective row of setup data 96 as for read port latches, each six gated-input logical Read Setup Data Enable OR of read glue 96, which enables all the latches except New Vector 96, is inputted from [New Vector 96]OR[Not Valid 96]OR[Not Valid 90]OR[[Not Valid 98]AND[carry out of pick adder 90]]OR[[read access 98]AND[carry out of pick adder 90-1]]OR[[Shadow Read Access 98]AND[carry out of pick adder 90-1]], and thus, the latches C–A–$N_{MAX}$, $N_{MAX}$, B, A, D, $N_{MSK}$, valid, new vector, and wing select, all of rows of setup data 96 as for read ports are enabled. Each new vector 96's latch enable is always enabled. Still for each read data row of setup 90, each 3-input Read Lower Address Input Select OR of read glue 90 selects the input from setup data 96 when inputted from [New Vector 96]OR[Not Valid 90]OR [carry out of pick adder 90-1], else selects the input from pick adder 90-1. Again for read and each row thereof of setup 90, each 6-input Read Lower Address Latch Enable OR of read glue 90 is inputted from [Not ROM 90-1]OR[New Vector 96]OR[Not Valid 90]OR[Not Valid Read Access 98] OR[Shadow Read Access 98], and thus, the read port latches $N_{OR}$, B, A of logic 90 are enabled. For each read row of setup 90, each 5-gated-input Read Processing Logic Latch Enable OR of read glue 90 is inputted from [New Vector 96]OR[Not Valid 90]OR[[Not Valid 98]AND[carry our of pick adder 90-1]]OR[[Read Access 98]AND[carry out of pick adder 90-1]]OR[[Shadow Read Access 98]AND[carry out of pick adder 90-1]], and thus, the read port latches $C_{FIX}$, $N_{MAX}$, D, $N_{MSK}$ of logic 90 are enabled.

Figure 15:
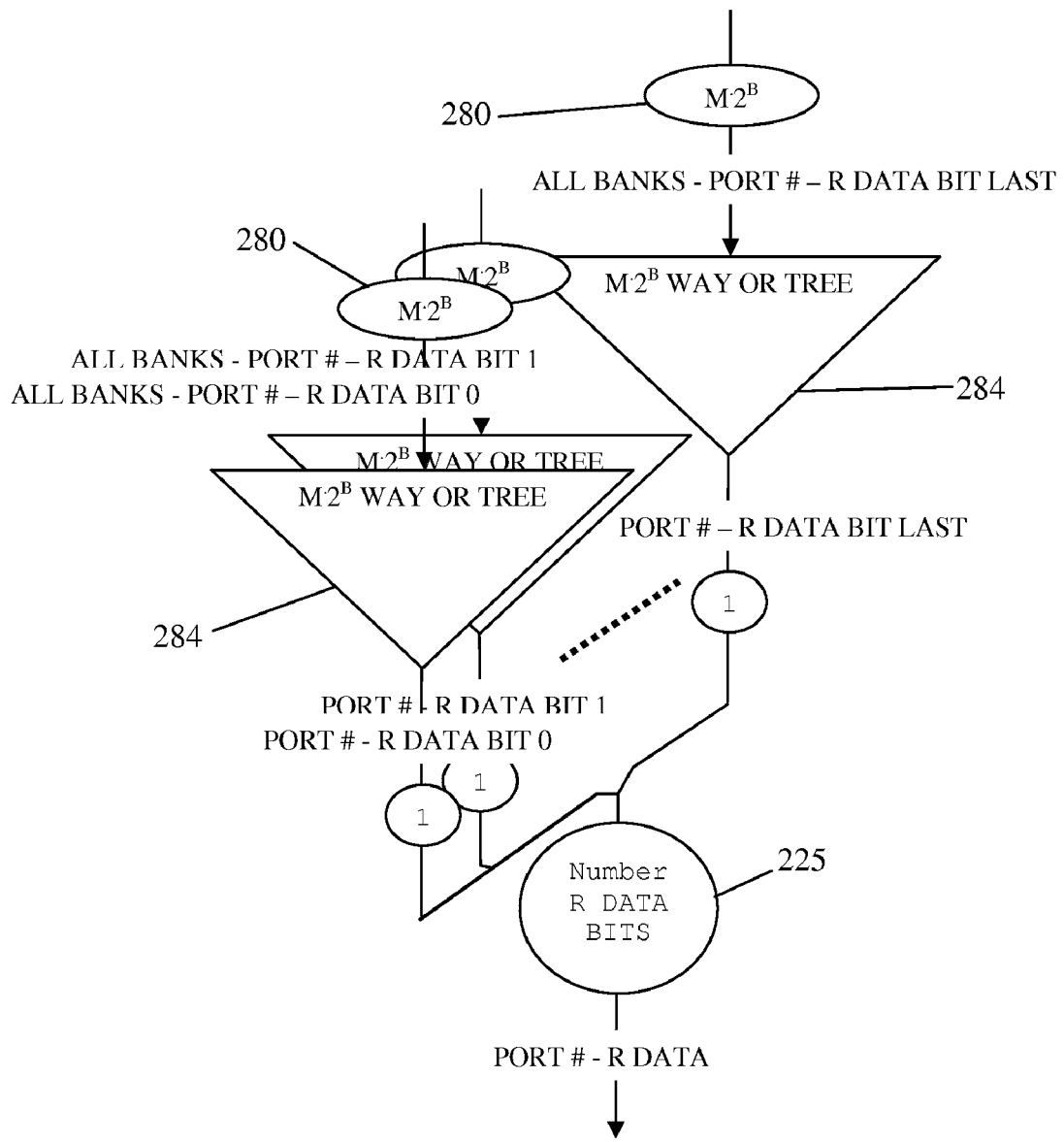

FIG. 15 is the typical path for read data from all memory, all I-banks 72, to one read data I-port 100. Thus, there are as many of that in FIG. 15 as number of read ports. The number of I-banks for all memory is $M \cdot 2^B$, and thus, $M \cdot 2^B$ is the width of the logical OR, $M \cdot 2^B$-way OR Tree 284, for each bit of read data from all memory for one read port being shown as typical by FIG. 15. The path is as already described, read/write request 98-1 of the single I-bank 72 being sent a send/receive data signal via bubbles 96, 86, and 76, FIGS. 12, 13 and 14, sets for one address cycle to select (Read Data Select 98) that in read/write data 98-2 of the I-bank 72 out through bubble 245 FIG. 13 using just $1/(2^V-1)$th of the bits of bubble 245, those of the read port in the direction of arrow 250. Thus, the number bits of bubble 245 used by one read for one read data port is the number of data bits of one read access of memory, $1/(2^V-1)$th of all bubble 245 bits. Thus it is possible for all ports, both read and write data ports, to access the same I-bank at the same time, using all the bits of bubble 245, those of read ports by arrow 250 and those of write ports by arrow 240. Because all that of FIG. 15 is of one read port or vector making up to one access of memory per address cycle, the read data of a different access can enter all trees 284 from all the bubbles 280 each address cycle, each passing through the trees at the same rate and emerging from the bottom of the tree with all bits, one bit per tree 284 of all trees of FIG. 15, of an access together entering bubble 225 FIGS. 15 and 14. That entering bubble 225 is caught into read/write data buffer 198-3 (FIG. 14) of the read port with the timing bit from the last latch of read access timing chain of port 100.

Figure 16:
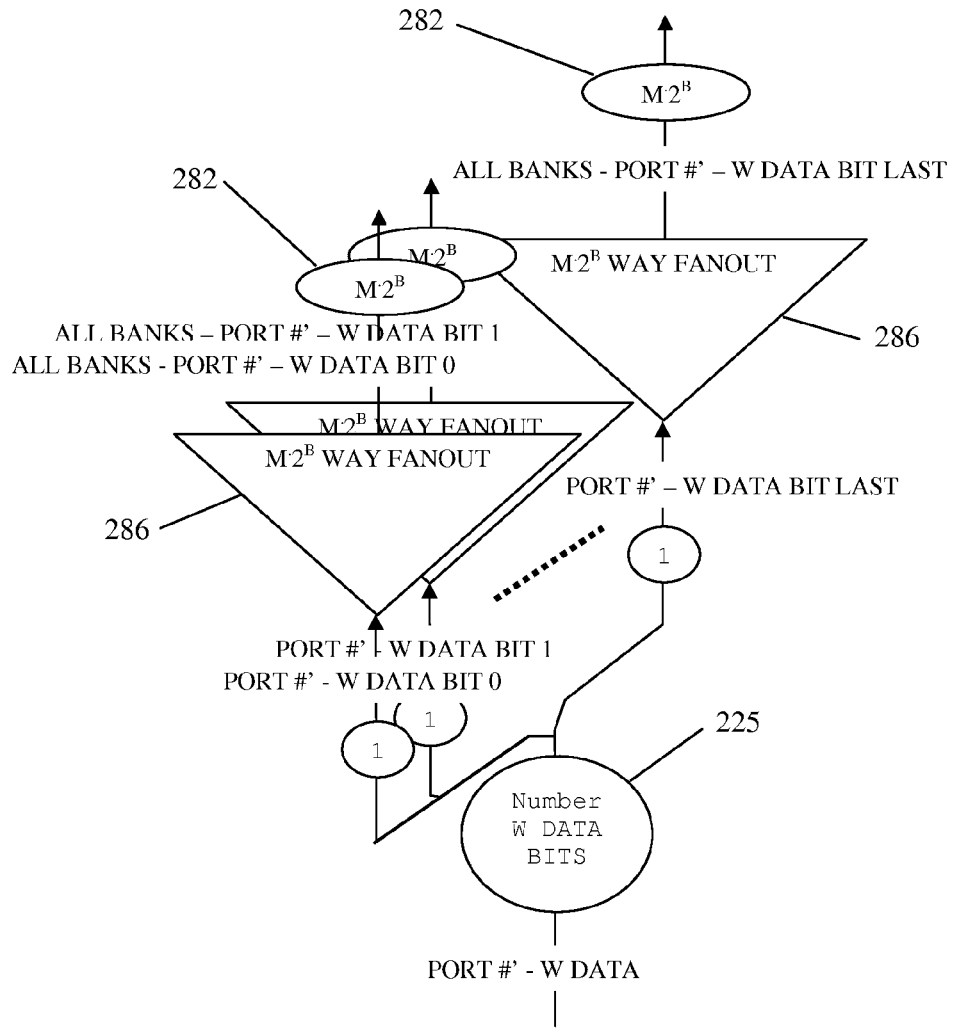

FIG. 16 is the typical path for write data to all memory, all I-banks 72, from one write data I-port 100. Thus, there are as many of that in FIG. 16 as number of write ports. The number of I-banks for all memory is $M \cdot 2^B$, and thus, $M \cdot 2^B$ bits is the width of $M \cdot 2^B$-way fanout 286, for each bit of write data to all memory for any one write port, that for one port being shown as typical by FIG. 16. The path is as already described, read/write request 98-1 (FIG. 13) of the single I-bank 72 being sent a send/receive data signal via bubbles 96, 86, and 76 FIGS. 12, 13 and 14, sets read/write request 98-1 of the port. Read/write request 98-1 latches write data just arriving in $1/(2^V-1)$ th of the bits of bubble 245 via arrow 240. Thus, the send/receive signal is latched in read/write request 98-1 and the write data is latched in read/write data 98-2 for as many address cycles needed to select that in read/write data 98-2 of the I-bank 72 out through Write Data Select 98 to memory bank 92 of the I-bank by a path not shown. Thus, the number bits of bubble 245 used by one write for one write data port is the number of data bits of one write access of memory, $1/(2^V-1)$th of all bubble 245 bits. Thus it is possible for all ports, both read and write data ports, to access the same I-bank at the same time, using all the bits of bubble 245, those of read ports by arrow 250 and those of write ports by arrow 240. Because all that of FIG. 16 is of one write port or vector making up to one access of memory per address cycle, the write data of a different access can enter all the fanouts 286 from bubble 225 each address cycle, each rising through the fanout at the same rate and emerging from the top of the fanout with all bits, one bit per fanout 286 of all fanouts of FIG. 16, of an access together entering bubbles 282 FIG. 16 and bubble 245 FIG. 13 of the selected I-bank. That entering bubble 245 is caught into read/write data 98-2 with the timing of send/receive data from bubble 76 from the writing I-port 100 via bubbles 96, 86 and 76 FIG. 12.

The use of I-banks according to the present invention permits streaming vector data at the rates of the computer processing units, stopping or flowing the data stream at full rate, as required by the processing unit. Data buffering is just enough to catch data in flight plus that to be in flight because that calling for data to be put in flight is in flight. Flight time in address cycles is from one of the send/receive signals out of bank select 198-4 passing through gates 189 (FIG. 14) causing read data from any one I-bank 72 to be latched into a buffer 198-3. The size of buffer 198-3 is enough for all in flight read data plus one, the one being that which data always passes, it shown as for both read and write ports passing both read and write data through the buffer.

Although write data producer must observe a potential wait before sending the first write data of a new write vector (waiting for all write data ready, bubble 260 (FIG. 14)), write data needs no extra buffering above the one cycle's worth passed through because any placed in the buffer will always be received by an I-bank 72 and the data eventually stored into its memory 92 at its convenience before needing to receive another at least Q address cycles later. Thus, an I-bank 72 does not access a large block of data in its memory 92, but only as much as is offset, addressed and streamed each address cycle. The offset is a signed non-zero fixed stride of any value except any multiple of a non-unitary factor of Q. Thus, the offset separates successive addresses addressing in either direction.

For an equivalent memory streaming the same amount of data per address cycle for the same number of data streams, more and smaller of the more complicated I-banks are needed, approximately as many as used before times the number of data streams. Not unlike prior streaming units, full rate streaming only occurs for data for which distribution of data is 100% efficient, using all interleaved banks. Except for those accessed first in a stream for read data, I-banks according to the present invention have ample but limited time to intelligently schedule internally initiated serial accesses of memory 92 for the next needed read data as convenient for it and its workload.

A bank's current workload is reflected by the number of currently active vectors in progress shown by the number of processing ranks in logic 90 (FIG. 13) currently valid. At most it needs to do an access of memory 92 every Q address cycles for each of all possibly currently active vectors. Up to one access every Q address cycles for each I-port needs to be done, there being up to $2^V-1$ possibly currently active vectors and ports. Thus, Q needs to be larger than the number of ports times the bank cycle time in address cycles if all are capable of full rate. Also, not only must the offset not have any non-unitary factor in common with Q, but the magnitude of the offset must not be more than G/(Q-1) so Q successive accesses of a vector will be to Q different banks.

As part of its current workload, each I-bank also has ample but limited time to intelligently delay each arriving write data in read/write data 98 before it is conveniently written to memory 92, always writing it before another arrives in read/write data 98. Read/write data 98 is a register buffer in each I-bank for each data stream or port for the data of one access, read or write. Any read/write data from/to an I-bank's data registers needing to leave/enter the bank's registers, read/write data 98, in parallel will be able to do so assuming the required I/O bits are implemented, the additional I/O bits being necessary for such parallel leaving and entering data paths (FIGS. 15 and 16) having no conflicted use causing streamed data to arrive out of order. Data in the read/write data registers 98-2 (FIG. 13), pre-fetched/post-stored from/to the I-bank's memory 92, is done serially.

Each I-bank executes each access of each page of each data stream without needing an additional sending of an address after the first of each page sent from address 10 and setup 70 for each data stream or I-port. For each such first address and setup, each I-bank calculates its own internal cell selects, adding $[N_{OR},B,A]$ to $[D]$ and back into $N_{OR},B,A$ testing each adding with ROM 90 to be a next cell select for the bank. The process stopping just before crossing the current page's boundary, stopping being caused by a carry from adder 90. Thus, I-banks necessitate an address to be associated and sent to memory and a port only once per page for each data stream or port 100, and the next successive vector setup for the next page of the same vector (read or write) may (should be for full rate data flow crossing page boundaries and must be for write data to avoid producing write data with no place in physical memory) be sent into vector setup data 96 before the page of the first or any previous setup is done being processed by logic 90 and accessed by accessing registers 98. That in setup 96 continuing a vector (not initial setup) waits to be used until the previous is done accessing its page, but any initial setup is used immediately, clearing or overriding that of any leftover previous stream in logic 90 and accessing registers 98. Thus, multiple high rate data streams, that of $2^V-1$ ports, do not stress a single serial address stream (that into address 10 and setup 70 and using associative 30 (FIG. 12)).

For an example of a special case data stream, the fetch (read) from memory of a cache line of instruction data or scalar data is historically of a positive unitary separation of the addressed data within the address-bit-aligned line of some amount of data, with data thereof needing an order of retrieval that is circular for addressing all addresses of the line starting from some initial address and proceeding to the high address of the line if not already there. Then, if necessary, the retrieval wrapped around to the low address of the line and if not already there proceeded to the address just lower than initial addresses. Typically, a line for an historical design was a relatively small fixed amount of data, a few more than one. As historically constructed, the data within data lines of the scalar data caches were only consecutive data, that being done just as is instruction data for instruction caches.

The present invention permits data streams having non-unitary fixed spacing for data within cache lines. Because all such accesses of memory can be special cases of vectors, the vector data stream according to the present invention will operate for all vector streams including that needing circular address order (cache lines), using one or two vectors as necessary. Those skilled in the art will recognize that a dedicated I-port and I-banks according to the present invention could be adapted to only access from fixed sized blocks of bit-aligned data smaller than a page, or access with smaller maximum values [D], thereby reducing logic for setup for processing addresses.

The present invention has been described as implemented in binary logic, namely logic capable of only two states. The present invention is also applicable to higher-state-numbers logic formats (ternary, quadnary, etc.) with certain modifications to the base design. More particularly, the number of banks in a paged memory operating in ternary (three-state) logic is $M \cdot 3^B$, the number of banks in a paged memory operating in quadnary (four-state) is $M \cdot 4^B$, etc, where M is the number of wings. Thus, whatever the number of logic states, H, of the apparatus, there will be $H^B$ memory banks per wing. Also, so that a page identification is simply some number of upper address digits, page sizes in paged memories are some digit-order (H raised to some integer value or power) number of elemental data (data of a single access of a single bank), and bank sizes are $H^C$ of elemental data.

In some forms of the invention, each rotation of abbreviated interleaves for a wing of a paged memory contains the same number, $H^B$, of abbreviated interleaves as the number of banks interleaved, $H^B$. $H<Q<H^B$, where Q is a number more than H having no non-unitary factor in common with H, $Q>H>1$ where $mod(H,mod(Q,H))\neq 0$, such that the value of S allows regular shunting between abbreviated interleaves of a rotation before repeating the pattern for the next $H^B$ abbreviated interleaves of the next rotation. Thus, if H is any number more than 1, as for binary, ternary, or quadnary logic, etc., then $S=if(mod(H,mod(R,H))\neq 0,R,R-Q)$ where $R=mod(H^4, Q)$. Thus, $mod(R,H)\neq 0$ as for choosing R for the value of S and for binary logic (H=2) does not mean oddness but instead indicates that R and H have no non-unitary factor in common (R and H are prime to one another). Likewise, $mod(R,H)=0$ where H=2 does not mean evenness but means (R−Q) and H have no common non-unitary factor. Thus in binary (H=2), Q has no factor equal to 2 and is odd; in ternary (H=3), Q has no factor equal to 3 and may be even (e.g., 4) or odd (e.g., 5), but may not be 6 or 15 because Q may have no factor equal to 3; in quadnary (H=4), much like in binary because 2 and 4 have the same non-unitary factor value (i.e., 2), Q is odd; if H=6 then Q may have no factor equaling 3 or 2 as for Q equaling 7, 11, 13, ..., 25, etc., noting that Q equaling 5 is not allowed by requirement, H<Q.

When H is itself some small non-unitary prime number to a multiple power (more than one) like quadnary, then effects on the interleaves of the present invention are as of H equaling the smaller non-unitary prime number. Thus, quadnary digits having $2^2$ states effect like binary digits. Thus the evaluation of Q as a number having no non-unitary factor in common with H where $1<H<Q<H^B$, is valid for any H and Q thereof where $mod(H,mod(Q,H))\neq 0$ which makes Q odd as prime to H where H=2, 4, 8, etc.

The maximum possible effective range of interleave among Q banks as measured by G is usually best where S=R=+1 or S=R−Q=−1, with a negative S=R−Q favored over a positive S=R where |S|>1, and smaller |S| much favored. Two workable values for S never exist for a pair of valid A and Q values, one A value and one Q value, where Q is prime to H as in $H^4$ addresses per abbreviated interleave, Q being prime to H meaning H and Q share no common non unitary factor.

Yet, the expression for S, $S=if(mod(H,mod(R,H))\neq 0,R,R-Q)$, always produces one workable value for S although it may not work well or be impractical to implement. Evaluation of G is informative as to how well an interleave works, larger being better and being at least equal to $H^4$ being minimally adequate. In terms of H,
$G=if(mod(H,mod(R,H))\neq 0,$
$H^4 \cdot trunc((H^B-Q-R+1)\div S)+Q+mod(H^B-Q-R+1,S),$
$H^4 \cdot trunc((Q-H^B)\div S)+1+R).$ The present invention thus provides a memory architecture and interleave scheme wherein the memory has flexible physical memory space for mapping virtual memory space to any mixture of numbers of different page sizes and data sizes. The memory scheme is usable with memories of all sizes and arrangements of wings and numbers of banks per wing available to paged memories and is useful for scalar or vector data, using serial, staggered start parallel or simultaneous start parallel access, or any combination of such data and access types. While bit and field positions are described as left to right and sub-tables and interleaves are described top to bottom, any order may be selected, consistent with hardware implementation, without departing from the scope of the invention.

Although the present invention has been described with reference to preferred embodiments, workers skilled in the art will recognize that changes may be made in form and detail without departing from the spirit and scope of the invention.

The invention claimed is:

1. In a computer memory having a plurality of memory banks each containing a plurality of addressable memory cells, the memory being arranged to store vectors such that data elements of each vector are stored in memory cells in different memory banks in an interleaved pattern, each vector having an initial address and spacing data representing a spacing between successive addresses, the improvement comprising, for each memory bank:
   setup apparatus for receiving the initial address and spacing data for each of a plurality of vectors being accessed;
   cell select apparatus responsive to the memory bank's position in the interleave pattern and to the transmission of a cell select associated with an initial or subsequent address of a data element of a respective vector to the memory bank for identifying a next cell select to access; and
   addressing logic responsive to the setup apparatus and the cell select apparatus and to a respective vector's bank select for addressing the memory bank using the cell select from the cell select apparatus.

2. The apparatus of claim 1, wherein the cell select apparatus comprises:
   a first latch for storing a cell select, the first latch being responsive to an invalid cell select in the first latch for identifying and storing a next valid cell select, and
   an enable, responsive to the memory bank's position in the interleave pattern and the presence of the next valid cell select in the first latch to enable the first latch to transmit its currently-stored cell select to the addressing logic,
   the first latch being responsive to the transmission of its currently-stored cell select to the addressing logic to invalidate its currently-stored cell select.

3. The apparatus of claim 2, wherein the addressing logic comprises:
   a second latch responsive to an address of the vector and a setup validity indication to store a cell select associated to the address, and
   a calculator, responsive to the cell select apparatus storing a cell select, to calculate the next valid cell select for a respective successive address of the respective vector based on the cell select in the first latch and the spacing.

4. The apparatus of claim 2, wherein the cell select apparatus further includes a buffer for storing data associated with a cell select in the first latch, whereby vector elements are selectively pre-read from and post-written to the memory.

5. The apparatus of claim 3, wherein the calculator comprises an adder for adding a multiple of the spacing to the cell select in the second latch.

6. The apparatus of claim 3, wherein memory is further characterized by, for each vector being accessed:
   interface apparatus for accessing a memory bank using a bank select associated to a respective one of the initial and successive addresses of each vector, and
   processing logic responsive to the setup apparatus and the interface apparatus for associating a bank select to each initial and subsequent address of each of the plurality of vectors.

7. The apparatus of claim 3, further comprising apparatus for updating the initial address and spacing for each vector for each page of memory.

8. The apparatus of claim 5, wherein the multiple is two to an integer power where the integer is $\geq 0$ based on the minimum simply interleaved number of memory banks in the plurality of memory banks, the number of memory cells in the plurality of memory cells in each memory bank, and a page size.

9. The apparatus of claim 6, wherein the processing logic comprises:
   a third latch responsive to an initial address and a setup validity indication to store a bank select associated to the initial address, and
   a second calculator, responsive to the interface apparatus storing a bank select, to calculate a valid next bank select for a respective successive address of the respective vector based on the bank select in the third latch and the spacing;
   and the interface apparatus comprises:
   a fourth latch for storing a bank select, the fourth latch being responsive to an invalid stored bank select in the fourth latch for storing a next valid bank select, and
   a second enable, responsive to the presence of the next valid bank select in the fourth latch to enable the fourth latch to transmit its currently-stored bank select to the memory.

10. The apparatus of claim 9, wherein the fourth latch invalidates its currently-stored bank select upon transmission to the memory.

11. The apparatus of claim 9, wherein the second calculator comprises an adder for adding a multiple of the spacing to the bank select in the third latch.

12. The apparatus of claim 11, wherein the multiple is two to an integer power where the integer is $\geq 0$ based on the minimum simply interleaved number of memory banks in the plurality of memory banks, the number of memory cells in the plurality of memory cells in each memory bank, and a page size.

13. The apparatus of claim 1, wherein memory is further characterized by, for each vector being accessed:
   interface apparatus for accessing a memory bank using a bank select associated to a respective one of the initial and successive addresses of each vector, and
   processing logic responsive to the setup apparatus and the interface apparatus for associating a bank select to each initial and subsequent address of each of the plurality of vectors.

14. The apparatus of claim 13, wherein the processing logic comprises:
   a first latch responsive to an initial address and a setup validity indication to store a bank select associated to the initial address, and
   a calculator, responsive to the interface apparatus storing a bank select, to calculate a valid next bank select for a respective successive address of the respective vector based on the bank select in the first latch and the spacing;
   and the interface apparatus comprises:
   a second latch for storing a bank select, the second latch being responsive to an invalid stored bank select in the fourth latch for identifying and storing the valid next bank select, and
   an enable, responsive to the presence of the next valid bank select in the second latch to enable the second latch to transmit its currently-stored bank select to the memory.

15. The apparatus of claim 14, wherein the second latch invalidates its currently-stored bank select upon transmission to the memory.

16. The apparatus of claim 14, wherein the calculator comprises an adder for adding a multiple of the spacing to the bank select in the first latch.

17. The apparatus of claim 13, further comprising a plurality of addressable wings, each containing a plurality of memory banks, each memory bank having a unique address within its wing and common bank address to a memory bank of each other wing, the interface apparatus being operable to access the memory bank in all wings identified by the memory bank enable.

18. The apparatus of claim 17, wherein each wing is separately addressable.

19. The apparatus of claim 16, wherein the second latch invalidates its bank select upon transmission to the memory.

20. The apparatus of claim 16, wherein the multiple is two to an integer power where the integer is $\geq 0$ based on the number of memory banks in the plurality of memory banks, the number of memory cells the plurality of memory cells in each memory bank, and a page size.

21. The apparatus of claim 1, further comprising apparatus for updating the initial address and spacing for each vector for each page of memory.

* * * * *

UNITED STATES PATENT AND TRADEMARK OFFICE
CERTIFICATE OF CORRECTION

| | | |
|---|---|---|
| PATENT NO. | : 8,074,010 B2 | Page 1 of 1 |
| APPLICATION NO. | : 12/831400 | |
| DATED | : December 6, 2011 | |
| INVENTOR(S) | : Maurice L. Hutson | |

It is certified that error appears in the above-identified patent and that said Letters Patent is hereby corrected as shown below:

Col. 1, line 8, for --11/719,920-- read --11/719,926--;

Col. 1, line 9, for --Aug. 17-- read --Aug. 17,--;

Col. 2, line 1, for --a efficiency-- read --an efficiency--;

Col. 4, line 13, for --embodiment-- read --embodiment,--;

Col. 8, line 7, for --10 represented-- read --10 is represented--;

Col. 9, line 35, for --odd to even (prime to two)-- read --odd (prime to two) or even--;

Col. 10, line 37, for --address $\underline{F}$as-- read --first address $\underline{F}$ as--.

Signed and Sealed this
Twenty-fourth Day of April, 2012

David J. Kappos
*Director of the United States Patent and Trademark Office*

UNITED STATES PATENT AND TRADEMARK OFFICE
CERTIFICATE OF CORRECTION

PATENT NO. : 8,074,010 B2
APPLICATION NO. : 12/831400
DATED : December 6, 2011
INVENTOR(S) : Maurice L. Hutson Page 1 of 1

It is certified that error appears in the above-identified patent and that said Letters Patent is hereby corrected as shown below:

Col. 15, line 31, for --no smaller-- read --no larger--;

Col. 23, line 7, for --field n:-- read --field n.--;

Col. 24, line 51, for --multiplier-- read --multiplier 26--;

Col. 44, line 62, for --than one-- read --than one element--.

Signed and Sealed this
Fifteenth Day of May, 2012

David J. Kappos
*Director of the United States Patent and Trademark Office*